(12) United States Patent
Yamazaki

(10) Patent No.: US 9,269,728 B2
(45) Date of Patent: Feb. 23, 2016

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/593,216

(22) Filed: Jan. 9, 2015

(65) Prior Publication Data

US 2015/0115265 A1    Apr. 30, 2015

Related U.S. Application Data

(63) Continuation of application No. 13/951,497, filed on Jul. 26, 2013, now Pat. No. 8,937,307.

(30) Foreign Application Priority Data

Aug. 10, 2012    (JP) ................................. 2012-178907
Mar. 15, 2013    (JP) ................................. 2013-053942

(51) Int. Cl.
  *H01L 29/786*   (2006.01)
  *H01L 27/12*    (2006.01)
  *H01L 27/07*    (2006.01)

(52) U.S. Cl.
  CPC ........ *H01L 27/1255* (2013.01); *H01L 27/0733* (2013.01); *H01L 27/1225* (2013.01); *H01L 29/7869* (2013.01); *H01L 29/78696* (2013.01)

(58) Field of Classification Search
  CPC .................... H01L 29/7869; H01L 29/78693
  USPC ............... 257/43, 59, 535, E27.016; 345/206
  See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Daniel Shook
(74) *Attorney, Agent, or Firm* — Nixon Peabody LLP; Jeffrey L. Costellia

(57) ABSTRACT

A semiconductor device including a capacitor with increased charge capacity and having a high aperture ratio and low power consumption is provided for a semiconductor device including a driver circuit. The semiconductor device includes a driver circuit which includes a first transistor including gate electrodes above and below a semiconductor film so as to overlap with the semiconductor film; a pixel which includes a second transistor including a semiconductor film; a capacitor which includes a dielectric film between a pair of electrodes in the pixel; and a capacitor line electrically connected to one of the pair of electrodes. In the semiconductor device, the gate electrode over the semiconductor film of the first transistor is electrically connected to the capacitor line.

15 Claims, 48 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,952,651 B2 | 5/2011 | Kimura |
| 7,978,277 B2 | 7/2011 | Kimura |
| 8,102,476 B2 | 1/2012 | Son et al. |
| 8,138,500 B2 | 3/2012 | Hosoya |
| 8,502,226 B2 | 8/2013 | Kondo et al. |
| 8,614,916 B2 | 12/2013 | Nagatsuka et al. |
| 8,619,011 B2 | 12/2013 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2011/0032435 A1 | 2/2011 | Kimura |
| 2011/0121300 A1 | 5/2011 | Miyairi et al. |
| 2012/0062811 A1 | 3/2012 | Miyake |
| 2013/0181214 A1* | 7/2013 | Yamazaki et al. ............... 257/43 |
| 2013/0193432 A1 | 8/2013 | Yamazaki |
| 2014/0061636 A1 | 3/2014 | Miyake et al. |
| 2014/0061654 A1 | 3/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-104312 A | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-096055 A | 4/2007 |
| JP | 2007-123861 A | 5/2007 |
| JP | 2012-083738 A | 4/2012 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors By Ar

(56) References Cited

OTHER PUBLICATIONS

Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp.625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID DIGEST '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu, or Zn] at temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

* cited by examiner

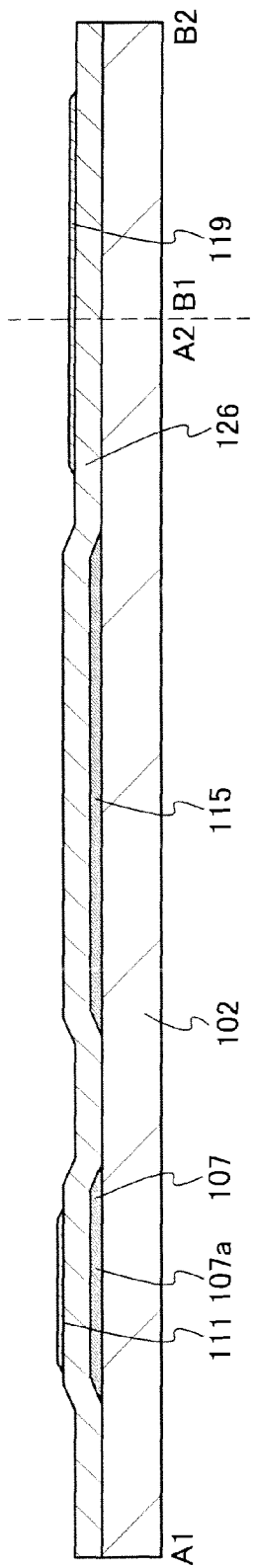
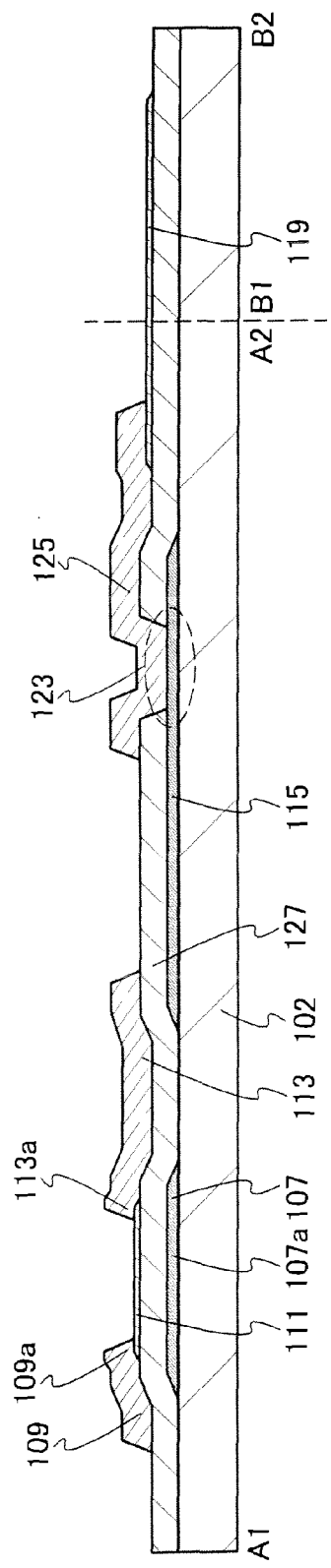
FIG. 5A
FIG. 5B

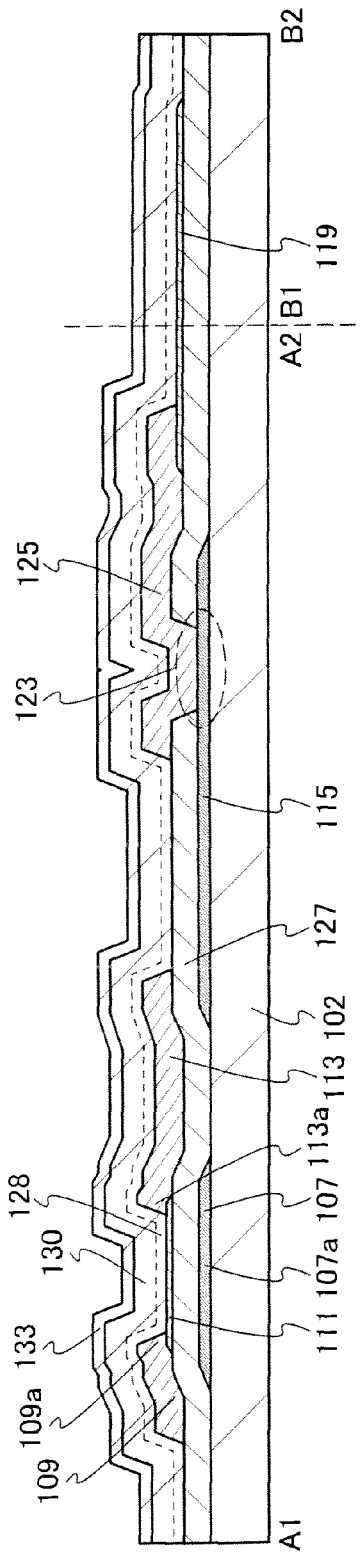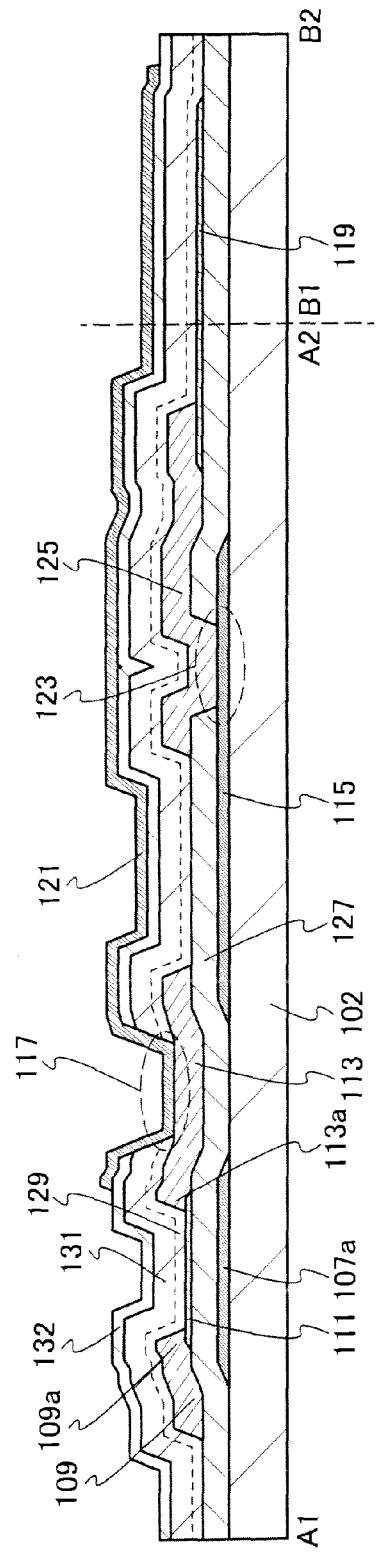

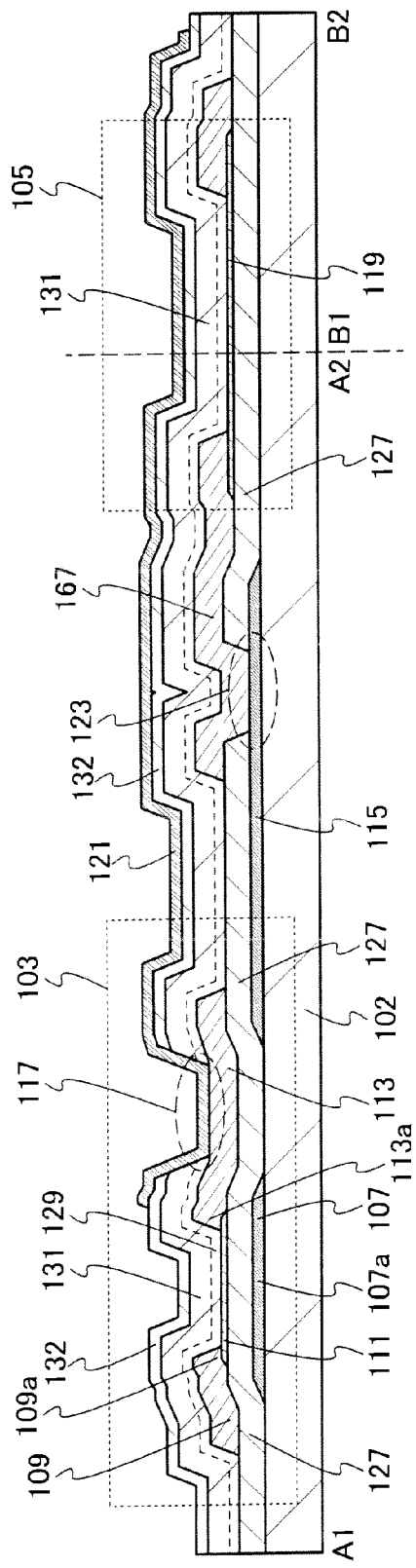
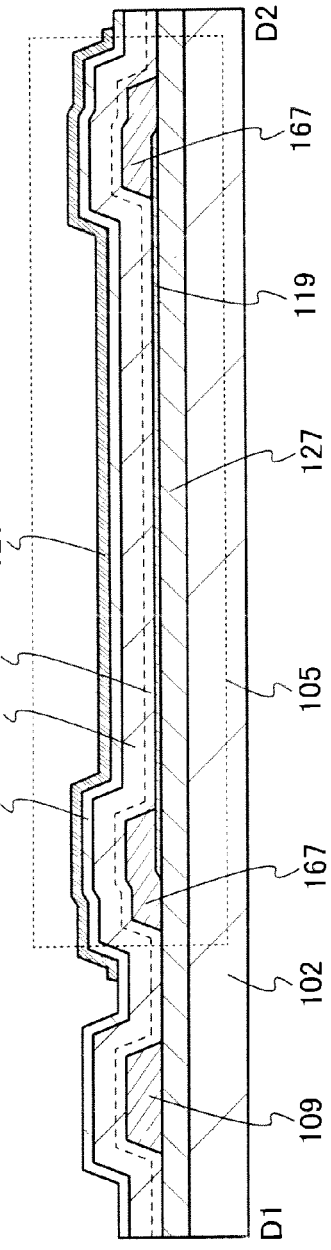
FIG. 12A
FIG. 12B

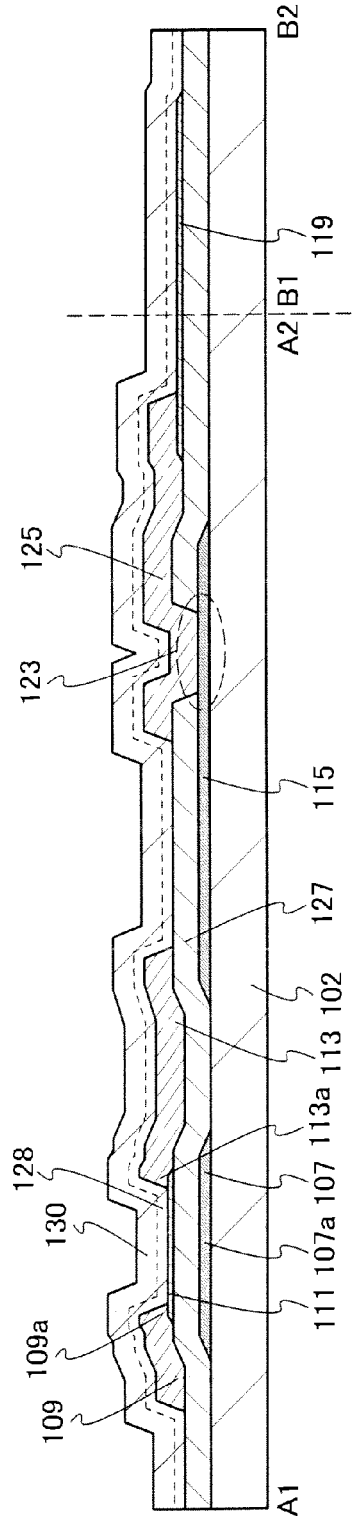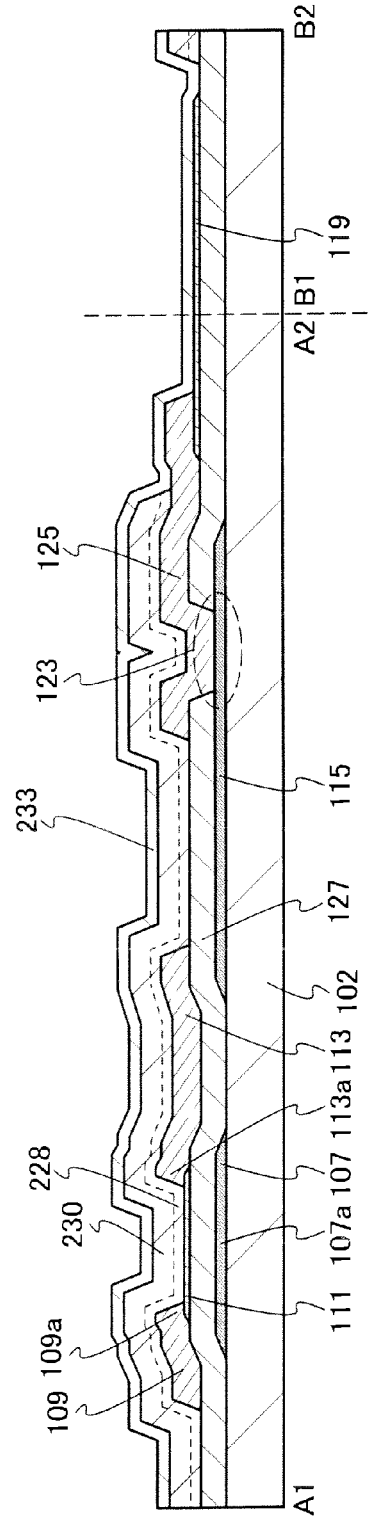

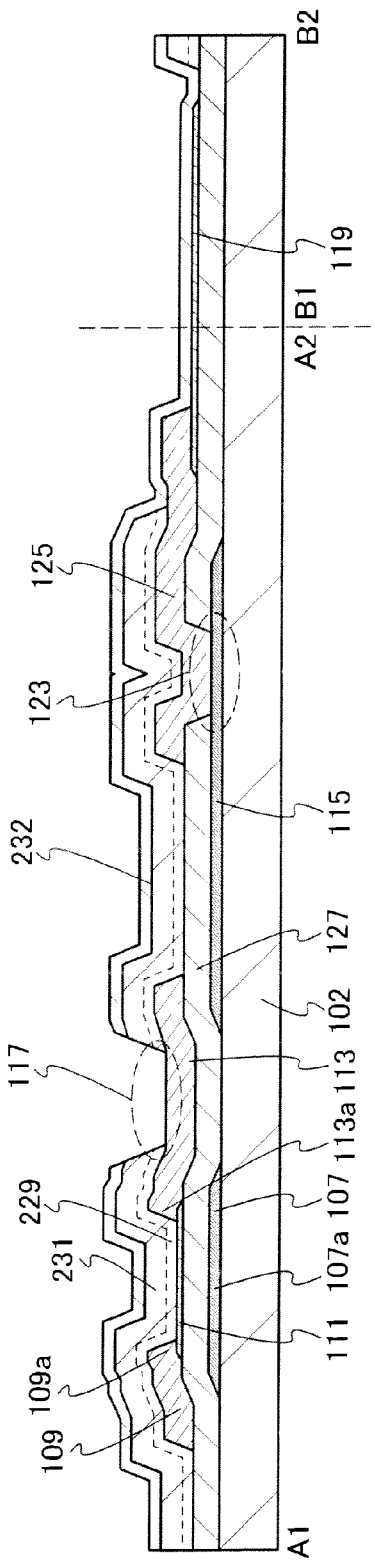
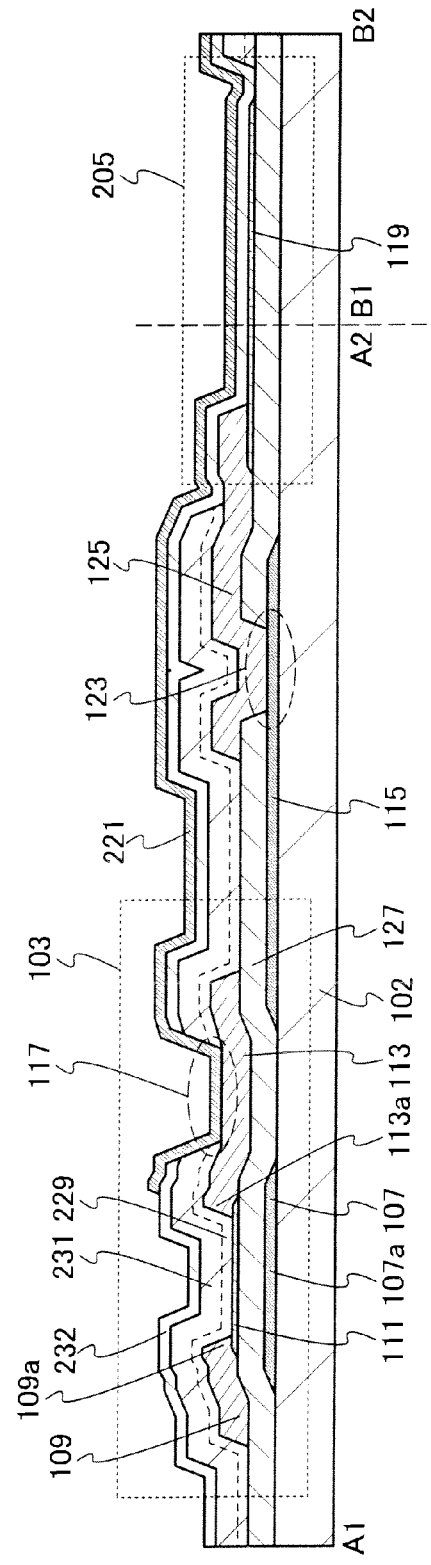
FIG. 28A
FIG. 28B

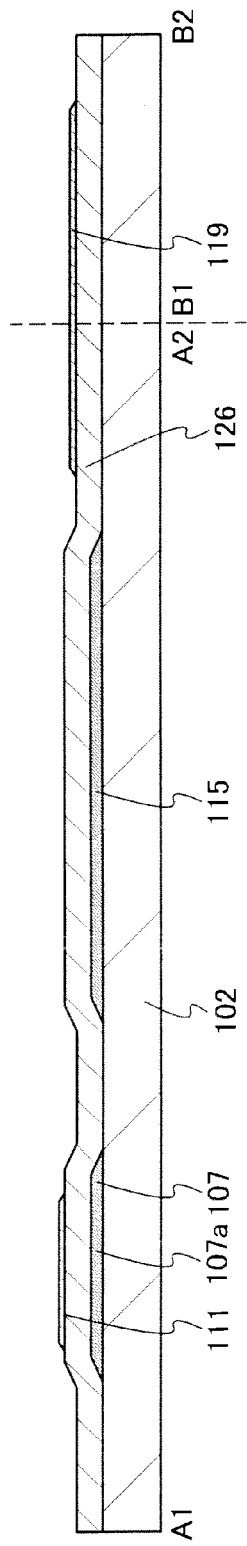
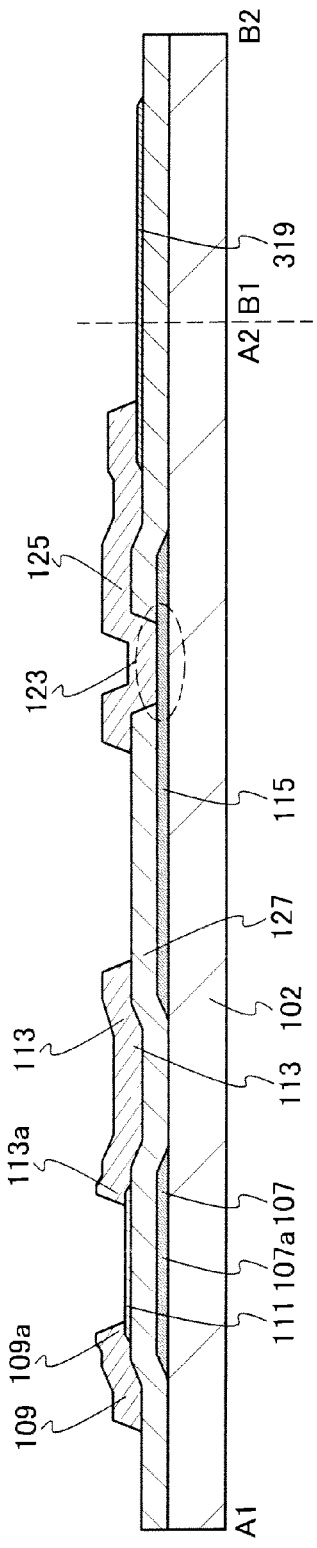
FIG. 32A
FIG. 32B

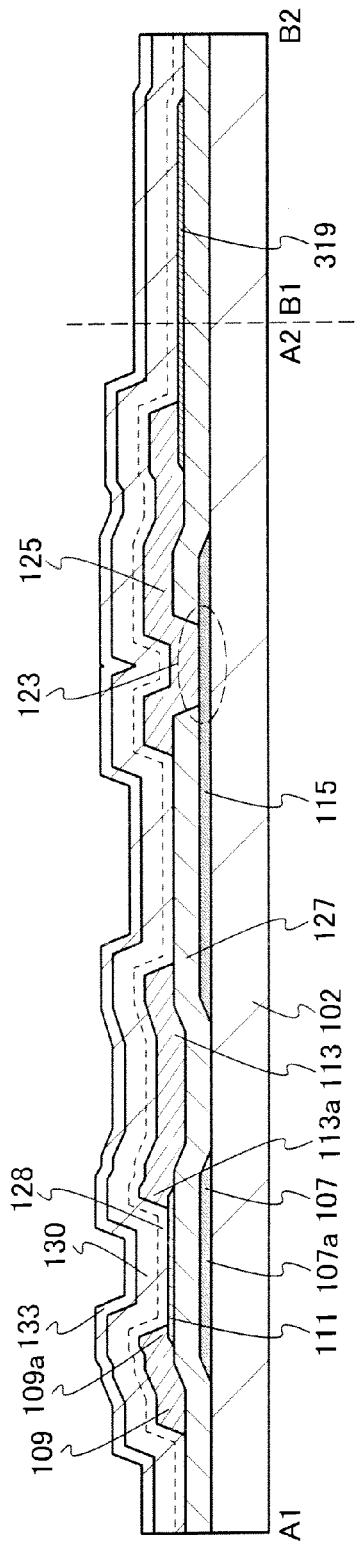
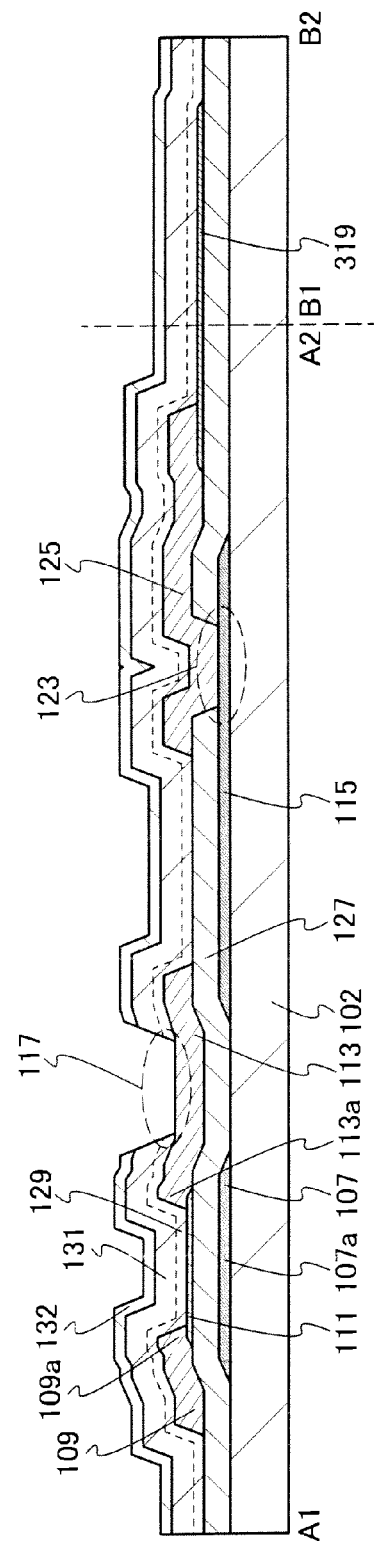
FIG. 33A
FIG. 33B

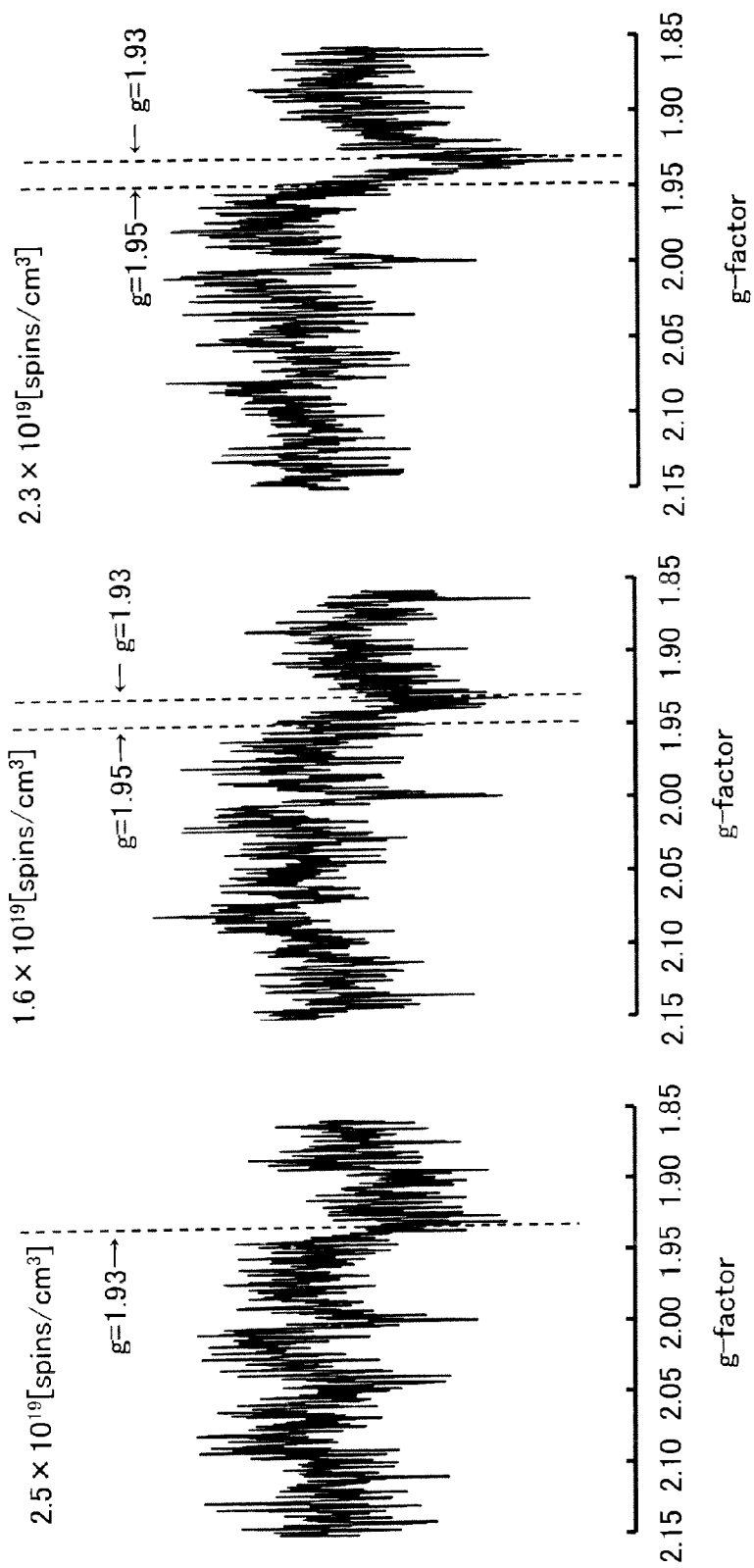

——— film formation temperature of SiN is 220°C

------- film formation temperature of SiN is 350°C

● heat treatment at 350°C after formation of oxide semiconductor film 1905
▲ heat treatment at 350°C after formation of multilayer film 1906
○ heat treatment at 450°C after formation of oxide semiconductor film 1905
△ heat treatment at 450°C after formation of multilayer film 1906

— film formation temperature of SiN is 220°C
● heat treatment at 350°C after formation of oxide semiconductor film 1905
▲ heat treatment at 350°C after formation of multilayer film 1906

SEMICONDUCTOR DEVICE

BACKGROUND OF THE INVENTION

1. Field of the Invention

The invention disclosed in this specification and the like relates to semiconductor devices.

2. Description of the Related Art

In recent years, flat panel displays such as liquid crystal displays (LCDs) have been widespread. In each of pixels provided in the row direction and the column direction in a display device such as a flat panel display, a transistor serving as a switching element, a liquid crystal element electrically connected to the transistor, and a capacitor connected to the liquid crystal element in parallel are provided.

As a semiconductor material for forming a semiconductor film of the transistor, a silicon semiconductor such as amorphous silicon or polysilicon (polycrystalline silicon) is generally used.

Metal oxides having semiconductor characteristics (hereinafter referred to as oxide semiconductors) can be used for semiconductor films in transistors. For example, techniques for forming transistors including zinc oxide or an In—Ga—Zn-based oxide semiconductor are disclosed (see Patent Documents 1 and 2).

REFERENCE

[Patent Document 1] Japanese Published Patent Application No. 2007-123861

[Patent Document 2] Japanese Published Patent Application No. 2007-096055

SUMMARY OF THE INVENTION

In a capacitor, a dielectric film is provided between a pair of electrodes at least one of which is formed, in many cases, using a light-blocking film partly serving as a gate electrode, a source electrode, a drain electrode, or the like of a transistor.

As the capacitance value of a capacitor is increased, a period in which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

One of methods for increasing the charge capacity of a capacitor is to increase the area occupied by the capacitor, specifically, to increase the area of a region where a pair of electrodes is overlapped with each other. However, when the area of a light-blocking conductive film is increased to increase the area of a region where a pair of electrodes is overlapped with each other, the aperture ratio of a pixel is lowered and thus display quality of an image is degraded.

In addition, a transistor included in a driver circuit of the display device can be formed by utilizing a process for forming a transistor provided in a pixel of the display device. The transistor included in the driver circuit is required to operate at higher speed than the transistor provided in the pixel, and the operation speed of the transistor included in the driver circuit can be improved by applying a transistor in which gate electrodes are provided above and below a semiconductor film so as to overlap with the semiconductor film (hereinafter also referred to as a dual-gate transistor) to the transistor. However, the application of the dual-gate transistor involves a structure which is configured to control the potential of the gate electrodes provided above and below the semiconductor film so as to overlap with the semiconductor film (the structure including a wiring, a terminal, a power source, and the like), resulting not only in an increase of the power consumption of the driver circuit but also in an increase of the power consumption of the display device.

Thus, it is an object of one embodiment of the present invention to provide a semiconductor device including a capacitor with increased charge capacity and having a high aperture ratio for a semiconductor device including a driver circuit. In addition, it is another object of one embodiment of the present invention to provide a semiconductor device with low power consumption, which includes a capacitor with increased charge capacity and having a high aperture ratio, for a semiconductor device including a driver circuit.

In view of the above description, according to one embodiment of the present invention, a semiconductor device includes a driver circuit which includes a first transistor including gate electrodes above and below a semiconductor film so as to overlap with the semiconductor film; a pixel which includes a second transistor including a semiconductor film; a capacitor which includes a dielectric film between a pair of electrodes in the pixel; and a capacitor line electrically connected to one of the pair of electrodes. In the semiconductor device, the gate electrode over the semiconductor film of the first transistor is electrically connected to the capacitor line.

More specifically, according to another embodiment of the present invention, a semiconductor device includes a driver circuit which includes a first transistor including gate electrodes above and below a semiconductor film so as to overlap with the semiconductor film; a pixel which includes a second transistor including a semiconductor film; a capacitor which includes a dielectric film between a pair of electrodes and a pixel electrode electrically connected to the second transistor, which are in the pixel; and a capacitor line electrically connected to one of the pair of electrodes. In the semiconductor device, the gate electrode over the semiconductor film of the first transistor is electrically connected to the capacitor line, the capacitor includes a semiconductor film on the same surface as the semiconductor film of the second transistor and the semiconductor film serves as the one of the pair of electrodes, the pixel electrode serves as the other of the pair of electrodes, and the dielectric film is an insulating film over the semiconductor film of the second transistor.

In the capacitor, the one electrode is formed using the light-transmitting semiconductor film of the second transistor, the other electrode is formed using the light-transmitting pixel electrode which is electrically connected to the second transistor, and the dielectric film is formed using the light-transmitting insulating film over the light-transmitting semiconductor film of the second transistor. That is, the capacitor transmits light and thus can be formed large (in a large area) in a region except a portion where the transistor in a pixel is formed. For this reason, the semiconductor device can have charge capacity increased while the aperture ratio is improved. Thus, the semiconductor device can have an excellent display quality.

Further, as in the first transistor, the gate electrode provided over the semiconductor film where a channel formation region is formed (hereinafter referred to as a back-gate electrode) and the capacitor line electrically connected to the one electrode of the capacitor are electrically connected to each other; thus, the potential of the back-gate electrode can be controlled by controlling the potential of the capacitor line. That is, a structure which is configured to control the potential of the back-gate electrode can be omitted and the first transistor can be operated as a dual-gate transistor; accordingly, the operation speed of the driver circuit can be increased. In other words, in the case where the first transistor is driven as the dual-gate transistor, the mobility of the first transistor can be increased. Accordingly, a semiconductor device which can achieve both an increase in operation speed and a decrease in power consumption can be obtained.

Further, the light-transmitting semiconductor film can be formed using an oxide semiconductor. This is because an oxide semiconductor has an energy gap as wide as 3.0 eV or more and high visible-light transmissivity. In the description below, the light-transmitting semiconductor film can be simply referred to as an oxide semiconductor film. Thus, the second transistor is a transistor including an oxide semiconductor film, and the one electrode of the capacitor is formed using the oxide semiconductor film.

A light-transmitting capacitor can be formed by utilizing the process for forming the second transistor. The one electrode of the capacitor can be formed by utilizing the process for forming the oxide semiconductor film of the second transistor, the dielectric film of the capacitor can be formed by utilizing the process for forming the insulating film provided over the semiconductor film of the second transistor, and the other electrode of the capacitor can be formed by utilizing the process for forming the pixel electrode electrically connected to the second transistor.

The first transistor included in the driver circuit can also be formed by utilizing the process for forming the second transistor. The back-gate electrode of the first transistor can be formed by utilizing the process for forming the pixel electrode electrically connected to the second transistor. In other words, the back-gate electrode is a conductive film which is formed using the same material as the pixel electrode.

In the above structure, when the insulating film provided over the oxide semiconductor film of the second transistor has a stacked-layer structure of an oxide insulating film and a nitride insulating film, the dielectric film can have a stacked-layer structure of the oxide insulating film and the nitride insulating film.

Moreover, when the insulating film provided over the semiconductor film of the second transistor has a stacked-layer structure of an oxide insulating film and a nitride insulating film, the dielectric film of the capacitor can have a single-layer structure of only the nitride insulating film by removing a region of the oxide insulating film, which is over the capacitor. In other words, the nitride insulating film is in contact with the oxide semiconductor film serving as the one electrode of the capacitor. A defect state (an interface state) is formed at the interface between the nitride insulating film and the oxide semiconductor film when the nitride insulating film and the oxide semiconductor film are in contact with each other. Further or alternatively, when the nitride insulating film is formed by a plasma CVD method or a sputtering method, the semiconductor film is exposed to plasma and oxygen vacancies are generated. Furthermore, nitrogen and/or hydrogen contained in the nitride insulating film are/is transferred to the semiconductor film. Due to entry of hydrogen contained in the nitride insulating film into the defect state or an oxygen vacancy, an electron serving as a carrier is generated. Accordingly, the semiconductor film becomes an n-type semiconductor film with increased conductivity; thus, a film having conductivity is obtained. Therefore, the oxide semiconductor film can sufficiently and easily serve as the one electrode of the capacitor. Moreover, charge capacity of the capacitor can be increased because it is possible to reduce the thickness of the dielectric film.

According to another embodiment of the present invention, a semiconductor device includes a driver circuit which includes a first transistor including gate electrodes above and below a semiconductor film so as to overlap with the semiconductor film; a pixel which includes a second transistor including a semiconductor film; a capacitor which includes a dielectric film between a pair of electrodes and a pixel electrode electrically connected to the second transistor, which are in the pixel; and a capacitor line electrically connected to one of the pair of electrodes. In the semiconductor device, the gate electrode over the semiconductor film of the first transistor is electrically connected to the capacitor line, an insulating film which has a stacked-layer structure of an oxide insulating film and a nitride insulating film is at least over the semiconductor film of the second transistor, the capacitor includes a semiconductor film on the same surface as the semiconductor film of the second transistor and the semiconductor film serves as the one of the pair of electrodes, the pixel electrode serves as the other of the pair of electrodes, and the dielectric film is the nitride insulating film.

In the case where the insulating film provided over the oxide semiconductor film of the second transistor has a stacked-layer structure of an oxide insulating film and a nitride insulating film, it is preferable that the oxide insulating film be unlikely to transmit nitrogen, that is, the oxide insulating film have a barrier property against nitrogen.

With such a structure, diffusion of nitrogen into the oxide semiconductor film of the second transistor can be suppressed, and change in the electrical characteristics of the second transistor can be suppressed. Note that in the case where an oxide semiconductor film is used also for the first transistor, it is preferable that the oxide insulating film be unlikely to transmit nitrogen, that is, the oxide insulating film have a barrier property against nitrogen. Accordingly, the change in the electrical characteristics of the first transistor can be suppressed.

In addition, the one electrode of the capacitor can be electrically connected to the capacitor line through a conductive film formed in the process for forming a source electrode and a drain electrode of the second transistor. Alternatively, the one electrode and the capacitor line can be electrically connected to each other by forming the oxide semiconductor film serving as the one electrode so as to be in direct contact with the capacitor line.

Note that the conductive film which connects the one electrode of the capacitor and the capacitor line to each other may be provided in contact with the end portion of the oxide semiconductor film serving as the one electrode. For example, the conductive film can be provided in contact with the oxide semiconductor film along the outer periphery thereof. With such a structure, the conductivity of the oxide semiconductor film can be increased. The oxide semiconductor film can easily serve as the one electrode of the capacitor by increasing the conductivity of the oxide semiconductor film.

In the above structure, the capacitor line may extend in a direction parallel to a scan line serving as a gate electrode of the second transistor, and the capacitor line and the scan line may be provided on the same surface. Alternatively, the capacitor line may extend in a direction parallel to a signal line serving as the source electrode or the drain electrode of the second transistor, and the capacitor line and the signal line may be provided on the same surface.

In the above structure, an organic insulating film may be provided between the pixel electrode electrically connected to the second transistor and the insulating film provided over the oxide semiconductor film of the second transistor. With such a structure, parasitic capacitance between the pixel electrode and another conductive film, for example, the conductive film for forming the source electrode or the drain electrode of the second transistor can be reduced; accordingly, the electrical characteristics of the semiconductor device can be made favorable. For example, signal delays of the semiconductor device can be reduced.

To increase the charge capacity of the capacitor in this case, it is effective to reduce the thickness of the dielectric film; therefore, it is preferable to remove a region of the organic insulating film which is over a region where the capacitor is formed. Further, to suppress diffusion of hydrogen, water, and the like contained in the organic insulating film into the oxide semiconductor film of the second transistor, it is preferable to remove a region of the organic insulating film, which overlaps with the semiconductor film of the second transistor.

In the above structure, in the case where the oxide semiconductor film which is formed in the process for forming the oxide semiconductor film of the second transistor is used as the one electrode of the capacitor, it is preferable to increase the conductivity of the oxide semiconductor film. That is, the one electrode of the capacitor is preferably the oxide semiconductor film which is formed on the same surface as the oxide semiconductor film of the second transistor and includes a region having a higher conductivity than the oxide semiconductor film of the second transistor. With such a structure, the oxide semiconductor film can sufficiently and easily serve as the one electrode of the capacitor.

In order to increase the conductivity, it is preferable to add one or more selected from boron, nitrogen, fluorine, aluminum, phosphorus, arsenic, indium, tin, antimony, and a rare gas element to the oxide semiconductor film. An ion implantation method, an ion doping method, or the like may be employed to add the element to the oxide semiconductor film. Alternatively, the oxide semiconductor film may be exposed to plasma containing the element so that the element can be added. In that case, the conductivity of the oxide semiconductor film serving as the one electrode of the capacitor is higher than or equal to 10 S/cm and lower than or equal to 1000 S/cm, preferably higher than or equal to 100 S/cm and lower than or equal to 1000 S/cm.

Note that as described above, with the structure in which the nitride insulating film included in the insulating film which is provided over the oxide semiconductor film serving as the one electrode of the capacitor is in contact with the oxide semiconductor film, a step of adding an element which increases the conductivity to the semiconductor film by an ion implantation method, an ion doping method, or the like can be skipped; therefore, the yield of the semiconductor device can be increased and the manufacturing cost thereof can be reduced.

Note that a fabrication method of a semiconductor device of one embodiment of the present invention is also one embodiment of the present invention.

According to one embodiment of the present invention, in a semiconductor device including a driver circuit, a semiconductor device including a capacitor whose charge capacity is increased while the aperture ratio is improved can be provided. Further, in the semiconductor device including the driver circuit, a semiconductor device which has a high aperture ratio and low power consumption and which includes a capacitor with large charge capacity can be provided.

BRIEF DESCRIPTION OF THE DRAWINGS

FIGS. 5A and 5B are cross-sectional views illustrating a fabrication method of a semiconductor device of one embodiment of the present invention.

FIGS. 6A and 6B are cross-sectional views illustrating a fabrication method of a semiconductor device of one embodiment of the present invention.

FIGS. 12A and 12B are cross-sectional views illustrating a semiconductor device of one embodiment of the present invention.

FIGS. 27A and 27B are cross-sectional views illustrating a fabrication method of a semiconductor device of one embodiment of the present invention.

FIGS. 28A and 28B are cross-sectional views illustrating a fabrication method of a semiconductor device of one embodiment of the present invention.

FIGS. 32A and 32B are cross-sectional views illustrating a fabrication method of a semiconductor device of one embodiment of the present invention.

FIGS. 33A and 33B are cross-sectional views illustrating a fabrication method of a semiconductor device of one embodiment of the present invention.

FIGS. 43A to 43C are graphs showing results of ESR measurement.

DETAILED DESCRIPTION OF THE INVENTION

Figure 1A:
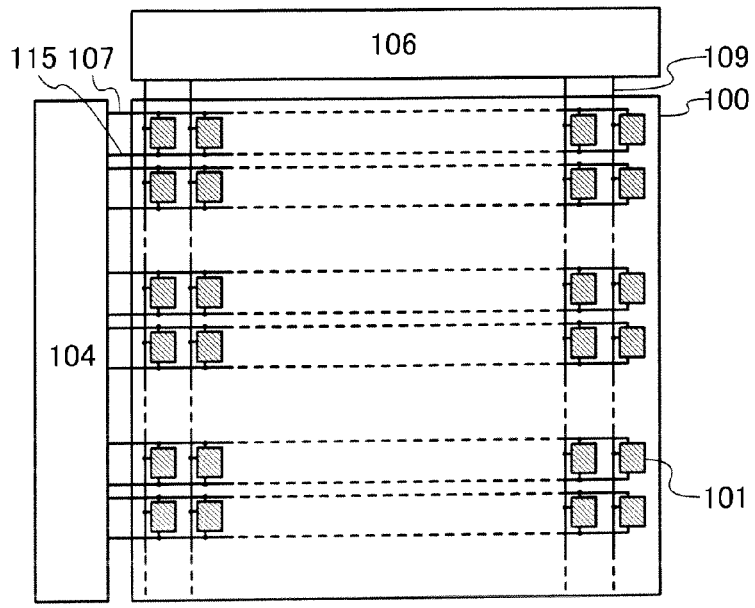
FIG. 1A is a diagram showing a semiconductor device of one embodiment of the present invention.

Embodiments and examples of the present invention will be described below in detail with reference to the accompanying drawings. However, the present invention is not limited to the following description and it is easily understood by those skilled in the art that the mode and details can be variously changed. In addition, the present invention should not be construed as being limited to the description in the following embodiments and examples.

Note that in structures of the present invention described below, the same portions or portions having similar functions are denoted by the same reference numerals in different drawings, and description thereof is not repeated. Further, the same hatching pattern is applied to portions having similar functions, and in some cases the portions are not especially denoted by reference numerals.

Note that in each drawing described in this specification, the size, the film thickness, or the region of each component is in some cases exaggerated for simplicity. Therefore, the embodiments and the examples of the present invention are not limited to such scales.

Note that the ordinal numbers such as "first" and "second" in this specification and the like are used for convenience and do not indicate the order of steps or the stacking order of layers.

In addition, the ordinal numbers in this specification and the like do not indicate particular names which specify the present invention.

Functions of a "source" and a "drain" in the present invention are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used in many cases as synonymous words. Thus, in this specification, a potential may be rephrased as a voltage and a voltage may be rephrased as a potential unless otherwise specified.

In this specification, in the case where etching treatment is performed after a photolithography process is performed, a mask formed in the photolithography process is removed after the etching treatment.

Embodiment 1

In this embodiment, a semiconductor device of one embodiment of the present invention will be described with reference to drawings. Note that in this embodiment, a liquid crystal display device is described as an example of the semiconductor device of one embodiment of the present invention.

<Structure of Semiconductor Device>

FIG. 1A shows an example of a semiconductor device. A semiconductor device illustrated in FIG. 1A incldes a pixel portion 100; a scan line driver circuit 104; a signal line driver circuit 106; m scan lines 107 which are arranged in parallel or almost in parallel to each other and whose potentials are controlled by the scan line driver circuit 104; and n signal lines 109 which are arranged in parallel or almost in parallel to each other and whose potentials are controlled by the signal line driver circuit 106. In addition, the pixel portion 100 includes a plurality of pixels 101 arranged in a matrix. Further, capacitor lines 115 which are arranged in parallel or almost in parallel to the scan lines 107 are also included. Note that the capacitor lines may be arranged in parallel or almost in parallel to the signal lines 109. Note also that m and n are individually an integer of 1 or more.

Each of the scan lines 107 is electrically connected to the n pixels 101 arranged in the corresponding row among the plurality of pixels 101 arranged in m rows and n columns in the pixel portion 100. Each signal line 109 is electrically connected to the m pixels 101 in the corresponding column among the pixels 101 arranged in m rows and n columns. Each capacitor line 115 is electrically connected to the n pixels 101 in the corresponding row among the pixels 101 arranged in m rows and n columns. Note that in the case where the capacitor lines 115 are arranged in parallel or substantially in parallel along the signal lines 109, each capacitor line 115 is electrically connected to the m pixels 101 in the corresponding column among the pixels 101 arranged in m rows and n columns.

Figure 1B:
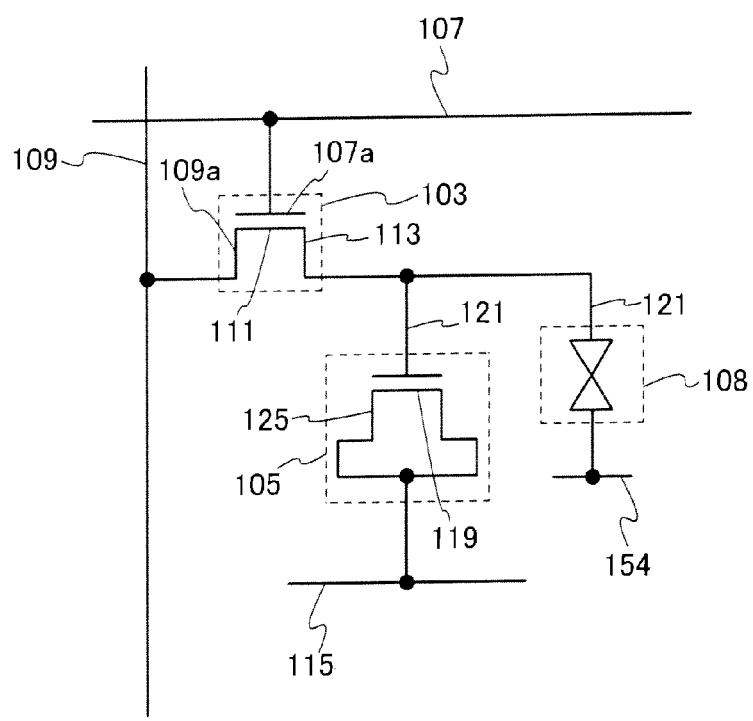
FIG. 1B is a circuit diagram of a pixel thereof.

FIG. 1B is an example of a circuit diagram of a pixel 101 included in the semiconductor device illustrated in FIG. 1A, The pixel 101 illustrated in FIG. 1B includes a transistor 103 electrically connected to the scan line 107 and the signal line 109, a capacitor 105 one electrode of which is electrically connected to a capacitor line 115 which supplies a constant potential and the other electrode of which is electrically connected to a drain electrode of the transistor 103, and a liquid crystal element 108. A pixel electrode of the liquid crystal element 108 is electrically connected to the drain electrode of the transistor 103 and the other electrode of the capacitor 105, and an electrode (counter electrode) facing the pixel electrode is electrically connected to a wiring which supplies a counter potential.

In a transistor in which a semiconductor film includes a channel formation region, the off-state current of the transistor can be significantly reduced when an oxide semiconductor film which is processed under appropriate conditions is used. For this reason, an oxide semiconductor film 111 is used as a semiconductor film included in the transistor 103.

The capacitor 105 can be formed by utilizing the process for forming the transistor 103. The one electrode of the capacitor 105 is a light-transmitting semiconductor film, specifically an oxide semiconductor film 119. That is, the capacitor 105 can be regarded as a MOS (metal oxide semiconductor) capacitor.

The liquid crystal element 108 is an element which controls transmission or non-transmission of light by an optical modulation action of liquid crystal which is sandwiched between a substrate provided with the transistor 103 and a pixel electrode 121 and a substrate provided with a counter electrode 154. The optical modulation action of liquid crystal is controlled by an electric field (including a lateral electric field, a vertical electric field, and a diagonal electric field) applied to the liquid crystal.

The scan line driver circuit 104 and the signal line driver circuit 106 are each roughly classified into a logic circuit portion, and a switch portion or a buffer portion. Although a specific structure of the scan line driver circuit 104 and the signal line driver circuit 106 is omitted here, a transistor is included in each of the scan line driver circuit 104 and the signal line driver circuit 106.

The transistor included in one or both of the scan line driver circuit 104 and the signal line driver circuit 106 can be formed utilizing the process for forming the transistor 103 included in the pixel 101. That is, one or both of the scan line driver circuit 104 and the signal line driver circuit 106 can be provided over a substrate over which the transistor 103 and the pixel electrode 121 in the pixel 101 are provided. In this manner, one or both of the scan line driver circuit 104 and the signal line driver circuit 106 are formed over the same substrate, whereby the number of components of the semiconductor device can be reduced and the manufacturing cost can be reduced.

Further, in order to increase the scanning speed of the pixel 101, it is necessary to increase the operation speed of the scan line driver circuit 104, specifically increase the operation speed of the transistor included in the scan line driver circuit 104, increase a drain current (an on-state current) that flows at the time of conduction of the transistor, and increase the field-effect mobility of the transistor. The transistor included in the scan line driver circuit 104 is a dual-gate transistor in order to achieve the above increases. Note that the dual-gate transistor, in which gate electrodes are provided above and below a semiconductor film so as to overlap with the semiconductor film, can achieve the increase in operation speed. Further, an electric field is applied from both above and below the semiconductor film; therefore, the transistor can achieve the increase in on-state current and field-effect mobility. Note that the transistor included in the signal line driver circuit 106 can also be a dual-gate transistor.

Figure 2A:
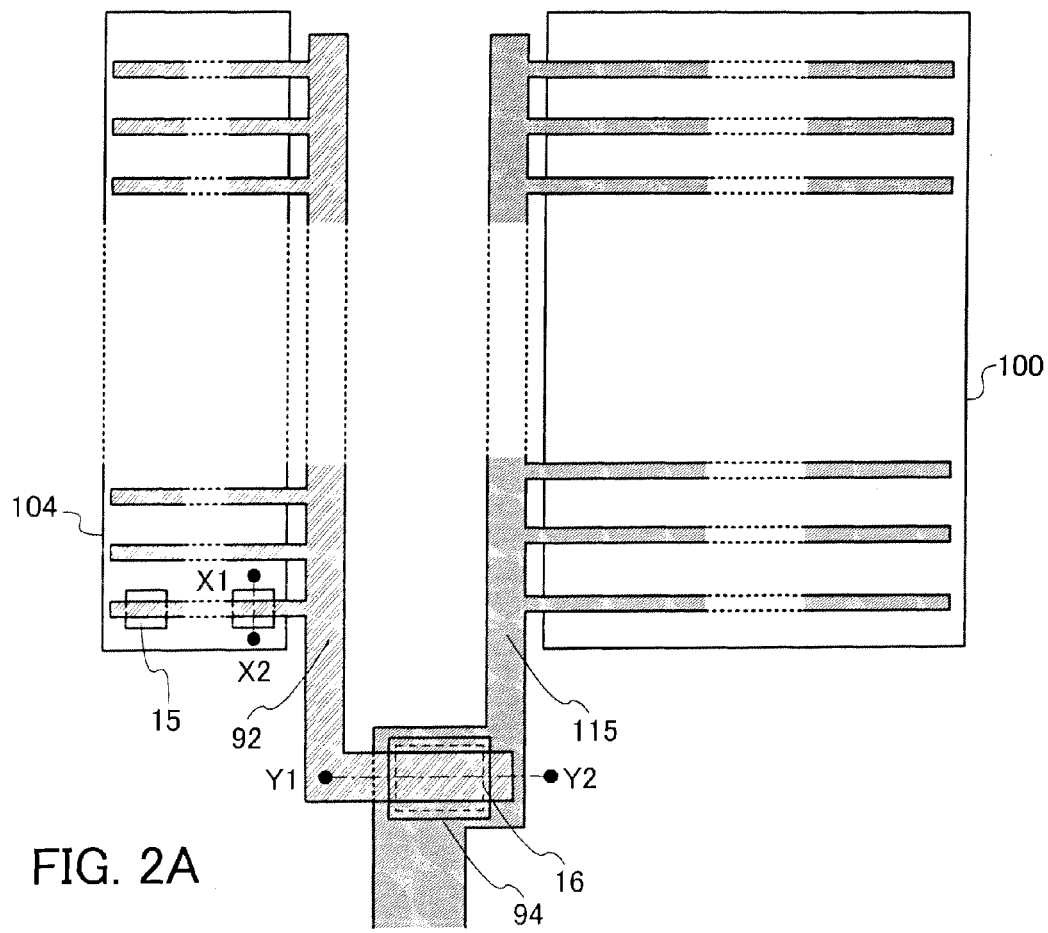
FIGS. 2A and 2B are a top view and a cross-sectional view illustrating a semiconductor device of one embodiment of the present invention.
Figure 2B:
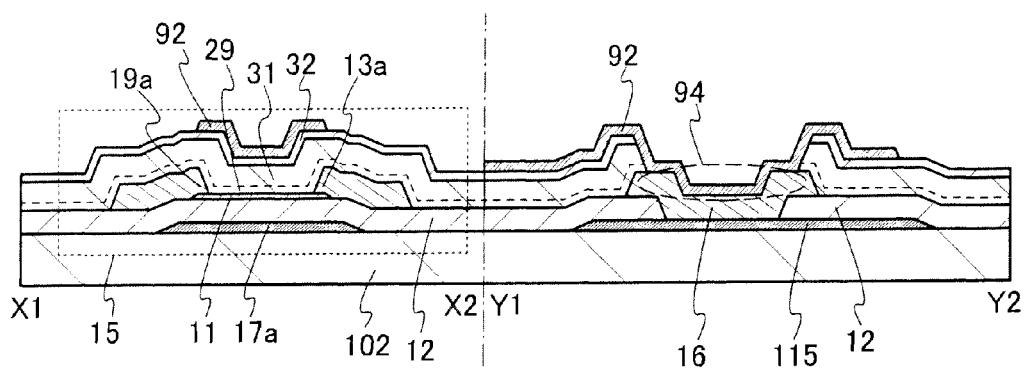

Next, in the semiconductor device of one embodiment of the present invention, a stacked-layer structure of the capacitor line provided in the pixel portion 100 and a wiring including a back-gate electrode of the dual-gate transistor included in the scan line driver circuit 104 is described. FIGS. 2A and 2B illustrate the stacked-layer structure. FIG. 2A is a top view of part of the semiconductor device, and FIG. 2B is a cross-sectional view taken along dashed-dotted line X1-X2 and dashed-dotted line Y1-Y2 in FIG. 2A.

FIG. 2A illustrates the pixel portion 100, the capacitor line 115, the scan line driver circuit 104, and a wiring 92 including a back-gate electrode of a dual-gate transistor 15 included in the scan line driver circuit 104. Note that components other than the capacitor line 115 in the pixel portion 100 (e.g., the pixel, the signal line, the transistor, the capacitor, and the liquid crystal element) are omitted as appropriate for simplicity of the drawing. Moreover, the components of the scan line driver circuit 104 are omitted as appropriate for simplicity of the drawing.

As illustrated in FIG. 2A, in the semiconductor device of one embodiment of the present invention, the capacitor line 115 and the wiring 92 are electrically connected to each other through an opening 94. That is, the capacitor line 115 and the wiring 92 have the same potential, and further the back-gate electrode of the dual-gate transistor 15 and the oxide semiconductor film 119 serving as the one electrode of the capacitor 105 which is electrically connected to the capacitor line 115 have the same potential (see FIG. 1B).

FIG. 2B illustrates the structures of the dual-gate transistor 15 and the opening 94. Note that the dual-gate transistor 15 can be formed by utilizing the process for forming the transistor 103.

As illustrated in FIG. 2B, in the cross section taken along X1-X2 of the semiconductor device of one embodiment of the present invention, a gate electrode 17a is over a substrate 102; a gate insulating film 12 is over the gate electrode 17a; an oxide semiconductor film 11 is over a region of the gate insulating film 12, which overlaps with the gate electrode 17a; a source electrode 19a and a drain electrode 13a are in contact with the oxide semiconductor film 11; an insulating film 29, an insulating film 31, and an insulating film 32 are over the gate insulating film 12, the source electrode 19a, the oxide semiconductor film 11, and the drain electrode 13a; and the wiring 92 including the back-gate electrode is over a region of the insulating film 32, which overlaps with the oxide semiconductor film 11.

Moreover, in the cross section taken along Y1-Y2 of the semiconductor device of one embodiment of the present invention, the capacitor line 115 which is on the same surface as the gate electrode 17a is over the substrate 102; a conductive film 16 and the insulating films 29, 31, and 32 are over the capacitor line 115; the opening 94 reaching the conductive film 16 is in the gate insulating film 12 and the insulating films 29, 31, and 32; and the wiring 92 is in the opening 94. Note that the capacitor line 115 and the wiring 92 are electrically connected to each other through the conductive film 16, and the conductive film 16 can be formed by utilizing the process for forming the source electrode 19a and the drain electrode 13a.

Note that as the structure in which the capacitor line 115 and the wiring 92 are electrically connected to each other, a structure in which the capacitor line 115 and the wiring 92 are in direct contact with each other without the conductive film 16 provided therebetween can be employed as well as the above structure in which electrical connection is obtained through the conductive film 16.

Note that a base insulating film may be provided between the substrate 102, and the gate electrode 17a, the capacitor line 115, and the gate insulating film 12.

Although the structure in which the capacitor line 115 and the wiring 92 including the back-gate electrode of the dual-gate transistor 15 which is included in the scan line driver circuit 104 are electrically connected to each other is described here, the semiconductor device of one embodiment of the present invention is not limited to this structure, and the capacitor line 115 can be electrically connected to a wiring including a back-gate electrode of a dual-gate transistor which is included in the signal line driver circuit 106.

Accordingly, the capacitor line 115 and the wiring 92 including the back-gate electrode of the dual-gate transistor 15 are electrically connected to each other in the semiconductor device of one embodiment of the present invention, thus the potential of the back-gate electrode can be controlled by controlling the potential of the capacitor line 115. That is, according to one embodiment of the present invention, a structure which is configured to control the potential of the back-gate electrode can be omitted, and the transistor included in the scan line driver circuit 104 can be operated as the dual-gate transistor 15; accordingly, the operation speed of the driver circuit can be increased. Accordingly, a semiconductor device which can achieve both an increase of the operation speed and a reduction of power consumption can be obtained. Further, since the structure which is configured to control the potential of the back-gate electrode can be omitted, the number of components of the semiconductor device can be reduced and the manufacturing cost of the semiconductor device of one embodiment of the present invention can be reduced.

Figure 3:
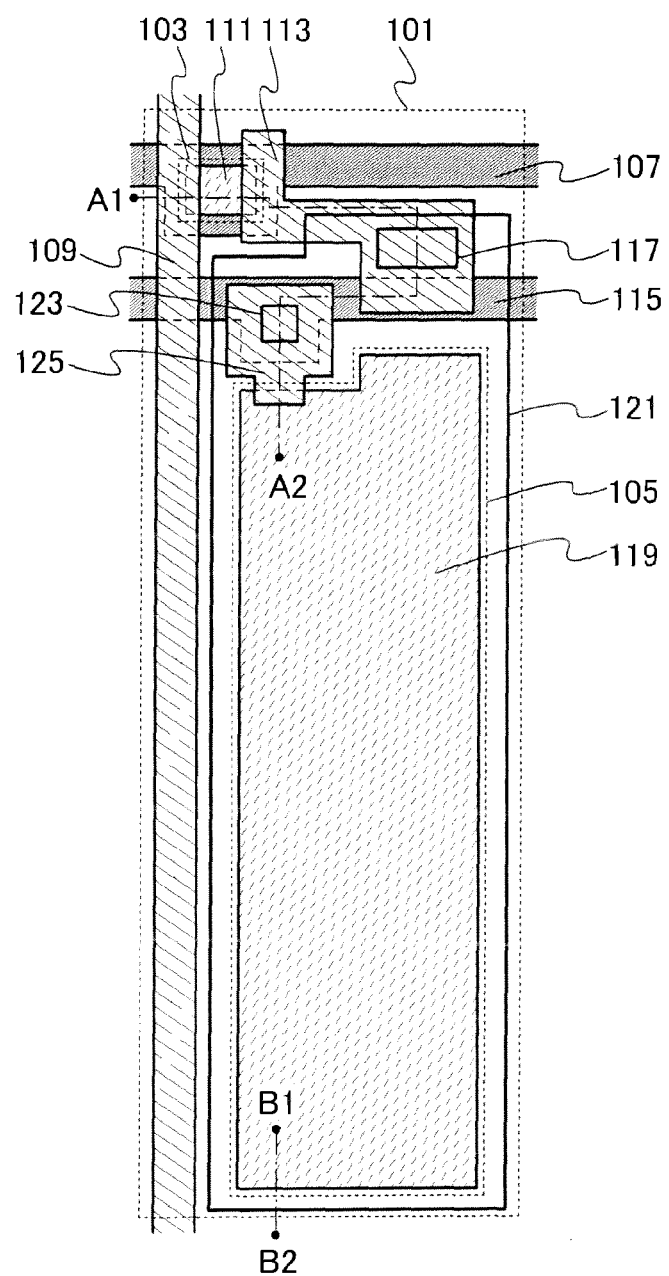
FIG. 3 is a top view illustrating a semiconductor device of one embodiment of the present invention.

Next, a specific structure example of the pixel 101 included in the semiconductor device of one embodiment of the present invention is described. FIG. 3 is a top view of the pixel 101. Note that in FIG. 3, some components of the semiconductor device (e.g., the liquid crystal element 108) are omitted for simplicity of the drawing.

In FIG. 3, the scan line 107 extends in a direction substantially perpendicular to the signal line 109 (in the horizontal direction in the drawing). The signal line 109 extends in a direction substantially perpendicular to the scan line 107 (in the vertical direction in the drawing). The capacitor line 115 extends in a direction parallel to the scan line 107. The scan line 107 and the capacitor line 115 are electrically connected to the wiring 92 including the back-gate electrode of the dual-gate transistor 15 included in the scan line driver circuit 104 (see FIG. 2A), and the signal line 109 is electrically connected to the signal line driver circuit 106 (see FIG. 1A).

The transistor 103 is provided in a region where the scan line 107 and the signal line 109 intersect with each other. The transistor 103 includes at least the oxide semiconductor film 111 including a channel formation region, a gate electrode, a gate insulating film (not illustrated in FIG. 3), a source electrode, and a drain electrode.

Since the transistor 103 includes the oxide semiconductor film 111, the off-state current of the transistor can be significantly reduced, and the power consumption of the semiconductor device can be reduced.

In addition, the scan line 107 includes a region serving as the gate electrode of the transistor 103, and the signal line 109 includes a region serving as the source electrode of the transistor 103. A conductive film 113 includes a region serving as the drain electrode of the transistor 103 and is electrically connected to the pixel electrode 121 through an opening 117. In FIG. 3, the hatch pattern of the pixel electrode 121 is not illustrated.

The region of the scan line 107, which serves as the gate electrode, is a region overlapping with at least the oxide semiconductor film 111. The region of the signal line 109, which serves as the source electrode, is a region overlapping with at least the oxide semiconductor film 111. The region of the conductive film 113, which serves as the drain electrode, is a region overlapping with at least the oxide semiconductor film 111. Note that in the description below, in some cases, the gate electrode of the transistor 103 is described as a gate electrode 107a, the source electrode of the transistor 103 is described as a source electrode 109a, and the drain electrode of the transistor 103 is described as a drain electrode 113a. Further, in some cases, the term "scan line 107" is used also to denote the gate electrode of the transistor 103, and the term "signal line 109" is used also to denote the source electrode of the transistor 103.

The capacitor 105 is provided in a region of the pixel 101, which is surrounded by the capacitor lines 115 and the signal lines 109. The capacitor 105 is electrically connected to the capacitor line 115 through a conductive film 125 provided in and over an opening 123. The capacitor 105 includes the light-transmitting oxide semiconductor film 119, the light-transmitting pixel electrode 121, and, as a dielectric film, light-transmitting insulating films (not illustrated in FIG. 3) which are included in the transistor 103. That is, the capacitor 105 transmits light.

Owing to the light-transmitting property of the capacitor 105, the capacitor 105 can be formed large (in a large area) in the pixel 101. For this reason, the semiconductor device can have charge capacity increased while the aperture ratio is improved. Thus, the semiconductor device can have an excellent display quality.

Charge capacity accumulated in the capacitor 105 is changed depending on the overlapped area of a pair of electrodes. When the size of a pixel is reduced in order to increase the resolution, the size of a capacitor is also reduced, resulting in a small accumulated charge capacity. Accordingly, a liquid crystal element might not be operated sufficiently. Since the capacitor 105 transmits light, the capacitor 105 can be formed in the entire operation area of the liquid crystal element 108, and thus the capacitor 105 can be formed large (in a large area) as much as possible in the pixel. As long as the charge capacity that can sufficiently operate the liquid crystal element 108 can be ensured, the pixel density can be increased to have a high resolution.

Thus, according to one embodiment of the present invention, the capacitor 105 can be favorably used in a high-resolution display device with a pixel density of 200 ppi or more, further 300 ppi or more. Further, according to one embodiment of the present invention, the aperture ratio can be improved even in a display device with a high resolution, which makes it possible to use efficiently light from a light source device such as a backlight, so that power consumption of the display device can be reduced.

Here, the characteristics of a transistor including an oxide semiconductor is described. Note that the transistor including an oxide semiconductor is an n-channel transistor. Oxygen vacancies in an oxide semiconductor might generate carriers, which might lower the electrical characteristics and the reliability of the transistor. For example, in some cases, the threshold voltage of the transistor is shifted in the negative direction, and drain current flows when the gate voltage is 0 V. The characteristics of a transistor in which drain current flows when the gate voltage is 0 V is referred to as a normally-on characteristics, whereas the characteristics of a transistor in which substantially no drain current flows when the gate voltage is 0 V is referred to as a normally-off characteristics.

In view of the above, it is preferable that defects, typically oxygen vacancies in an oxide semiconductor film be reduced as much as possible when the oxide semiconductor film is used. For example, the spin density of the oxide semiconductor film (the density of defects in the oxide semiconductor film) at a g-value of 1.93 in electron spin resonance in which a magnetic field is applied in parallel to the film surface is preferably reduced to be lower than or equal to the lower limit of detection of a measurement instrument. When the defects, typically the oxygen vacancies in the oxide semiconductor film are reduced as much as possible, it is possible to suppress having normally-on characteristics of the transistor, leading to improvement in the electrical characteristics and reliability of a semiconductor device.

The shift of the threshold voltage of a transistor in the negative direction is caused in some cases by hydrogen (including a hydrogen compound such as water) contained in an oxide semiconductor film as well as by oxygen vacancies. Hydrogen contained in the oxide semiconductor film is reacted with oxygen bonded to a metal atom to be water, and in addition, vacancies (also referred to as oxygen vacancies) are formed in a lattice from which oxygen is released (or a portion from which oxygen is released). In addition, part of hydrogen reacts with oxygen, which causes generation of electrons serving as carriers. Thus, a transistor including an oxide semiconductor film which contains hydrogen is likely to have normally-on characteristics.

Accordingly, it is preferable that hydrogen be reduced as much as possible in the oxide semiconductor film 111 of the transistor 103. Specifically, the hydrogen concentration of the oxide semiconductor film 111, which is measured by secondary ion mass spectrometry (SIMS), is lower than $5\times10^{18}$ atoms/cm$^3$, preferably lower than or equal to $1\times10^{18}$ atoms/cm$^3$, more preferably lower than or equal to $5\times10^{17}$ atoms/cm$^3$, further preferably lower than or equal to $1\times10^{16}$ atoms/cm$^3$.

Further, the concentration of alkali metals or alkaline earth metals in the oxide semiconductor film 111, which is measured by SIMS, is lower than or equal to $1\times10^{18}$ atoms/cm$^3$, preferably lower than or equal to $2\times10^{16}$ atoms/cm$^3$. When an alkali metal and an alkaline earth metal are bonded to an oxide semiconductor, a carrier might be generated, which might cause an increase in the off-state current of the transistor 103.

Further, when nitrogen is contained in the oxide semiconductor film, electrons serving as carriers are generated and the carrier density increases, so that the oxide semiconductor film easily becomes n-type. As a result, a transistor including the oxide semiconductor film which contains nitrogen is likely to have normally-on characteristics. For this reason, nitrogen in the oxide semiconductor film 111 is preferably reduced as much as possible; the nitrogen concentration is preferably lower than or equal to $5\times10^{18}$ atoms/cm$^3$, for example.

Further, when a Group 14 element such as silicon and carbon is contained in the oxide semiconductor film, electrons serving as carriers are generated and the carrier density increases, so that the oxide semiconductor film easily becomes n-type. Thus, in the transistor 103 including the oxide semiconductor film 111, in particular, at the interface between a gate insulating film 127 (not illustrated in FIG. 3) and the oxide semiconductor film 111, the silicon concentration which is measured by SIMS is lower than or equal to $3\times10^{18}$ atoms/cm$^3$, preferably lower than or equal to $3\times10^{17}$ atoms/cm$^3$. Note that at the interface, the carbon concentration measured by SIMS is lower than or equal to $3\times10^{18}$ atoms/cm$^3$, preferably lower than or equal to $3\times10^{17}$ atoms/cm$^3$.

As described above, when the oxide semiconductor film 111 which is highly purified by reducing impurities (such as hydrogen, nitrogen, silicon, carbon, an alkali metal, and an alkaline earth metal) as much as possible is used, it is possible to suppress having normally-on characteristics of the transistor 103, so that the off-state current of the transistor 103 can be significantly reduced. Therefore, a semiconductor device having favorable electrical characteristics can be fabricated. Further, a highly reliable semiconductor device can be fabricated.

Note that various experiments can prove low off-state current of a transistor including a highly purified oxide semiconductor film. For example, even when an element has a channel width W of $1\times10^6$ µm and a channel length L of 10 µm, the off-state current can be lower than or equal to the measurement limit of a semiconductor parameter analyzer, i.e., lower than or equal to $1\times10^{-13}$ A, at voltages (drain voltages) between a source and a drain of 1 V to 10 V. In that case, it is found that the off-state current corresponding to a value obtained by dividing the off-state current by the channel width of the transistor is lower than or equal to 100 zA/µm. Further, the off-state current was measured with the use of a circuit in which a capacitor and a transistor are connected to each other and charge that flows in or out from the capacitor is controlled by the transistor. In the measurement, a purified oxide semiconductor film has been used for a channel formation region of the transistor, and the off-state current of the transistor has been measured from change in the amount of charge of the capacitor per unit time. As a result, it is found that in the case where the voltage between the source electrode and the drain electrode of the transistor is 3 V, lower off-state current of several tens of yoctoamperes per micrometer (yA/µm) can be obtained. Accordingly, the transistor including a highly purified oxide semiconductor film has extremely low off-state current.

Figure 4:
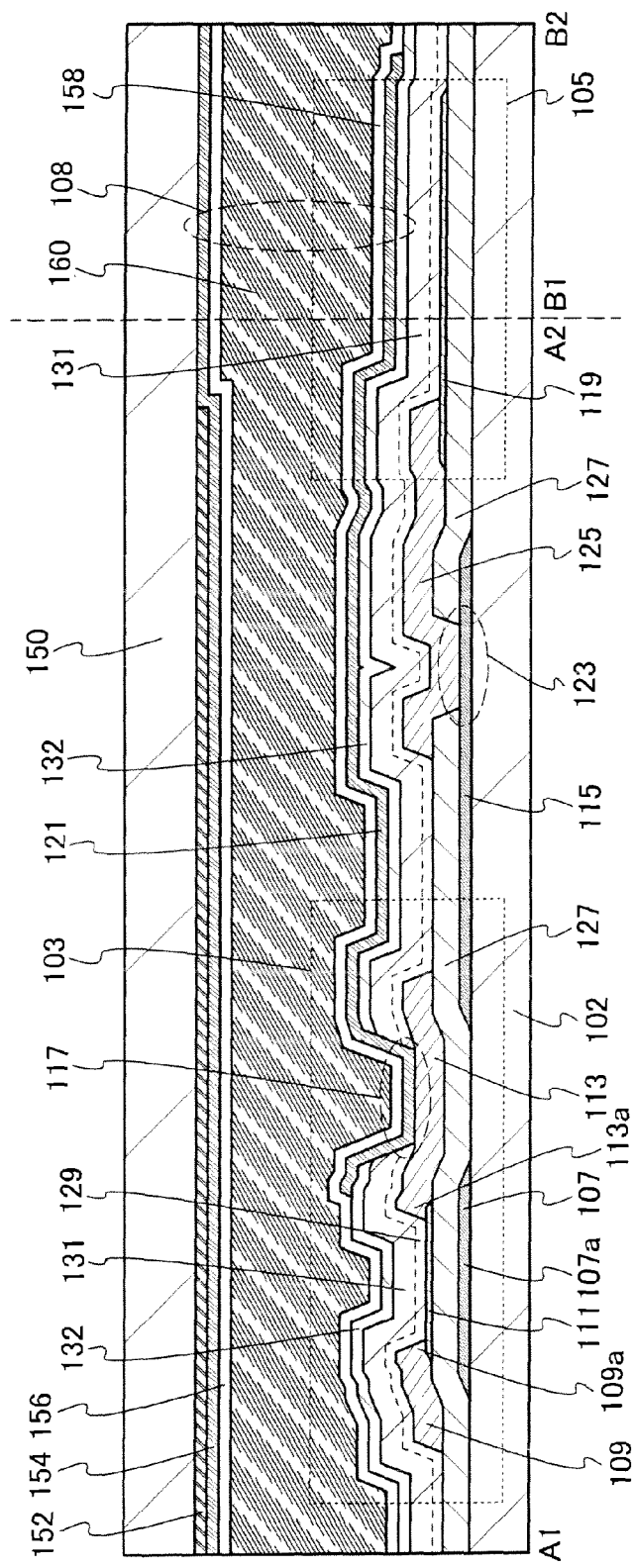
FIG. 4 is a cross-sectional view illustrating a semiconductor device of one embodiment of the present invention.

Next, FIG. 4 is a cross-sectional view taken along dashed-dotted line A1-A2 and dashed-dotted line B1-B2 in FIG. 3. Note that FIG. 4 illustrates a structure including the liquid crystal element 108.

The cross-sectional structure of the pixel 101 is as follows. Over the substrate 102, the scan line 107 including the gate electrode 107a and the capacitor line 115 which is on the same surface as the scan line 107 are provided. The gate insulating film 127 is provided over the scan line 107 and the capacitor line 115. The oxide semiconductor film 111 is provided over a region of the gate insulating film 127, which overlaps with the scan line 107, and the oxide semiconductor film 119 is provided over another region of the gate insulating film 127. The signal line 109 including the source electrode 109a and the conductive film 113 serving as the drain electrode 113a are provided over the oxide semiconductor film 111 and the gate insulating film 127. In the gate insulating film 127, the opening 123 reaching the capacitor line 115 is provided, and the conductive film 125 is provided in and over the opening 123 and in contact with the capacitor line 115 and the oxide semiconductor film 119. An insulating film 129, an insulating film 131, and an insulating film 132 which each serve as a protective insulating film of the transistor 103 are provided over the gate insulating film 127, the signal line 109, the oxide semiconductor film 111, the conductive film 113, the conductive film 125, and the oxide semiconductor film 119. The opening 117 reaching the conductive film 113 is provided in the insulating films 129, 131, and 132, and the pixel electrode 121 is provided in and over the opening 117. Note that a base insulating film may be provided between the substrate 102, and the scan line 107, the capacitor line 115, and the gate insulating film 127.

Further, the pixel 101 includes the liquid crystal element 108. The cross-sectional structure of the liquid crystal element 108 is as follows. On a surface of a substrate 150, which faces the substrate 102, a light-blocking film 152 is provided in a region overlapping with at least the transistor 103, the counter electrode 154 which is a light-transmitting conductive film is provided so as to cover the light-blocking film 152, and an alignment film 156 is provided so as to cover the light-blocking film 152 and the counter electrode 154. An alignment film 158 is provided over the pixel electrode 121 and the insulating film 132. Liquid crystal 160 is provided between the substrate 102 and the substrate 150. The liquid crystal 160 is in contact with the alignment film 156 provided on the substrate 150 side and the alignment film 158 provided on the substrate 102 side.

Note that in the case where the semiconductor device of one embodiment of the present invention is a liquid crystal display device, a light source device such as a backlight; an optical member (an optical substrate) such as a polarizing plate, which is provided on the substrate 102 side and the substrate 150 side; a sealant for fixing the substrate 102 and the substrate 150; and the like are needed. These components will be described later.

In the capacitor 105 described in this embodiment, the oxide semiconductor film 119 serves as one of a pair of electrodes, the pixel electrode 121 serves as the other of the pair of electrodes, and the insulating films 129, 131, and 132 serve as a dielectric film provided between the pair of electrodes.

Here, an operation principle of the capacitor 105 is described.

Despite having a structure which is the same as that of the oxide semiconductor film 111, the oxide semiconductor film 119 serves as one electrode of the capacitor 105. This is because the pixel electrode 121 can serve as a gate electrode, the insulating films 129, 131, and 132 can serve as gate insulating films, and the capacitor line 115 can serve as a source electrode or a drain electrode, so that the capacitor 105 can be operated in a manner similar to that of a transistor and the oxide semiconductor film 119 can be brought into conduction. That is, the capacitor 105 can be a MOS capacitor, and the oxide semiconductor film 119 can be brought into conduction so that the oxide semiconductor film 119 can serve as one electrode of the capacitor by controlling a potential applied to the capacitor line 115. In that case, the potential applied to the capacitor line 115 is set as follows. The potential of the pixel electrode 121 is shifted in the positive direction and the negative direction in order to operate the liquid crystal element 108. The potential of the capacitor line 115 needs to be constantly lower than the potential applied to the pixel electrode 121 by the threshold voltage of the capacitor 105 (MOS capacitor) or more in order that the capacitor 105 (MOS capacitor) be constantly in a conductive state. That is, since the oxide semiconductor film 119 has the same structure as the oxide semiconductor film 111, the potential of the capacitor line 115 should be lower than the potential applied to the pixel electrode 121 by the threshold voltage of the transistor 103 or more. A channel is formed in the oxide semiconductor film 119 in such a manner; therefore, a capacitor 305 (MOS capacitor) can be constantly brought into conduction.

The details of the components of the above structure will be described below.

There is no particular limitation on the property of a material and the like of the substrate 102 as long as the material has heat resistance enough to withstand at least heat treatment performed in a fabrication process of the semiconductor device. Examples of the substrate are a glass substrate, a ceramic substrate, and a plastic substrate, and as the glass substrate, an alkali-free glass substrate such as a barium borosilicate glass substrate, an aluminoborosilicate glass substrate, or an aluminosilicate glass substrate is preferably used. Alternatively, a non-light-transmitting substrate such as a stainless alloy substrate may be used, in which case a surface of the substrate is preferably provided with an insulating film. As the substrate 102, any of the following may alternatively be used: a quartz substrate, a sapphire substrate, a single crystal semiconductor substrate, a polycrystalline semiconductor substrate, a compound semiconductor substrate, and a silicon on insulator (SOI) substrate.

The scan line 107 and the capacitor line 115, through which a large amount of current flows, are preferably formed to have a single-layer structure or a stacked-layer structure using a metal film, typically any of metal materials such as molybdenum (Mo), titanium (Ti), tungsten (W), tantalum (Ta), aluminum (Al), copper (Cu), chromium (Cr), neodymium (Nd), or scandium (Sc), or an alloy material which contains any of these materials as its main component.

Examples of the scan line 107 and the capacitor line 115 are a single-layer structure using aluminum containing silicon, a two-layer structure in which titanium is stacked over aluminum, a two-layer structure in which titanium is stacked over a titanium nitride, a two-layer structure in which tungsten is stacked over a titanium nitride, a two-layer structure in which tungsten is stacked over a tantalum nitride, a two-layer structure in which copper is stacked over a copper-magnesium-aluminum alloy, and a three-layer structure in which titanium nitride, copper, and tungsten are stacked in this order.

As a material of the scan line 107 and the capacitor line 115, a light-transmitting conductive material that can be used for the pixel electrode 121 can be used. Note that in the case where the semiconductor device of one embodiment of the present invention is a reflective display device, a non-light-transmitting conductive material (e.g., a metal material) can be used for the pixel electrode 121. In that case, similarly, a non-light-transmitting substrate can be used as the substrate 102.

Further, as the material of the scan line 107 and the capacitor line 115, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (InN, SnN, or the like) film can be used. These materials each have a work function higher than or equal to 5 eV (electron volts). The use of a metal oxide containing nitrogen for the scan line 107 (the gate electrode 107*a*) allows the threshold voltage of the transistor 103 to be shifted in the positive direction, i.e. the transistor can have normally-off characteristics. For example, in the case where an In—Ga—Zn-based oxide containing nitrogen is used, an In—Ga—Zn-based oxide having at least a higher nitrogen concentration than the oxide semiconductor film 111, specifically an In—Ga—Zn-based oxide having a nitrogen concentration of 7 at. % or higher can be used.

It is preferable to use aluminum or copper which is a low-resistant material for the scan line 107 and the capacitor line 115. When aluminum or copper is used, signal delay is reduced, so that the display quality can be improved. Note that aluminum has low heat resistance; therefore, defects due to a hillock, a whisker, or migration tend to be caused. In order to prevent migration of aluminum, a stacked-layer structure including aluminum and a metal material having a higher melting point than aluminum, such as molybdenum, titanium, or tungsten, is preferably used. Also when copper is used, in order to prevent a defect due to migration and diffusion of copper elements, a stacked-layer structure including copper and a metal material having a higher melting point than copper, such as molybdenum, titanium, or tungsten, is preferably used.

Further, as illustrated in FIG. 3 and FIG. 4, it is preferable that the scan line 107 (the gate electrode 107a) be provided to have a shape such that the oxide semiconductor film 111 can be provided in the region of the scan line 107 (the gate electrode 107a). As illustrated in FIG. 3, the oxide semiconductor film 111 is preferably provided on the inner side of the scan line 107. In this manner, light which enters from a surface of the substrate 102, which is opposite to a surface on which the scan line 107 is provided, (the rear surface of the substrate 102) (in a liquid crystal display device, such light corresponds to light from a light source device such as a backlight) is shielded by the scan line 107; therefore, change or degradation of the electrical characteristics of the transistor 103 (e.g., threshold voltage) can be suppressed.

The gate insulating film 127 is provided to have a single-layer structure or a stacked-layer structure using, for example, one or more of insulating materials such as silicon oxide, silicon oxynitride, silicon nitride oxide, silicon nitride, aluminum oxide, hafnium oxide, gallium oxide, or Ga—Zn-based metal oxide. Note that in order to improve the characteristics of the interface between the gate insulating film 127 and the oxide semiconductor film 111, a region in the gate insulating film 127, which is in contact with at least the oxide semiconductor film 111, is preferably formed using an oxide insulating film.

It is possible to prevent outward diffusion of oxygen contained in the oxide semiconductor film 111 and entry of hydrogen, water, or the like into the oxide semiconductor film 111 from the outside by providing an insulating film having a barrier property against oxygen, hydrogen, water, and the like for the gate insulating film 127. As for the insulating film having a barrier property against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film can be given as examples.

The gate insulating film 127 may be formed using a high-k material such as hafnium silicate ($HfSiO_x$), hafnium silicate containing nitrogen ($HfSi_xO_yN_z$), hafnium aluminate containing nitrogen ($HfAl_xO_yN_z$), hafnium oxide, or yttrium oxide, so that gate leakage current of the transistor 103 can be reduced.

Moreover, it is preferable that the gate insulating film 127 have a stacked-layer structure including the following: a silicon nitride film with a small number of defects as a first silicon nitride film; a silicon nitride film with small amounts of released hydrogen and released ammonia as a second silicon nitride film over the first silicon nitride film; and any one of the oxide insulating films given above as examples of the gate insulating film 127 over the second silicon nitride film.

In the second silicon nitride film, in thermal desorption spectrometry, the number of released hydrogen molecules is preferably less than $5\times10^{21}$ molecules/cm$^3$, more preferably less than or equal to $3\times10^{21}$ molecules/cm$^3$, further preferably less than or equal to $1\times10^{21}$ molecules/cm$^3$, and the number of released ammonia molecules is preferably less than $1\times10^{22}$ molecules/cm$^3$, more preferably less than or equal to $5\times10^{21}$ molecules/cm$^3$, further preferably less than or equal to $1\times10^{21}$ molecules/cm$^3$. The first silicon nitride film and the second silicon nitride film are used as part of the gate insulating film 127, so that a gate insulating film with a small number of defects and small amounts of released hydrogen and released ammonia can be formed as the gate insulating film 127. Accordingly, it is possible to reduce the amount of hydrogen and nitrogen in the gate insulating film 127, which are transferred to the oxide semiconductor film 111.

In the case where the trap level (also referred to as interface level) is present at the interface between an oxide semiconductor film and a gate insulating film or in the gate insulating film in a transistor including an oxide semiconductor, change of the threshold voltage, typically change of the threshold voltage in the negative direction in the transistor and an increase in the subthreshold swing (S value) showing a gate voltage needed for changing the drain current by one digit when the transistor is turned on are caused. Thus, there is a problem in that electrical characteristics fluctuate among the transistors. For this reason, when, as the gate insulating film 127, the silicon nitride film with a small number of defects is used, and the oxide insulating film is provided in a region of the gate insulating film 127, which is in contact with the oxide semiconductor film 111, a negative shift of the threshold voltage and an increase of an S value can be suppressed.

The thickness of the gate insulating film 127 is greater than or equal to 5 nm and less than or equal to 400 nm, preferably greater than or equal to 10 nm and less than or equal to 300 nm, more preferably greater than or equal to 50 nm and less than or equal to 250 nm.

The oxide semiconductor film 111 can have an amorphous crystal structure, a single crystal structure, or a polycrystalline structure. The thickness of the oxide semiconductor film 111 is greater than or equal to 1 nm and less than or equal to 100 nm, preferably greater than or equal to 1 nm and less than or equal to 30 nm, more preferably greater than or equal to 1 nm and less than or equal to 50 nm, further preferably greater than or equal to 3 nm and less than or equal to 20 nm.

Further, an oxide semiconductor that can be used for the oxide semiconductor film 111 has an energy gap of greater than or equal to 2 eV, preferably greater than or equal to 2.5 eV, more preferably greater than or equal to 3 eV. The off-state current of the transistor 103 can be reduced by using an oxide semiconductor with a wide energy gap in this manner.

An oxide semiconductor containing at least indium (In) or zinc (Zn) is preferably used for the oxide semiconductor film 111. Alternatively, both In and Zn are preferably contained. In order to reduce fluctuations in electrical characteristics of the transistors including the oxide semiconductor, the oxide semiconductor preferably contains one or more of stabilizers in addition to In and Zn.

As for stabilizers, gallium (Ga), tin (Sn), hafnium (Hf), aluminum (Al), and zirconium (Zr) can be given as examples. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given as examples.

As the oxide semiconductor that can be used for the oxide semiconductor film 111, for example, the following can be used: indium oxide, tin oxide, or zinc oxide; an oxide containing two kinds of metals such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; an oxide containing three kinds of metals such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or an oxide containing four kinds of metals such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn— metal oxide, or an In—Hf—Al—Zn-based oxide.

Here, an In—Ga—Zn-based oxide means an oxide containing In, Ga, and Zn as its main components and there is no particular limitation on the ratio of In, Ga, and Zn. The In—Ga—Zn-based oxide may contain a metal element other than In, Ga, and Zn.

Alternatively, a material represented by $InMO_3(ZnO)_m$ (m>0 is satisfied) may be used as the oxide semiconductor. Note that M represents one or more metal elements selected from Ga, Fe, Mn, and Co, or the above element as a stabilizer.

For example, it is possible to use an In—Ga—Zn-based metal oxide containing In, Ga, and Zn at an atomic ratio of 1:1:1 (=1/3:1/3:1/3), 2:2:1 (=2/5:2/5:1/5), or 3:1:2 (=1/2:1/6:1/3). Alternatively, an In—Sn—Zn-based metal oxide containing In, Sn, and Zn at an atomic ratio of 1:1:1 (=1/3:1/3:1/3), 2:1:3 (=1/3:1/6:1/2), or 2:1:5 (=1/4:1/8:5/8) may be used. Note that a proportion of each atom in the atomic ratio of the metal elements varies within a range of ±20% as an error.

However, the atomic ratio is not limited to those described above, and a material having the appropriate atomic ratio may be used depending on needed semiconductor characteristics and electrical characteristics (e.g., field-effect mobility and threshold voltage). In order to obtain needed semiconductor characteristics, it is preferable that the carrier density, the impurity concentration, the defect density, the atomic ratio of a metal element and oxygen, the interatomic distance, the density, and the like be set to be appropriate. For example, a high field-effect mobility can be obtained relatively easily in the case where the In—Sn—Zn-based metal oxide is used. However, the field-effect mobility can be increased by reducing the defect density in the bulk also in the case where the In—Ga—Zn-based metal oxide is used.

For the oxide semiconductor film 119, an oxide semiconductor that can be used for the oxide semiconductor film 111 can be used. The oxide semiconductor film 119 can be formed concurrently with the oxide semiconductor film 111 and thus contains a metal element of an oxide semiconductor included in the oxide semiconductor film 111.

The signal line 109, the conductive film 113, and the conductive film 125 electrically connecting the oxide semiconductor film 119 and the capacitor line 115 in the capacitor 105 can be formed to have a single-layer structure or a stacked-layer structure using a material that can be used for the scan line 107 and the capacitor line 115.

The insulating films 129, 131, and 132 which each serve as the protective insulating film of the transistor 103 and which serve as the dielectric film of the capacitor 105 are insulating films each formed using a material that can be used for the gate insulating film 127. It is particularly preferable that the insulating films 129 and 131 be oxide insulating films and the insulating film 132 be a nitride insulating film. Further, the use of a nitride insulating film as the insulating film 132 can suppress entry of impurities such as hydrogen and water into the transistor 103 (in particular, the oxide semiconductor film 111) from the outside. Note that the insulating film 129 is not necessarily provided.

In addition, one or both of the insulating film 129 and the insulating film 131 are each preferably an oxide insulating film containing oxygen at a higher proportion than oxygen in the stoichiometric composition. In that case, oxygen can be prevented from being released from the oxide semiconductor film 111, and the oxygen contained in an oxygen excess region can be transferred to the oxide semiconductor film 111 to compensate oxygen vacancies. For example, when an oxide insulating film having the following feature is used, the oxygen vacancies in the oxide semiconductor film 111 can be compensated. The feature of the oxide insulating film is that the number of oxygen molecules released from the oxide insulating film is greater than or equal to $1.0 \times 10^{18}$ molecules/$cm^3$ when measured by thermal desorption spectroscopy (hereinafter referred to as TDS spectroscopy). Note that an oxide insulating film partly including a region which contains oxygen at a higher proportion than oxygen in the stoichiometric composition (oxygen excess region) may be used as one or both of the insulating film 129 and the insulating film 131. When such an oxygen excess region is present in a region overlapping with at least the oxide semiconductor film 111, oxygen is prevented from being released from the oxide semiconductor film 111 and the oxygen contained in the oxygen excess region can be transferred to the oxide semiconductor film 111 to compensate oxygen vacancies.

In the case where the insulating film 131 is an oxide insulating film containing oxygen at a higher proportion than oxygen in the stoichiometric composition, the insulating film 129 is preferably an oxide insulating film which transmits oxygen. Oxygen which enters the insulating film 129 from the outside does not completely transmit the insulating film 129 and transfer and part thereof remains in the insulating film 129. Further, there is oxygen which is contained in the insulating film 129 from the first and is transferred from the insulating film 129 to the outside. Thus, the insulating film 129 is preferably an oxide insulating film having a high coefficient of diffusion of oxygen.

Since the insulating film 129 is in contact with the oxide semiconductor film 111, the insulating film 129 is preferably an oxide insulating film through which oxygen is transmitted and which has a low interface state at the interface with the oxide semiconductor film 111. For example, the insulating film 129 is preferably an oxide insulating film having a lower defect density than the insulating film 131. Specifically, the spin density of the insulating film 129 at a g-value of 2.001 (Er-center), which is measured by electron spin resonance, is lower than or equal to $3.0 \times 10^{17}$ spins/$cm^3$, preferably lower than or equal to $5.0 \times 10^{16}$ spins/$cm^3$. Note that the spin density at a g-value of 2.001, which is measured by electron spin resonance, corresponds to the number of dangling bonds contained in the insulating film 129.

The thickness of the insulating film 129 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 131 can be greater than or equal to 30 nm and less than or equal to 500 nm, preferably greater than or equal to 150 nm and less than or equal to 400 nm.

When an oxide insulating film which transmits oxygen and which has fewer interface states between the oxide semiconductor film 111 and the oxide insulating film is used as the insulating film 129 provided over the oxide semiconductor film 111, and an oxide insulating film which includes an oxygen excess region or an oxide insulating film containing oxygen at a higher proportion than oxygen in the stoichiometric composition is used as the insulating film 131, oxygen can be easily supplied to the oxide semiconductor film 111, the release of oxygen from the oxide semiconductor film 111 can be prevented, and the oxygen contained in the insulating film 131 can be transferred to the oxide semiconductor film 111 to compensate the oxygen vacancies in the oxide semiconductor film 111. Thus, it is possible to suppress having normally-on characteristics of the transistor 103 and a potential applied to the capacitor line 115 can be controlled so that the capacitor 105 (MOS capacitor) can be constantly in a conductive state; thus, the semiconductor device can have favorable electrical characteristics and high reliability.

In the case where a nitrogen-containing oxide insulating film, such as a silicon oxynitride film or a silicon nitride oxide film, is used as one or both of the insulating film 129 and the insulating film 131, the nitrogen concentration measured by SIMS is greater than or equal to the lower limit of detection by SIMS and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$. In that case, the amount of nitrogen which is transferred to the oxide semiconductor film 111 included in the transistor 103 can be reduced and the number of defects in the nitrogen-containing oxide insulating film itself can be reduced.

In the case where a nitride insulating film is used as the insulating film 132, an insulating film having a barrier property against nitrogen is preferably used as one or both of the insulating film 129 and the insulating film 131. For example, a dense oxide insulating film can have a barrier property against nitrogen. Specifically, it is preferable to use an oxide insulating film which can be etched at a rate of less than or equal to 10 nm per minute when the temperature is 25° C. and 0.5 wt % of fluoric acid is used.

As the insulating film 132, a nitride insulating film with a low hydrogen content can be provided. The nitride insulating film is as follows, for example: the number of hydrogen molecules released from the nitride insulating film is less than $5.0 \times 10^{21}$ molecules/cm$^3$, preferably less than $3.0 \times 10^{21}$ molecules/cm$^3$, more preferably less than $1.0 \times 10^{21}$ molecules/cm$^3$ when measured by TDS spectroscopy.

The insulating film 132 has a thickness with which entry of impurities such as hydrogen and water from the outside can be suppressed. For example, the thickness can be greater than or equal to 50 nm and less than or equal to 200 nm, preferably greater than or equal to 50 nm and less than or equal to 150 nm, and more preferably greater than or equal to 50 nm and less than or equal to 100 nm.

The use of a nitride insulating film as the insulating film 132 provided over the insulating film 131 can suppress entry of impurities such as hydrogen and water into the oxide semiconductor film 111 and the oxide semiconductor film 119 from the outside. Moreover, the use of a nitride insulating film with a low hydrogen content as the insulating film 132 can suppress change in the electrical characteristics of the transistor 103 and the capacitor 105 (MOS capacitor).

The pixel electrode 121 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

For the substrate 150, a material that can be used for the substrate 102 can be used.

The light-blocking film 152 is also referred to as a black matrix and is provided in a liquid crystal display device to suppress leakage of light of a light source device such as a backlight or suppress contrast reduction due to mixing of colors when color display is performed using a color filter, for example. A light-blocking film which is generally used can be used as the light-blocking film 152. A metal and an organic resin including a pigment can be given as examples of a light-blocking material. Alternatively, the light-blocking film 152 may be provided in a region outside the pixel portion 100, such as over the scan line driver circuit 104 and over the signal line driver circuit 106 (see FIG. 1A), as well as over the transistor 103 in the pixel 101.

Note that a coloring film which transmits light with a predetermined wavelength may be provided across a space between the light-blocking films 152 adjacent to each other. Further, an overcoat film may be provided between the counter electrode 154, and the light-blocking films 152 and the coloring film.

For the counter electrode 154, materials that can be used for the pixel electrode 121 can be used as appropriate.

The alignment films 156 and 158 can be formed using a general-purpose material such as polyamide.

For the liquid crystal 160, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used for the liquid crystal 160. A blue phase is one of liquid crystal phases, which is generated just before a cholesteric phase changes into an isotropic phase while temperature of cholesteric liquid crystal is raised. Since the blue phase appears only in a narrow temperature range, a liquid crystal composition in which a chiral material is mixed is used in order to improve the temperature range. Note that the alignment film is formed using an organic resin containing hydrogen, water, or the like, which might degrade the electrical characteristics of the transistor in the semiconductor device of one embodiment of the present invention. In view of the above, the use of liquid crystal which exhibits a blue phase for the liquid crystal 160 enables fabrication of the semiconductor device of one embodiment of the present invention without an organic resin, so that the semiconductor device can be highly reliable.

Note that the structure of the liquid crystal element 108 can be changed as appropriate, as follows, in accordance with the display mode of the liquid crystal element 108: the shapes of the pixel electrode 121 and the counter electrode 154 are changed, or a protrusion referred to as a rib is formed.

Further, in the semiconductor device of one embodiment of the present invention, a region of the pixel 101, in which the light-blocking film 152 is provided, can be reduced or removed in such a manner that a polarization axis of a polarizing member (a polarizing substrate) is provided to be in parallel to the light-blocking film 152, and the display mode of the semiconductor device is set to a normally-black mode in which the liquid crystal element 108 does not transmit light from a light source device such as a backlight with no voltage applied. As a result, the aperture ratio of the pixel 101 can be improved even in the case where the size of one pixel is small as in a display device having a high resolution, where the pixel density is greater than or equal to 200 ppi, further greater than or equal to 300 ppi. Note that the aperture ratio can be further increased by using a light-transmitting capacitor.

<Fabrication Method of Semiconductor Device>

A fabrication method of the above semiconductor device is described with reference to FIGS. 5A and 5B and FIGS. 6A and 6B.

Here, the process for forming the dual-gate transistor 15 is also described on the assumption that the dual-gate transistor 15 included in the scan line driver circuit 104 of the semiconductor device is formed over a substrate over which the pixel portion 100 is provided. The gate electrode 17*a* of the dual-gate transistor 15 is formed using the same material as the gate electrode 107*a* of the transistor 103. The gate insulating film 12 of the dual-gate transistor 15 is formed using the same material as the gate insulating film 127 of the transistor 103. The oxide semiconductor film 11 of the dual-gate transistor 15 is formed using the same material as the oxide semiconductor film 111 of the transistor 103. The source electrode 19*a* and the drain electrode 13*a* of the dual-gate transistor 15 are formed using the same material as the source electrode 109*a* and the drain electrode 113*a* of the transistor 103. The insulating film 29, the insulating film 31, and the insulating film 32 of the dual-gate transistor 15 are formed using the same materials as the insulating film 129, the insulating film 131, and the insulating film 132 of the transistor 103, respectively.

First, the scan line 107 including the gate electrode 107*a* and the capacitor line 115 are formed over the substrate 102. An insulating film 126 which will be processed into the gate insulating film 127 later is formed so as to cover the scan line 107 and the capacitor line 115. The oxide semiconductor film 111 is formed over a region of the insulating film 126, which overlaps with the scan line 107. The oxide semiconductor film 119 is formed over the insulating film 126 so as to overlap with a region where the pixel electrode 121 will be formed later (see FIG. 5A).

Note that by performing the above steps, the gate electrode 17*a*, the gate insulating film 12, and the oxide semiconductor film 11 of the dual-gate transistor 15 can be formed (see FIG. 5B).

The scan line 107 and the capacitor line 115 can be formed in such a manner that a conductive film is formed using any of the materials given above, a mask is formed over the conductive film, and the conductive film is processed using the mask. For the conductive film, any of a variety of film formation methods such as an evaporation method, a CVD method, a sputtering method, and a spin coating method can be used. Note that there is no particular limitation on the thickness of the conductive film, and the thickness of the conductive film can be determined in consideration of time needed for the formation, desired resistivity, or the like. As the mask, a resist mask formed through a photolithography process can be used. The conductive film can be processed by one or both of dry etching and wet etching.

The insulating film 126 can be formed using a material that can be used for the gate insulating film 127 by any of a variety of film formation methods such as a CVD method and a sputtering method.

In the case where gallium oxide is used for the gate insulating film 127, the insulating film 126 can be formed by a metal organic chemical vapor deposition (MOCVD) method.

The oxide semiconductor film 111 and the oxide semiconductor film 119 can be formed in such a manner that any of the oxide semiconductor films given above is formed, a mask is formed over the formed oxide semiconductor film, and the oxide semiconductor film is processed using the mask. The oxide semiconductor film can be formed by a sputtering method, a coating method, a pulsed laser deposition method, a laser ablation method, or the like. By employing a printing method, the oxide semiconductor film 111 and the oxide semiconductor film 119 subjected to element isolation can be formed directly on the insulating film 126. As a power supply device for generating plasma in the case of forming the oxide semiconductor film by a sputtering method, an RF power supply device, an AC power supply device, a DC power supply device, or the like can be used as appropriate. As a sputtering gas, an atmosphere of a rare gas (typically argon), oxygen, or a mixed gas of a rare gas and oxygen is used as appropriate. In the case of the mixed atmosphere of a rare gas and oxygen, the proportion of oxygen is preferably higher than that of a rare gas. Note that the target may be selected as appropriate depending on the composition of the oxide semiconductor film to be formed. As the mask, a resist mask formed through a photolithography process can be used. The oxide semiconductor film can be processed by one or both of dry etching and wet etching. The etching conditions (e.g., an etching gas or an etching solution, etching time, and temperature) are set as appropriate depending on the material so that the oxide semiconductor film 111 and the oxide semiconductor film 119 can be etched to have desired shapes.

Heat treatment is preferably performed after formation of the oxide semiconductor films 111 and 119 to dehydrate or dehydrogenate the oxide semiconductor films 111 and 119. The heat treatment is performed typically at a temperature higher than or equal to 150° C. and lower than the strain point of the substrate, preferably higher than or equal to 200° C. and lower than or equal to 450° C., more preferably higher than or equal to 300° C. and lower than or equal to 450° C. Note that the heat treatment may be performed on the oxide semiconductor film which has not been processed into the oxide semiconductor films 111 and 119.

In the heat treatment, a heat treatment apparatus is not limited to an electric furnace; the heat treatment apparatus can be an apparatus that heats an object using thermal conduction or thermal radiation given by a medium such as a heated gas or the like. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The heat treatment may be performed under an atmosphere of nitrogen, oxygen, ultra-dry air (air in which a water content is less than or equal to 20 ppm, preferably less than or equal to 1 ppm, more preferably less than or equal to 10 ppb), or a rare gas (e.g., argon or helium). The atmosphere of nitrogen, oxygen, ultra-dry air, or a rare gas preferably does not contain hydrogen, water, and the like. Alternatively, the heat treatment may be performed first under an inert gas atmosphere, and then under an oxygen atmosphere. Note that the treatment time is 3 minutes to 24 hours.

In the case where a base insulating film is provided between the substrate 102, and the scan line 107, the capacitor line 115, and the gate insulating film 127, the base insulating film can be formed using a film of any of the following: silicon oxide, silicon oxynitride, silicon nitride, silicon nitride oxide, gallium oxide, hafnium oxide, yttrium oxide, aluminum oxide, aluminum oxynitride, and the like. Note that when a film of silicon nitride, gallium oxide, hafnium oxide, yttrium oxide, or aluminum oxide is used as the base insulating film, it is possible to suppress diffusion of impurities, typically an alkali metal, water, and hydrogen into the oxide semiconductor film 111 from the substrate 102. The base insulating film can be formed by a sputtering method or a CVD method.

Next, after the opening 123 reaching the capacitor line 115 is formed in the insulating film 126 to form the gate insulating film 127, the signal line 109 including the source electrode 109a, the conductive film 113 serving as the drain electrode 113a, and the conductive film 125 which electrically connects the oxide semiconductor film 119 and the capacitor line 115 are formed (see FIG. 5B).

Note that by performing the above steps, the source electrode 19a, the drain electrode 13a, and the conductive film 16 of the dual-gate transistor 15 can be formed (see FIG. 2B). In addition, the conductive film 16 can be formed in contact with the capacitor line 115 by forming the opening reaching the capacitor line 115 in the gate insulating film 12 when the opening 123 is formed.

The opening 123 can be formed so as to expose part of a region of the insulating film 126, which overlaps with the capacitor line 115, in such a manner that a mask is formed and the insulating film 126 is processed using the mask. The formation of the mask and the processing can be performed in manners similar to those of the scan line 107 and the capacitor line 115.

The signal line 109, the conductive film 113, and the conductive film 125 can be formed in such a manner that a conductive film is formed using a material that can be used for the signal line 109, the conductive film 113, and the conductive film 125, a mask is formed over the conductive film, and the conductive film is processed using the mask. The formation of the mask and the processing can be performed in manners similar to those of the scan line 107 and the capacitor line 115.

Next, an insulating film 128 is formed over the oxide semiconductor film 111, the oxide semiconductor film 119, the signal line 109, the conductive film 113, the conductive film 125, and the gate insulating film 127, an insulating film 130 is formed over the insulating film 128, and an insulating film 133 is formed over the insulating film 130 (see FIG. 6A). The insulating films 128, 130, and 133 are preferably formed successively, in which case entry of impurities into each interface can be suppressed.

The insulating film 128 can be formed using a material that can be used for the insulating film 129 by any of a variety of film formation methods such as a CVD method and a sputtering method. The insulating film 130 can be formed using a material that can be used for the insulating film 131. The insulating film 133 can be formed using a material that can be used for the insulating film 132.

In the case where an oxide insulating film which has fewer interface states between the oxide semiconductor film 111 and the oxide insulating film is used as the insulating film 129, the insulating film 128 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure in the treatment chamber is greater than or equal to 20 Pa and less than or equal to 250 Pa, preferably greater than or equal to 40 Pa and less than or equal to 200 Pa with introduction of a source gas such as a deposition gas containing silicon and an oxidizing gas into the treatment chamber, and high-frequency power is supplied to an electrode provided in the treatment chamber.

Typical examples of the deposition gas containing silicon include silane, disilane, trisilane, and silane fluoride. Examples of the oxidizing gas include oxygen, ozone, dinitrogen monoxide, and nitrogen dioxide.

By setting the ratio of the amount of the oxidizing gas to the amount of the deposition gas containing silicon 100 or higher, the amount of hydrogen contained in the insulating film 128 (the insulating film 129) can be reduced and the number of dangling bonds in the insulating film 128 (the insulating film 129) can be reduced. Oxygen transferred from the insulating film 130 (the insulating film 131) is trapped by the dangling bonds in the insulating film 128 (the insulating film 129) in some cases; thus, in the case where the dangling bonds in the insulating film 128 (the insulating film 129) are reduced, oxygen in the insulating film 130 (the insulating film 131) can be transferred to at least the oxide semiconductor film 111 efficiently to compensate the oxygen vacancies in the oxide semiconductor film 111. As a result, the amount of hydrogen entering the oxide semiconductor film 111 can be reduced and the oxygen vacancies in the oxide semiconductor film 111 can be reduced.

In the case where the above oxide insulating film which includes an oxygen excess region or the above oxide insulating film containing oxygen at a higher proportion than oxygen in the stoichiometric composition is used as the insulating film 131, the insulating film 130 can be formed under the following formation conditions. Here, as the oxide insulating film, a silicon oxide film or a silicon oxynitride film is formed. As for the formation conditions, the substrate placed in a treatment chamber of the plasma CVD apparatus, which is vacuum-evacuated, is held at a temperature higher than or equal to 180° C. and lower than or equal to 260° C., preferably higher than or equal to 180° C. and lower than or equal to 230° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power that is higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the source gas of the insulating film 130, the source gas that can be used to form the insulating film 128 can be used.

As the formation conditions of the insulating film 130, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content of the insulating film 130 becomes higher than that in the stoichiometric composition. In addition, in the film formed at a substrate temperature within the above temperature range, the bond between silicon and oxygen is weak, and accordingly, part of oxygen in the film can be released by heat treatment in the later step. Thus, it is possible to form an oxide insulating film containing oxygen at a higher proportion than the stoichiometric composition and from which part of oxygen is released by heating. Moreover, the insulating film 128 is provided over the oxide semiconductor film 111. Therefore, in the process for forming the insulating film 130, the insulating film 128 serves as a protective film of the oxide semiconductor film 111. Thus, even when the insulating film 130 is formed using the high-frequency power having a high power density, damage to the oxide semiconductor film 111 can be suppressed.

By increasing the thickness of the insulating film 130, the amount of oxygen released by heating can be increased; thus, the insulating film 130 is preferably provided thicker than the insulating film 128. Since the insulating film 128 is provided, favorable coverage can be achieved even when the insulating film 130 is formed thick.

The insulating film 132 can be formed by a sputtering method, a CVD method, or the like. In the case where a nitride insulating film with a low hydrogen content is used as the insulating film 132, the insulating film 132 can be formed under the following formation conditions. Here, as the nitride insulating film, a silicon nitride film is formed. As for the formation conditions, the substrate placed in a treatment chamber of the plasma CVD apparatus, which is vacuum-evacuated, is held at a temperature higher than or equal to 80° C. and lower than or equal to 400° C., preferably higher than or equal to 200° C. and lower than or equal to 370° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power is supplied to an electrode provided in the treatment chamber.

As the source gas of the insulating film 132, a deposition gas containing silicon, nitrogen, and ammonia are preferably used. Typical examples of the deposition gas containing silicon include silane, disilane, trisilane, and silane fluoride. Further, the flow rate of nitrogen is preferably 5 times to 50 times that of ammonia, further preferably 10 times to 50 times that of ammonia. The use of ammonia as the source gas can promote decomposition of the deposition gas containing silicon and nitrogen. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

It is preferable that heat treatment be performed at least after formation of the insulating film 130 so that oxygen contained in the insulating film 128 or the insulating film 130 is transferred to at least the oxide semiconductor film 111 to compensate oxygen vacancies in the oxide semiconductor film 111. The heat treatment can be performed as appropriate with reference to the details of heat treatment for dehydration or dehydrogenation of the oxide semiconductor film 111 and the oxide semiconductor film 119.

Next, the opening 117 reaching the conductive film 113 is formed in a region of the insulating films 128, 130, and 133, which overlaps with the conductive film 113, so that the insulating films 129, 131, and 132 are formed; and then the pixel electrode 121 is formed over the insulating film 132 and in the opening 117 (see FIG. 6B).

Note that through these steps, the insulating films 29, 31, and 32, the opening 94, and the wiring 92 of the dual-gate transistor 15 can be formed (see FIG. 2B). Through these steps, the capacitor line 115 and the wiring 92 including the back-gate electrode of the dual-gate transistor 15 included in the scan line driver circuit 104 are electrically connected to each other through the conductive film 16.

The opening 117 can be formed in a manner similar to that of the opening 123. The pixel electrode 121 is formed in such a manner that a conductive film is formed using any of the materials given above in contact with the conductive film 113 through the opening 117, a mask is formed over the conductive film, and the conductive film is processed using the mask. The formation of the mask and the processing can be performed in manners similar to those of the scan line 107 and the capacitor line 115.

Next, the alignment film 158 is formed over the insulating film 132 and the pixel electrode 121, and the substrate 150 is formed on the light-blocking film 152. In addition, the counter electrode 154 is formed so as to cover the light-blocking film 152, and the counter electrode 154 is formed on the alignment film 156. The liquid crystal 160 is provided over the alignment film 158, the substrate 150 is provided above the substrate 102 so that the alignment film 156 is in contact with the liquid crystal 160, and the substrate 102 and the substrate 150 are fixed to each other with a sealant (not illustrated).

The alignment films 156 and 158 can be formed using the above material by any of a variety of film formation methods such as a spin coating method and a printing method.

The light-blocking film 152 can be formed by a sputtering method using any of the materials given above and can be processed using a mask. In the case where a resin is used, the light-blocking film 152 can be formed through a photolithography process.

The counter electrode 154 can be formed using the material that can be used for the pixel electrode 121 by any of a variety of film formation methods such as a CVD method and a sputtering method.

The liquid crystal 160 can be directly provided on the alignment film 158 by a dispenser method (a dropping method). Alternatively, the liquid crystal 160 may be injected by using capillary action or the like after the substrate 102 and the substrate 150 are attached to each other. Further, the alignment films 156 and 158 are preferably subjected to rubbing treatment so that alignment of the liquid crystal 160 is easily performed.

Through the above process, the semiconductor device of one embodiment of the present invention can be fabricated (see FIG. 4).

Modification Example 1

In the semiconductor device of one embodiment of the present invention, connection of the capacitor line and the semiconductor film (specifically, the oxide semiconductor film) serving as one electrode of the capacitor can be changed as appropriate. For example, to improve the aperture ratio, a structure where the semiconductor film is in direct contact with the capacitor line without the conductive film provided therebetween can be employed.

Note that in the drawings illustrating modification examples below, the substrate 150, the light-blocking film 152, the counter electrode 154, the alignment films 156 and 158, and the liquid crystal 160 are omitted for simplicity of drawing.

Figure 7:
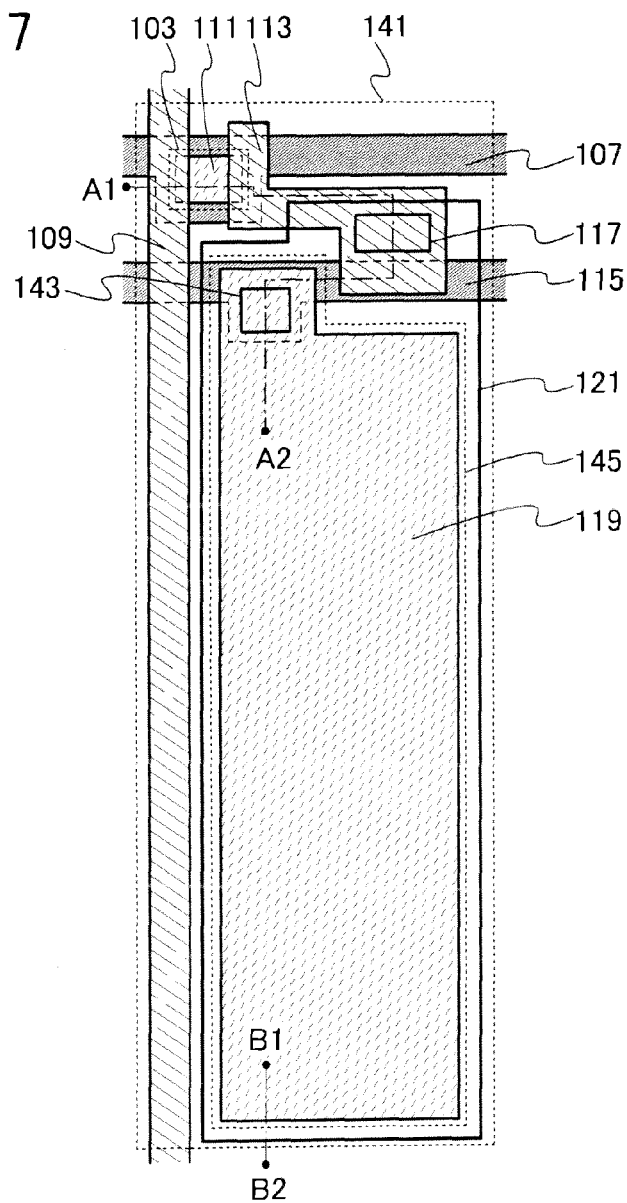
FIG. 7 is a top view illustrating a semiconductor device of one embodiment of the present invention.
Figure 8:
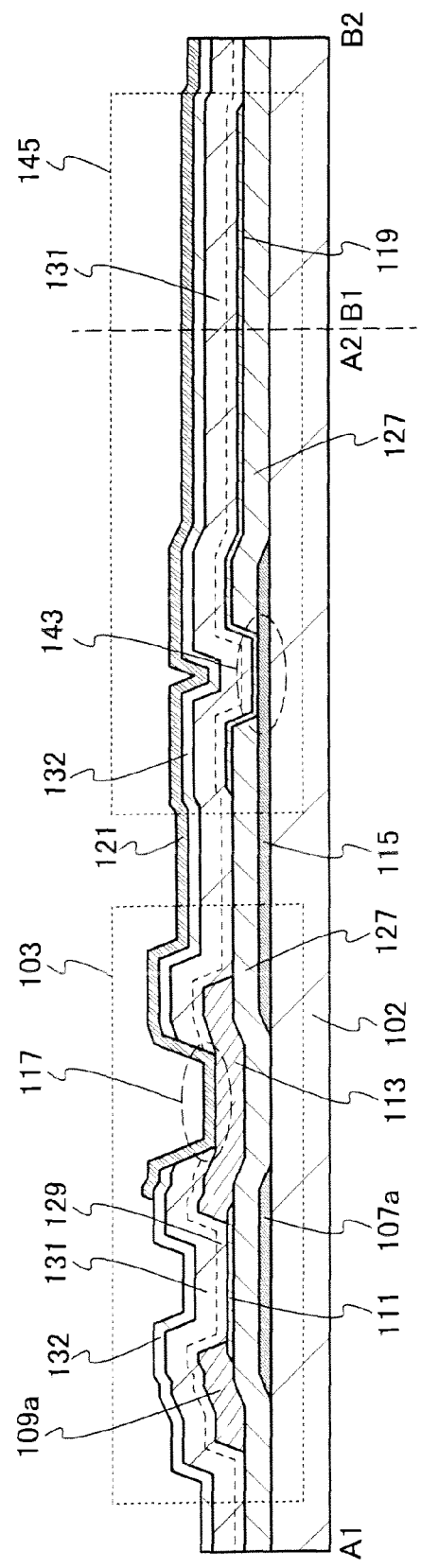
FIG. 8 is a cross-sectional view illustrating a semiconductor device of one embodiment of the present invention.

This structure is described with reference to FIG. 7 and FIG. 8. FIG. 7 is a top view of a pixel 141, and FIG. 8 is a cross-sectional view taken along dashed-dotted line A1-A2 and dashed-dotted line B1-B2 in FIG. 7. Here, only a capacitor 145 which is different from the capacitor 105 described with reference to FIG. 3 and FIG. 4 is described. The structure of the pixel 141 in FIG. 7 and FIG. 8 is similar to that in FIG. 3 and FIG. 4, except for the capacitor 145.

In the pixel 141, the oxide semiconductor film 119 serving as one electrode of the capacitor 145 is in direct contact with the capacitor line 115 through an opening 143. Unlike in the capacitor 105 in FIG. 4, the oxide semiconductor film 119 is in direct contact with the capacitor line 115 without the conductive film 125 provided therebetween and the conductive film 125 serving as a light-blocking film is not formed, so that a higher aperture ratio of the pixel 141 can be achieved.

Figure 9:
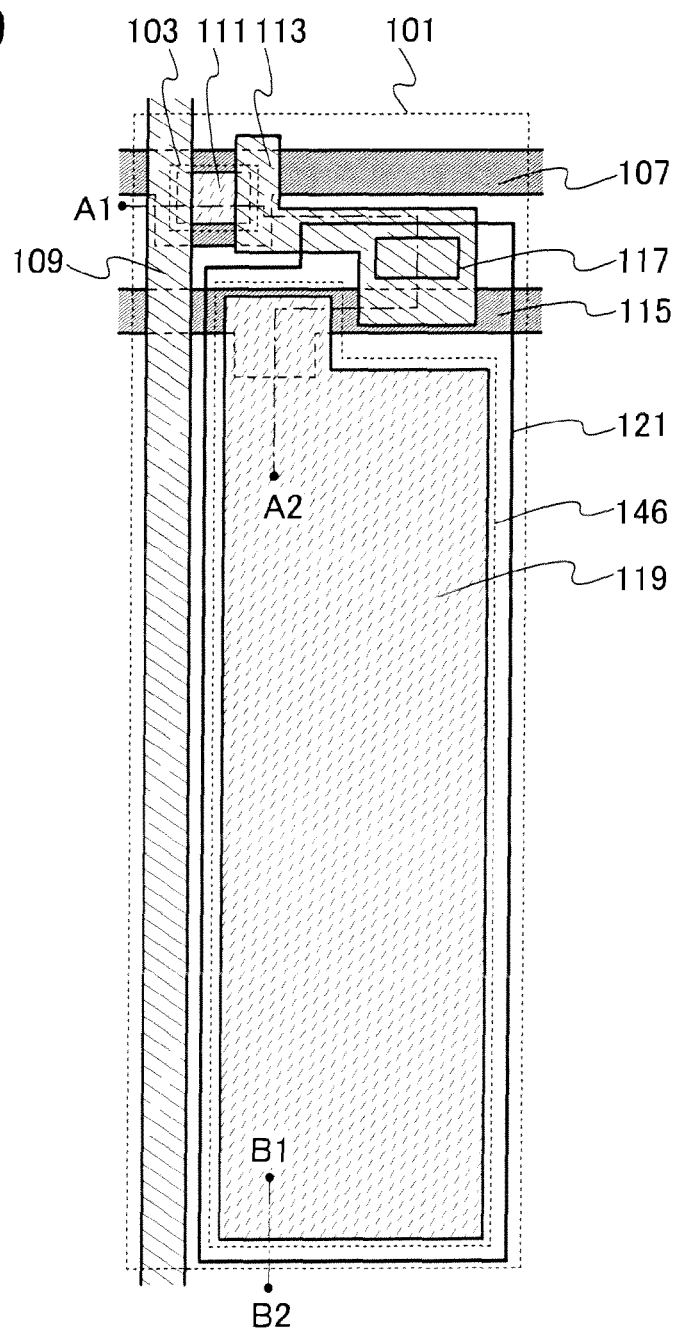
FIG. 9 is a top view illustrating a semiconductor device of one embodiment of the present invention.

Alternatively, in the semiconductor device of one embodiment of the present invention, the structure in which the semiconductor film is in direct contact with the capacitor line may be obtained by employing a structure in which a region where the capacitor line is partly exposed and a region where the substrate is partly exposed are provided instead of forming an opening in the gate insulating film. FIG. 9 is a top view of a pixel 101, and FIG. 10 is a cross-sectional view taken along dashed-dotted line A1-A2 and dashed-dotted line B1-B2 in FIG. 9.

Figure 10:
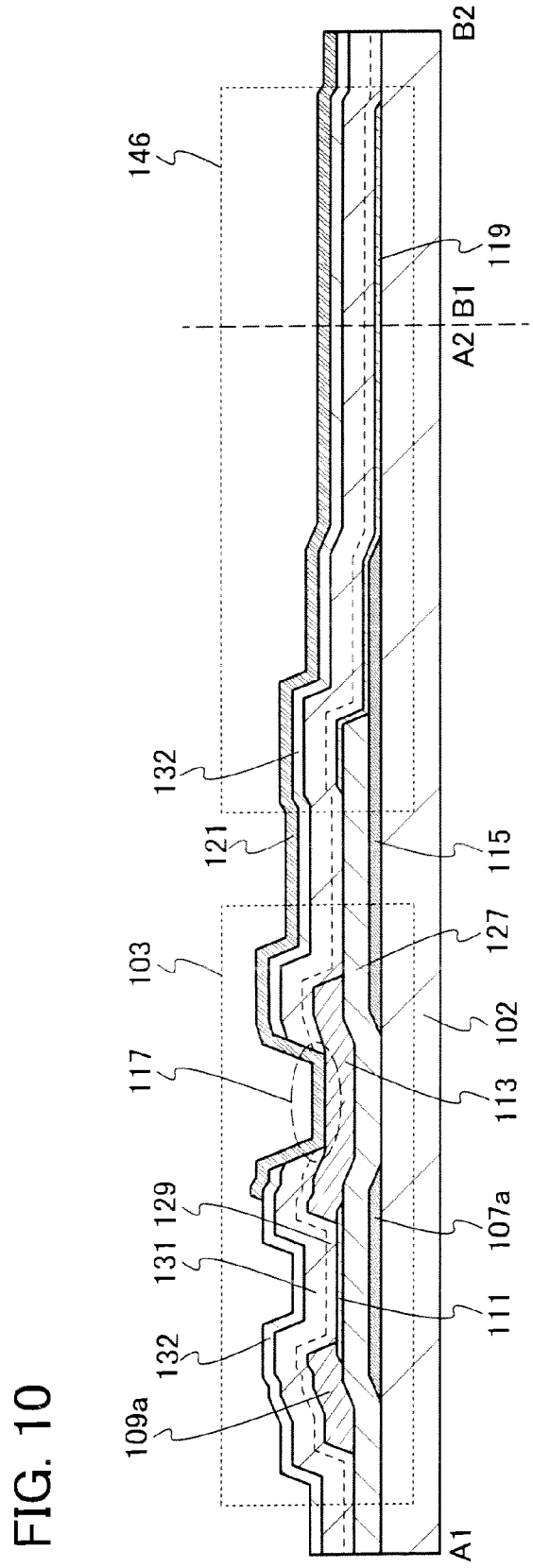
FIG. 10 is a cross-sectional view illustrating a semiconductor device of one embodiment of the present invention.

According to FIG. 9 and FIG. 10, in the pixel 101 of this structure, part of the gate insulating film 127 is removed, the capacitor line 115 and the substrate 102 are each partly exposed, and the capacitor line 115 and the oxide semiconductor film 119 are in direct contact with each other in these exposed regions. Accordingly, the area in which the capacitor line 115 and the oxide semiconductor film 119 are in contact with each other can be increased. Thus, the aperture ratio can be increased and the capacitor 146 can be brought into conduction easily.

Modification Example 2

Figure 11:
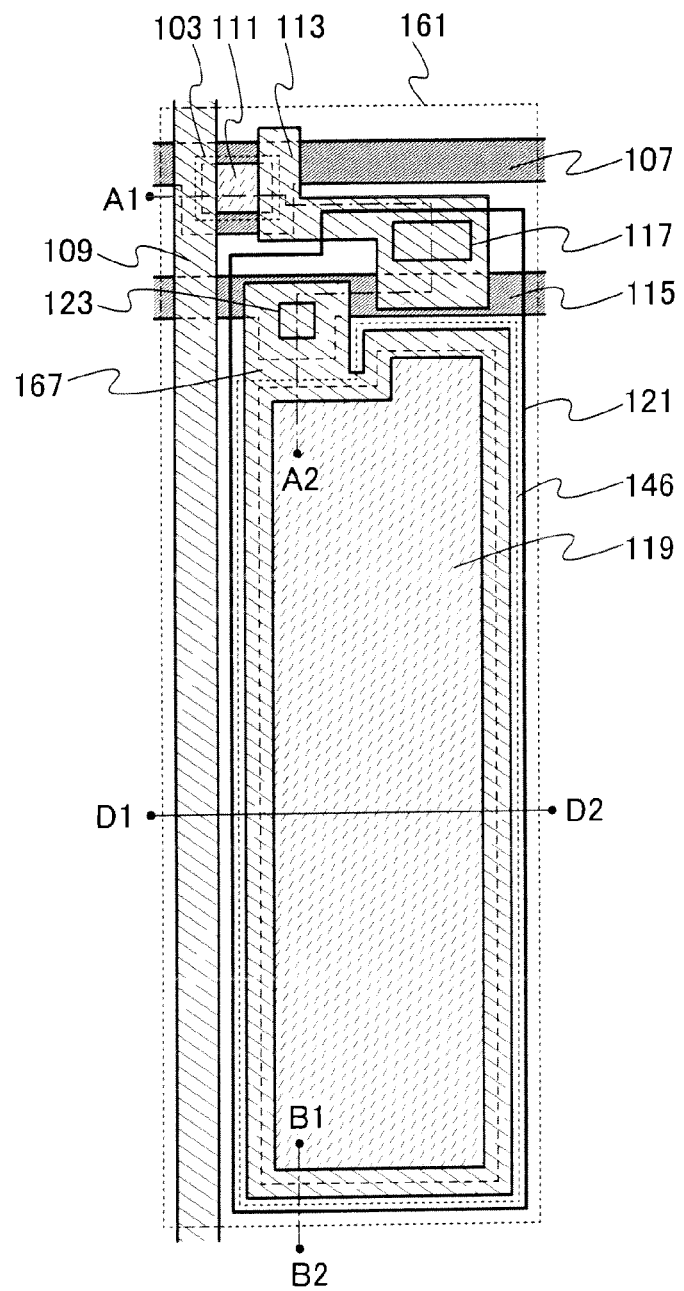
FIG. 11 is a top view illustrating a semiconductor device of one embodiment of the present invention.

In the semiconductor device of one embodiment of the present invention, connection of the capacitor line and the semiconductor film (specifically, the oxide semiconductor film) serving as one electrode of the capacitor can be changed as appropriate. For example, to increase the conductivity of the semiconductor film, the conductive film can be provided in contact with the semiconductor film along the outer periphery thereof. This structure is described with reference to FIG. 11 and FIGS. 12A and 12B. Here, only a conductive film 167 which is different from the conductive film 125 described with reference to FIG. 3 and FIG. 4 is described. FIG. 11 is a top view of a pixel 161, FIG. 12A is a cross-sectional view taken along dashed-dotted line A1-A2 and dashed-dotted line B1-B2 in FIG. 11, and FIG. 12B is a cross-sectional view taken along dashed-dotted line D1-D2 in FIG. 11.

In the pixel 161, the conductive film 167 is in contact with the oxide semiconductor film 119 along the outer periphery thereof and is in contact with the capacitor line 115 through the opening 123 (see FIG. 11). The conductive film 167 is formed in the same formation process as the signal line 109 including the source electrode 109a of the transistor 103 and the conductive film 113 serving as the drain electrode 113a (not illustrated) of the transistor 103 and thus may have a light-blocking property; for this reason, the conductive film 167 is preferably formed into a loop shape.

As illustrated in FIGS. 12A and 12B, in the pixel 161 of this structure, the conductive film 167 is provided so as to cover end portions of the oxide semiconductor film 119 of the capacitor 105. The structure of the pixel 161 in FIG. 11 and FIGS. 12A and 12B is similar to that in FIG. 3 and FIG. 4, except for the conductive film 167.

In the structure illustrated in FIG. 11 and FIGS. 12A and 12B, the conductive film 167 is formed into a loop shape; however, a portion of the conductive film 167, which is in contact with the oxide semiconductor film 119, does not have to be entirely electrically connected to the capacitor line 115. In other words, a conductive film formed in the same formation process as the conductive film 167 may be provided in contact with the oxide semiconductor film 119 so as to be separated from the conductive film 167.

Modification Example 3

Figure 13:
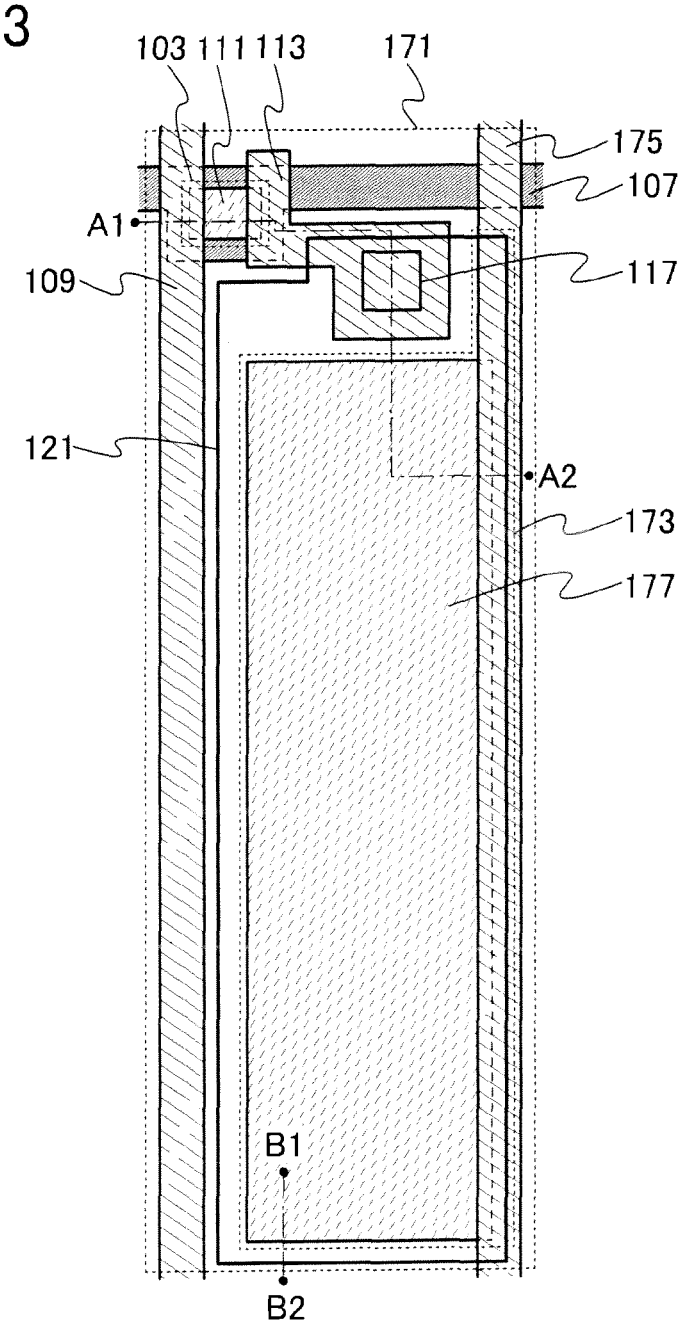
FIG. 13 is a top view illustrating a semiconductor device of one embodiment of the present invention.

In the semiconductor device of one embodiment of the present invention, connection of the capacitor line and the semiconductor film (specifically, the oxide semiconductor film) serving as one electrode of the capacitor can be changed as appropriate. Specific example of this structure is described with reference to FIG. 13 and FIG. 14. Here, only an oxide semiconductor film 177 and a capacitor line 175 which are different from the oxide semiconductor film 119 and the capacitor line 115 described with reference to FIG. 3 and FIG. 4 is described. FIG. 13 is a top view of a pixel 171 where the capacitor line 175 extends in a direction parallel to the signal line 109. The signal line 109 and the capacitor line 175 are electrically connected to the signal line driver circuit 106 (see FIG. 1A).

A capacitor 173 is connected to the capacitor line 175 which extends in a direction parallel to the signal line 109. The capacitor 173 includes the light-transmitting oxide semiconductor film 177 formed by utilizing the process for forming the oxide semiconductor film 111, the light-transmitting pixel electrode 121, and, as a dielectric film, the light-transmitting insulating films (not illustrated in FIG. 13) which are included in the transistor 103. That is, the capacitor 173 transmits light.

Figure 14:
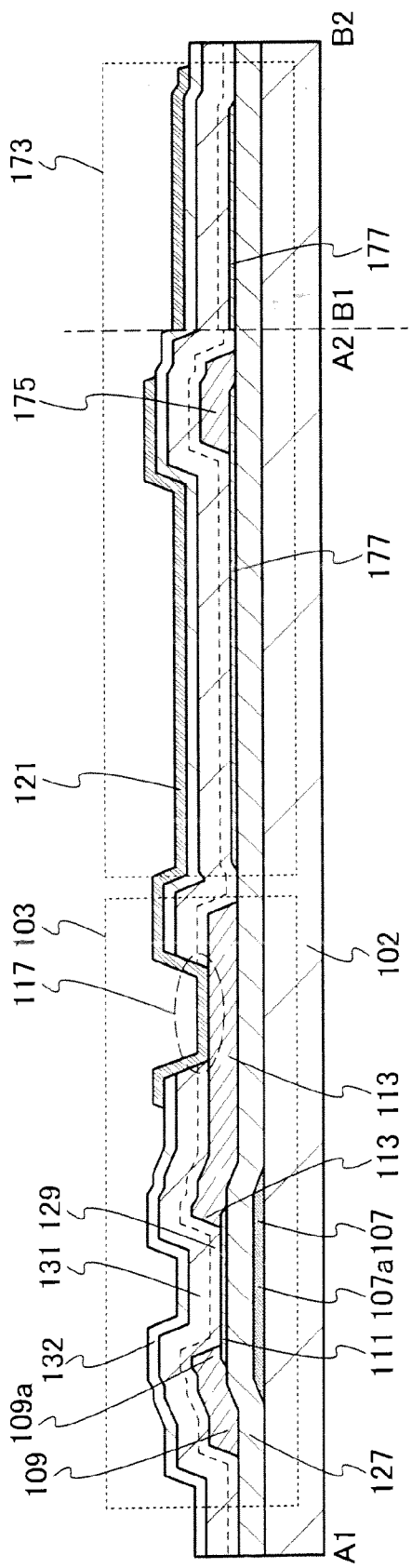
FIG. 14 is a cross-sectional view illustrating a semiconductor device of one embodiment of the present invention.

Next, FIG. 14 is a cross-sectional view taken along dashed-dotted line A1-A2 and dashed-dotted line B1-B2 in FIG. 13.

In the capacitor 173, the oxide semiconductor film 177 serves as one of a pair of electrodes, the pixel electrode 121 serves as the other of the pair of electrodes, and the insulating films 129, 131, and 132 serve as a dielectric film provided between the pair of electrodes.

The capacitor line 175 can be formed by utilizing the process for forming the signal line 109 and the conductive film 113. When the capacitor line 175 is provided in contact with the oxide semiconductor film 177, the area where the oxide semiconductor film 177 and the capacitor line 175 are in contact with each other can be increased. The oxide semiconductor film 177 can easily serve as one electrode of the capacitor 173.

Further, in the pixel 171 illustrated in FIG. 13, the length of the pixel 171 in the direction in which the signal line 109 extends is longer than the length of the pixel 171 in the direction in which the scan line 107 extends. However, as in a pixel 172 illustrated in FIG. 15, the following structure may be employed: the length of the pixel 172 in the direction in which the scan line 107 extends is longer than the length of the pixel 172 in which the signal line 109 extends, and a capacitor line 176 extends in a direction parallel to the signal line 109. Note that the signal line 109 and the capacitor line 176 are electrically connected to the signal line driver circuit 106 (see FIG. 1A).

A capacitor 174 is connected to the capacitor line 176 which extends in a direction parallel to the signal line 109. The capacitor 174 includes a light-transmitting oxide semiconductor film 178 formed by utilizing the process for forming the oxide semiconductor film 111, the light-transmitting pixel electrode 121, and, as a dielectric film, the light-transmitting insulating films (not illustrated in FIG. 15) which are included in the transistor 103. That is, the capacitor 174 transmits light.

Figure 15:
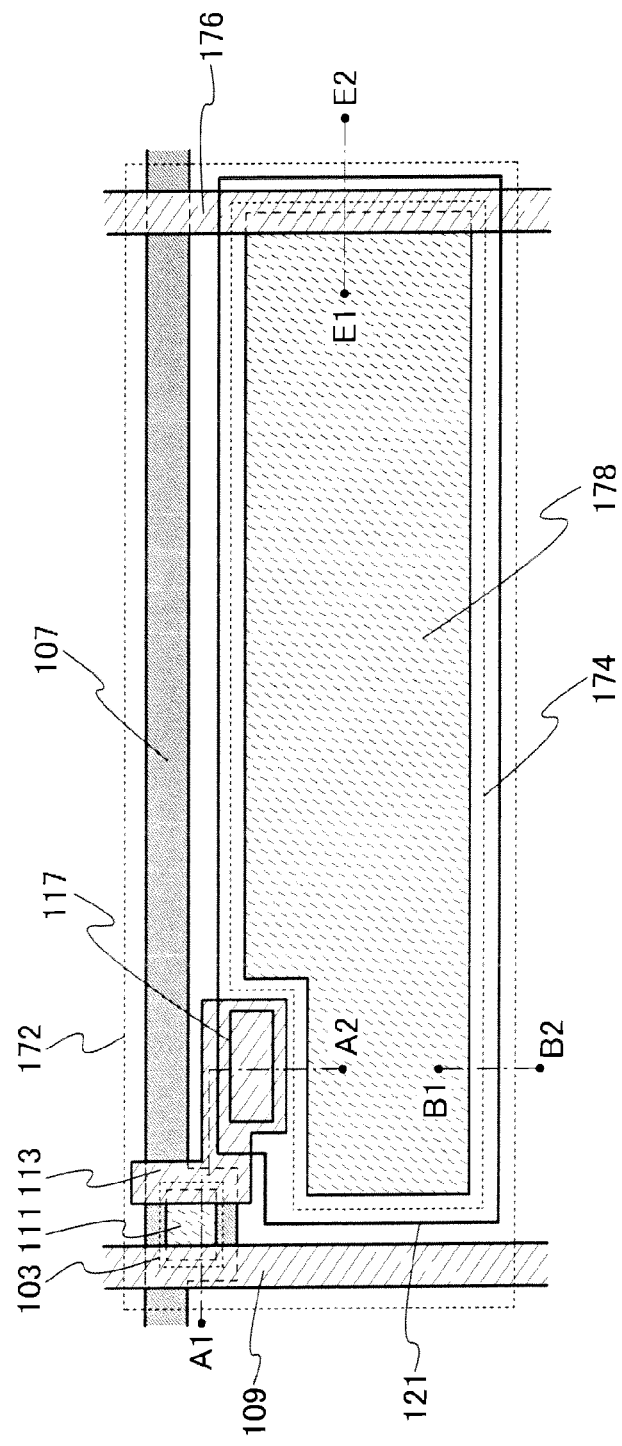
FIG. 15 is a top view illustrating a semiconductor device of one embodiment of the present invention.
Figure 16:
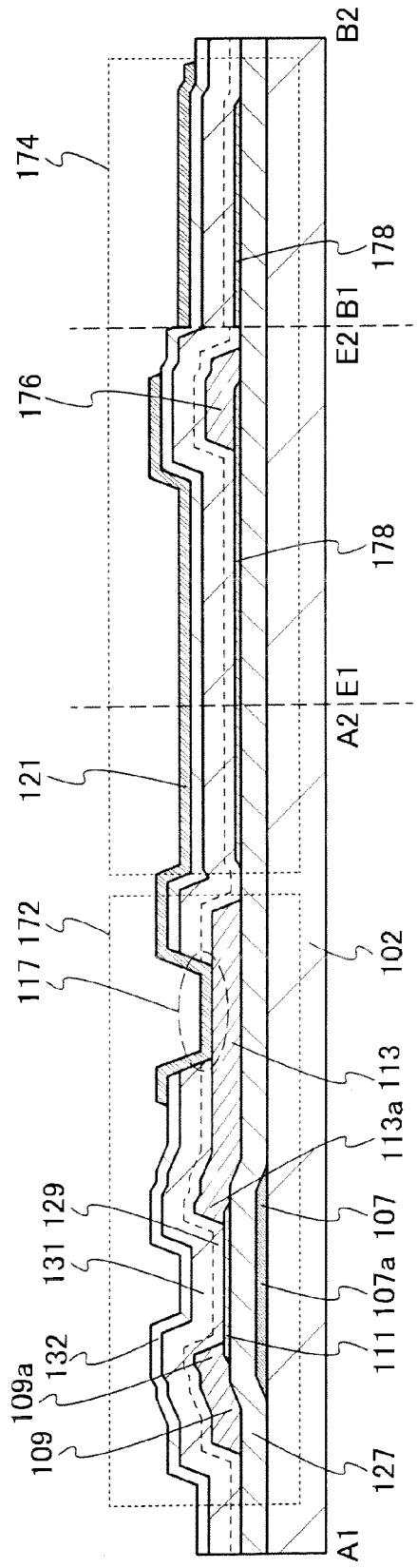
FIG. 16 is a cross-sectional view illustrating a semiconductor device of one embodiment of the present invention.

Next, FIG. 16 is a cross-sectional view taken along dashed-dotted line A1-A2 and dashed-dotted line B1-B2 in FIG. 15.

In the capacitor 174, the oxide semiconductor film 178 serves as one of a pair of electrodes, the pixel electrode 121 serves as the other of the pair of electrodes, and the insulating films 129, 131, and 132 serve as a dielectric film provided between the pair of electrodes.

The capacitor line 176 can be formed by utilizing the process for forming the signal line 109 and the conductive film 113. When the capacitor line 176 is provided in contact with the oxide semiconductor film 178, the area where the oxide semiconductor film 178 and the capacitor line 176 are in contact with each other can be increased. Further, in the pixel 172, the length of the pixel 172 in the direction in which the scan line 107 extends is longer than the length of the pixel 172 in the direction in which the signal line 109 extends; therefore, the area in which the pixel electrode 121 and the capacitor line 176 are overlapped with each other can be reduced and the aperture ratio can be improved as compared to the pixel 171 illustrated in FIG. 13.

Modification Example 4

Figure 17:
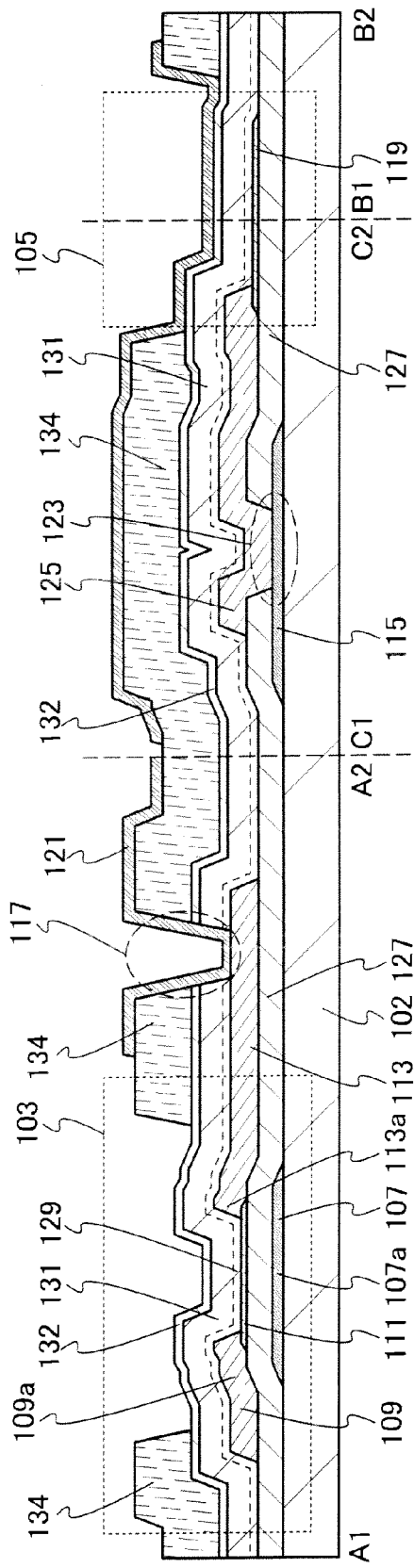
FIG. 17 is a cross-sectional view illustrating a semiconductor device of one embodiment of the present invention.

To reduce parasitic capacitance generated between the pixel electrode 121 and the conductive film 113 and parasitic capacitance generated between the pixel electrode 121 and the conductive film 125 in the above pixels 101, 141, 161, 171, and 172, an organic insulating film 134 can be provided in a region where the parasitic capacitance is generated as illustrated in a cross-sectional view in FIG. 17. The structure in FIG. 17 is the same as that in FIG. 4 except for the organic insulating film 134. Here, only the organic insulating film 134 not included in the structure in FIG. 4 is described.

For the organic insulating film 134, a photosensitive organic resin or a non-photosensitive organic resin can be used; for example, an acrylic resin, a benzocyclobutene resin, an epoxy resin, a siloxane-based resin, or the like can be used. Alternatively, polyamide can be used for the organic insulating film 134.

The organic insulating film 134 can be formed in such manner that an organic resin film is formed using any of the materials given above and processed. When a photosensitive organic resin is used for the organic insulating film 134, a resist mask is unnecessary in formation of the organic insulating film 134 and thus a process can be simplified. Therefore, a formation method of the organic insulating film is not particularly limited and can be selected as appropriate in accordance with a material which is used. For example, a CVD method, a sputtering method, spin coating, dipping, spray coating, a droplet discharge method (such as an inkjet method), screen printing, offset printing, or the like can be used.

In general, an organic resin contains much hydrogen and water; thus, when an organic resin is provided over the transistor 103 (in particular, the oxide semiconductor film 111), hydrogen and water contained in the organic resin diffuses into the transistor 103 (in particular, the oxide semiconductor film 111) and might degrade the electrical characteristics of the transistor 103. For this reason, it is preferable that the organic insulating film 134 be not provided at least over a portion of the insulating film 132, which overlaps with the oxide semiconductor film 111. In other words, it is preferable that a region of the organic resin film, which is over a region overlapping with at least the oxide semiconductor film 111, be removed.

Figure 18:
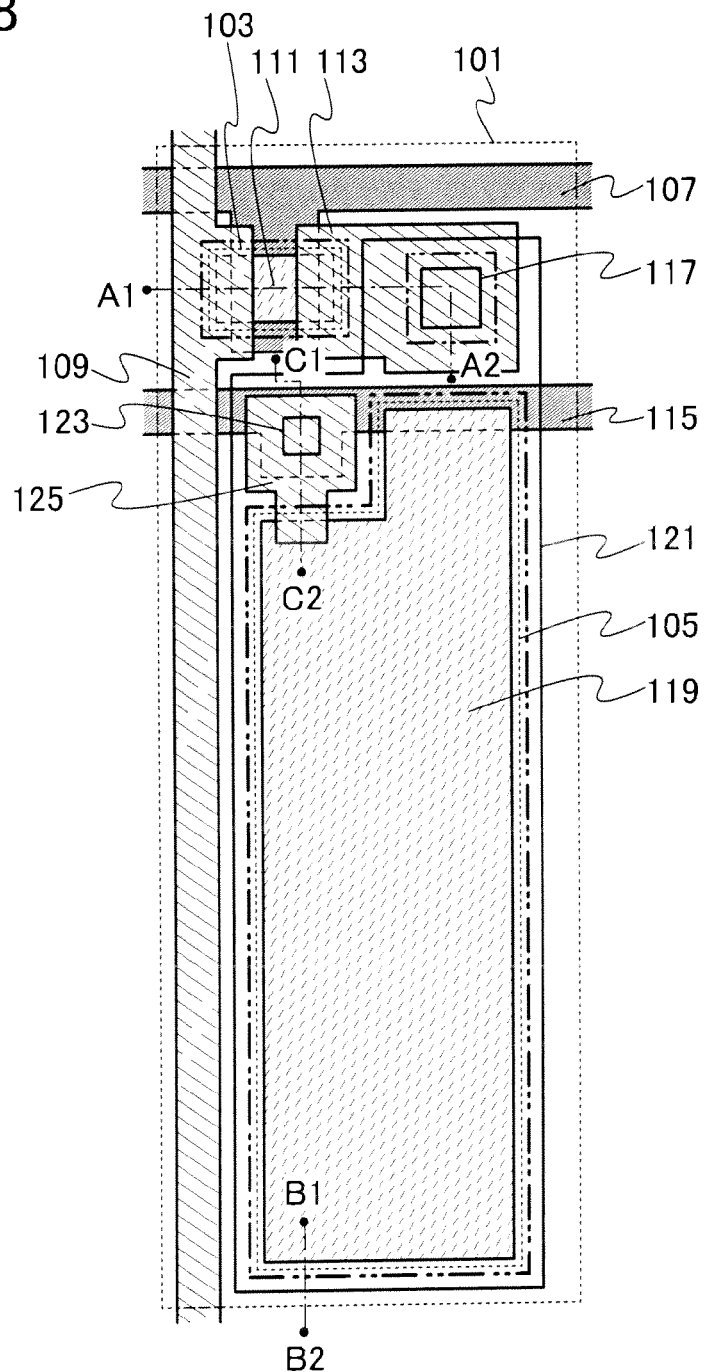
FIG. 18 is a top view illustrating a semiconductor device of one embodiment of the present invention.

FIG. 18 is a top plan view of the pixel 101 illustrated in FIG. 17. The cross-sectional view in FIG. 17 corresponds to cross sections taken along dashed-dotted line A1-A2, dashed-dotted line B1-B2, and dashed-dotted line C1-C2 in FIG. 18. In FIG. 18, the organic insulating film 134 is not illustrated for simplification; however, a region indicated by dashed-two dotted lines is a region where the organic insulating film 134 is not provided.

Modification Example 5

Figure 19:
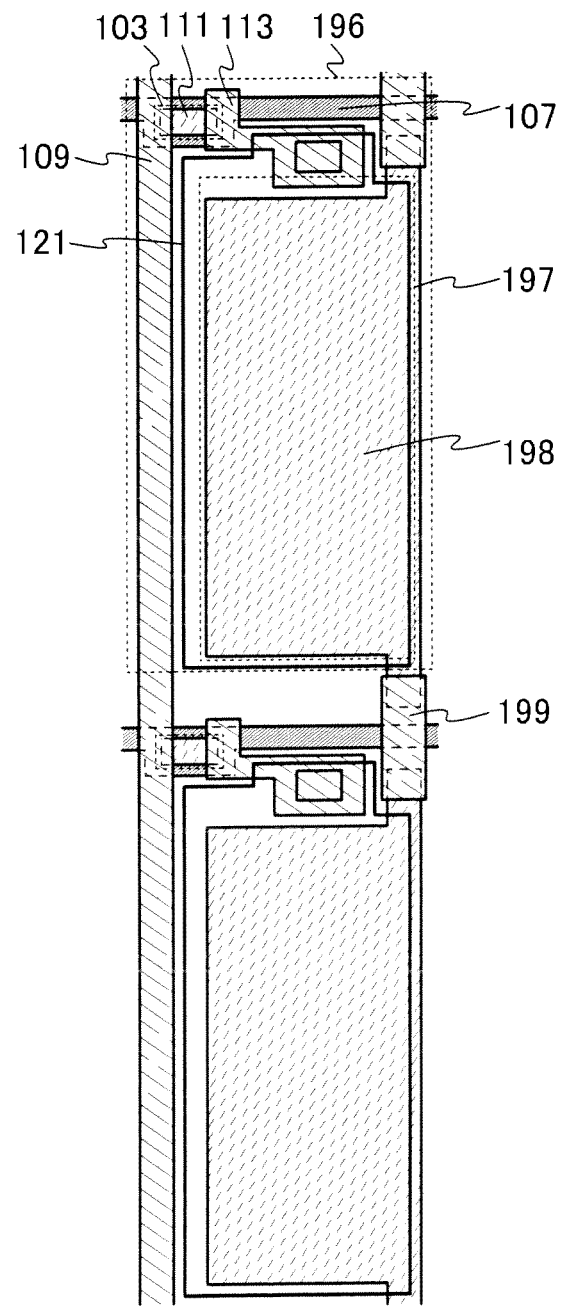
FIG. 19 is a top view illustrating a semiconductor device of one embodiment of the present invention.

In the semiconductor device of one embodiment of the present invention, one electrode of the capacitor and the capacitor line can be formed using a semiconductor film (specifically, an oxide semiconductor film). Specific example is described with reference to FIG. 19. Here, only an oxide semiconductor film 198 which is different from the oxide semiconductor film 119 and the capacitor line 115 described with reference to FIG. 3 is described. FIG. 19 is a top view of a pixel 196 where the oxide semiconductor film 198 serving as one electrode of a capacitor 197 and the capacitor line is provided in the pixel 196. The oxide semiconductor film 198 has a region which extends in a direction parallel to the signal line 109 and the region serves as the capacitor line. In the oxide semiconductor film 198, a region overlapping with the pixel electrode 121 serves as one electrode of the capacitor 197. Note that in the oxide semiconductor film 198, the maximum width of a depletion layer gets extremely larger by applying an electric field; therefore, the oxide semiconductor film 198 is brought into conduction.

The oxide semiconductor film 198 can be formed by utilizing the process for forming the oxide semiconductor film 111 of the transistor 103 provided in the pixel 196.

One oxide semiconductor film can be provided as the oxide semiconductor film 198 for the pixels 196 so as to overlap with the scan lines 107. In other words, a continuous oxide semiconductor film can be provided for the pixels 196 in one row.

In the case where a continuous oxide semiconductor film is provided as the oxide semiconductor film 198 for the pixels 196 in one row, the oxide semiconductor film 198 overlaps with the scan lines 107. For this reason, the oxide semiconductor film 198 in some cases does not sufficiently serve as the capacitor line and one electrode of the capacitor 197 due to an effect of a change in the potential of the scan line 107. Thus, as illustrated in FIG. 19, the oxide semiconductor films 198 are preferably separated from each other between the pixels 196, and the separated oxide semiconductor films are electrically connected to each other through a conductive film 199 which can be formed by utilizing the process for forming the signal line 109 and the conductive film 113.

In FIG. 19, a region of the oxide semiconductor film 198, which serves as the capacitor line, extends in a direction parallel to the signal line 109; however, the region which serves as the capacitor line may extend in a direction parallel to the scan line 107. In the case where the region of the oxide semiconductor film 198, which serves as the capacitor line, extends in a direction parallel to the scan line 107, it is necessary that the oxide semiconductor film 111 and the oxide semiconductor film 198 be electrically insulated from the signal line 109 and the conductive film 113 by providing an insulating film between the oxide semiconductor film 111 and the oxide semiconductor film 198, and the signal line 109 and the conductive film 113, in the transistor 103 and the capacitor 197.

As described above, when a light-transmitting oxide semiconductor film is provided for one electrode of a capacitor provided in a pixel and a capacitor line as in the pixel 196, the pixel can have a higher aperture ratio.

Modification Example 6

Figure 20:
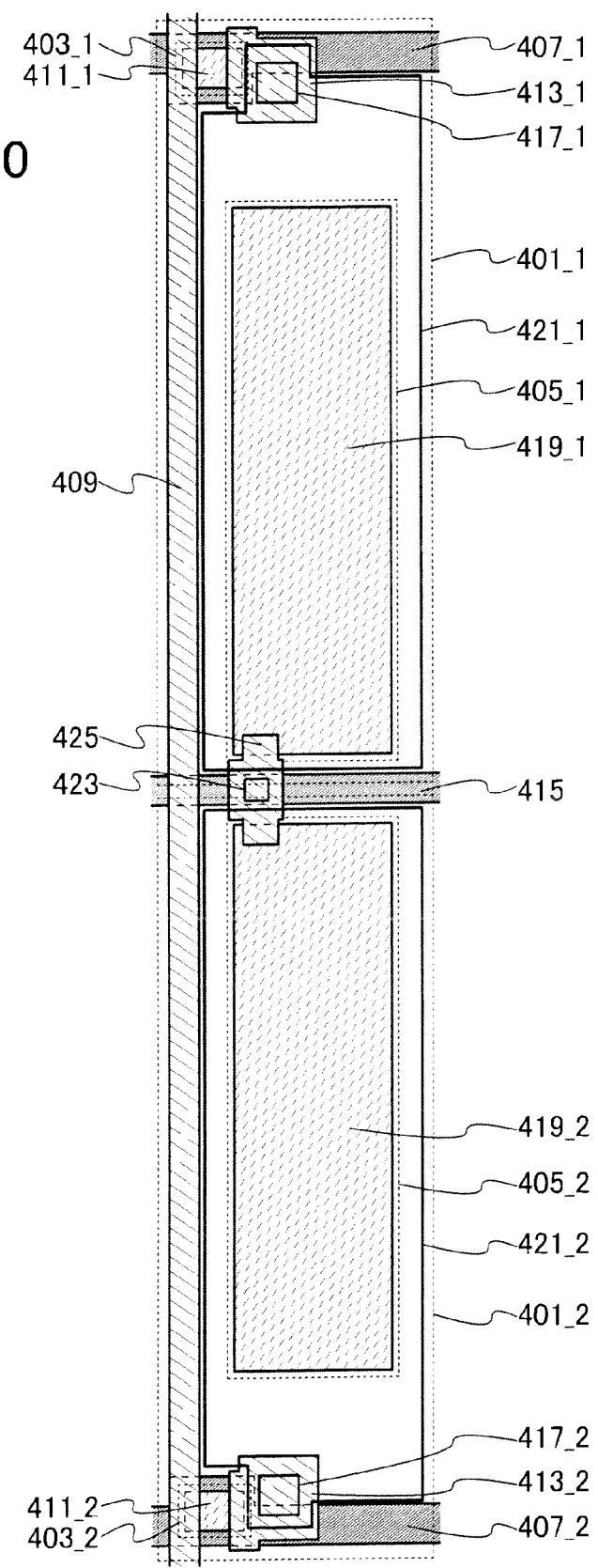
FIG. 20 is a top view illustrating a semiconductor device of one embodiment of the present invention.

In the semiconductor device of one embodiment of the present invention, the structure of the capacitor line can be changed as appropriate. This structure is described with reference to FIG. 20. In FIG. 20, unlike the capacitor line 115 described with reference to FIGS. 2A and 2B, a capacitor line is provided between adjacent two pixels.

FIG. 20 is a top view of a pixel 401_1 and a pixel 401_2 adjacent to each other in the direction in which a signal line 409 extends.

A scan line 407_1 and a scan line 407_2 are provided so as to extend in parallel to each other in the direction substantially perpendicular to the signal line 409. A capacitor line 415 is provided between the scan lines 407_1 and 407_2 so as to be in parallel to the scan lines 407_1 and 407_2. The capacitor line 415 is connected to a capacitor 405_1 provided in the pixel 401_1 and a capacitor 405_2 provided in the pixel 401_2. Top surface shape and the positions of components of the pixel 401_1 and those of the pixel 401_2 are symmetric with respect to the capacitor line 415.

The pixel 401_1 is provided with a transistor 403_1 and the capacitor 405_1 connected to the transistor 403_1.

The transistor 403_1 is provided in a region where the scan line 407_1 and the signal line 409 intersect with each other. The transistor 403_1 includes at least a semiconductor film 411_1 including a channel formation region, a gate electrode, a gate insulating film (not illustrated in FIG. 20), a source electrode, and a drain electrode. A region of the scan line 407_1, which overlaps with the semiconductor film 411_1, serves as the gate electrode of the transistor 403_1. A region of the signal line 409, which overlaps with the semiconductor film 411_1, serves as the source electrode of the transistor 403_1. A region of a conductive film 413_1, which overlaps with the semiconductor film 411_1, serves as the drain electrode of the transistor 403_1. The conductive film 413_1 and a pixel electrode 421_1 are connected to each other through an opening 417_1.

The capacitor 405_1 is electrically connected to the capacitor line 415 through a conductive film 425 provided in and over an opening 423. The capacitor 405_1 includes a semiconductor film 419_1 formed with a light-transmitting oxide semiconductor, the light-transmitting pixel electrode 421_1, and, as a dielectric film, a light-transmitting insulating film (not illustrated in FIG. 20) which is included in the transistor 403_1. That is, the capacitor 405_1 transmits light.

The pixel 401_2 is provided with a transistor 403_2 and the capacitor 405_2 connected to the transistor 4032.

The transistor 403_2 is provided in a region where the scan line 407_2 and the signal line 409 intersect with each other. The transistor 403_2 includes at least a semiconductor film 411_2 including a channel formation region, a gate electrode, a gate insulating film (not illustrated in FIG. 20), a source electrode, and a drain electrode. A region of the scan line 407_2, which overlaps with the semiconductor film 411_2, serves as the gate electrode of the transistor 403_2. A region of the signal line 409, which overlaps with the semiconductor film 411_2, serves as the source electrode of the transistor 403_2. A region of a conductive film 413_2, which overlaps with the semiconductor film 411_2, serves as the drain electrode of the transistor 403_2. The conductive film 413_2 and a pixel electrode 421_2 are connected to each other through an opening 417_2.

The capacitor 405_2 is electrically connected to the capacitor line 415 through the conductive film 425 provided in and over the opening 423 in a manner similar to that of the capacitor 405_1. The capacitor 405_2 includes a semiconductor film 419_2 formed with a light-transmitting oxide semiconductor, the light-transmitting pixel electrode 421_2, and, as a dielectric film, a light-transmitting insulating film (not illustrated in FIG. 20) which is included in the transistor 403_2. That is, the capacitor 405_2 transmits light.

Cross-sectional structures of the transistors 403_1 and 403_2 and the capacitors 405_1 and 405_2 are similar to those of the transistor 103 and the capacitor 105 illustrated in FIG. 3 and thus descriptions thereof are omitted here.

In a structure seen from above, a capacitor line is provided between adjacent two pixels so that capacitors included in the pixels and the capacitor line are connected, whereby the number of capacitor lines can be reduced. As a result, the aperture ratio of the pixel can be high as compared with the case of a structure where each pixel is provided with a capacitor line. For example, in the semiconductor device of one embodiment of the present invention, the aperture ratio of the pixel can be 61.7% in the pixel layout illustrated in FIG. 20 with the size of one pixel of 28 μm (H)×84 μm (V) and the pixel density of 302 ppi.

Modification Example 7

Figure 21:
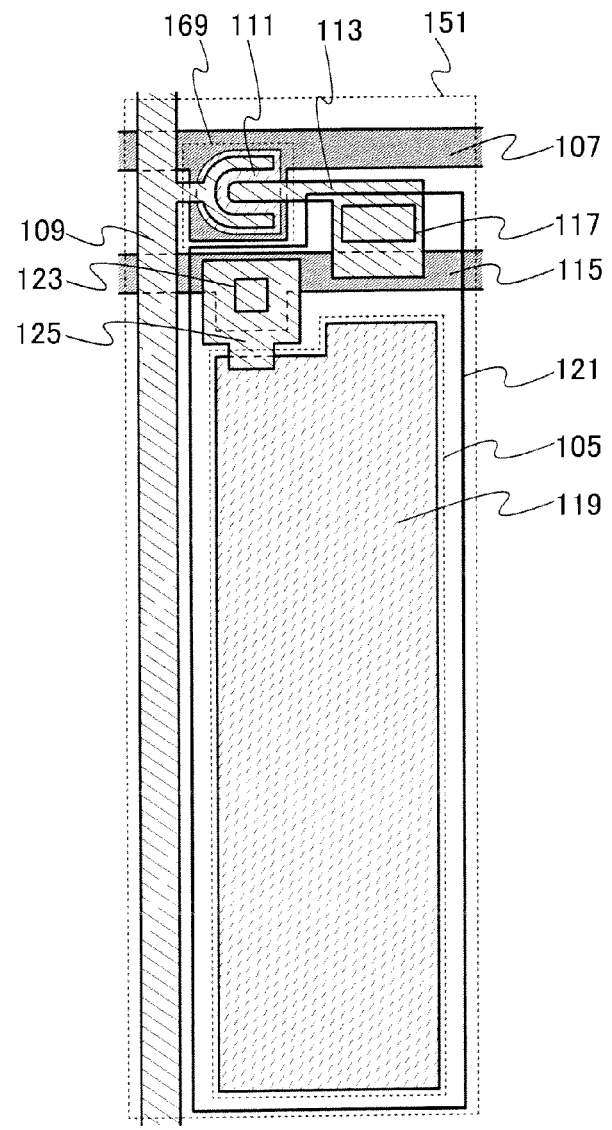
FIG. 21 is a top view illustrating a semiconductor device of one embodiment of the present invention.

In the above pixels 101, 141, 161, 171, 172, 196, 401_1, and 401_2, the shapes of the transistors provided in the pixels are not limited to the shapes of the transistors illustrated in FIG. 3 and FIG. 4 and can be changed as appropriate. For example, in a pixel 151, a transistor 169 may be as follows: a source electrode 109a (not illustrated) included in the signal line 109 has a U shape (or a C shape, a square-bracket-like shape, or a horseshoe shape), which partly surrounds (see FIG. 21) the conductive film 113 serving as a drain electrode 113a (not illustrated). With such a shape, an enough channel width can be ensured even when the area of the transistor is small, and accordingly, the amount of on-state current of the transistor can be increased. The structure of the pixel 151 in FIG. 21 is similar to that in FIG. 3, except for the transistor 169.

Modification Example 8

Figure 22:
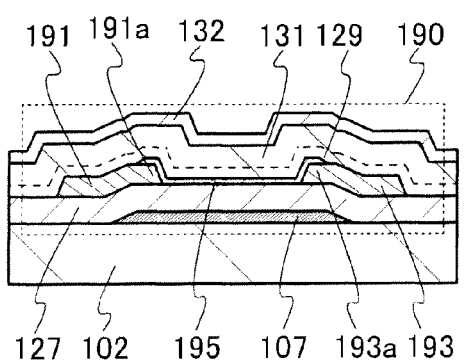
FIG. 22 is a cross-sectional view illustrating a transistor that can be used for a semiconductor device of one embodiment of the present invention.

As the transistor in each of the above pixels 101, 141, 161, 171, 172, 196, 4011, and 4012, a transistor in which an oxide semiconductor film is formed between a gate insulating film, and a signal line including a source electrode and a conductive film serving as a drain electrode is used. As illustrated in FIG. 22, as such a transistor, a transistor 190 in which an oxide semiconductor film 195 is formed between the insulating film 129, and a signal line 191 including a source electrode 191a and a conductive film 193 serving as a drain electrode 193a can be used. The structure in FIG. 22 is the same as that in FIG. 4 except for the position of the oxide semiconductor film 195.

In the transistor 190 illustrated in FIG. 22, the signal line 191 and the conductive film 193 are formed and then the oxide semiconductor film 195 is formed. Thus, a surface of the oxide semiconductor film 195 is not exposed to an etchant or an etching gas used in a formation process of the signal line 191 and the conductive film 193, so that impurities between the oxide semiconductor film 195 and the insulating film 129 can be reduced. Accordingly, a leakage current flowing between the source electrode 191a and the drain electrode 193a of the transistor 190 can be reduced.

Modification Example 9

Figure 23:
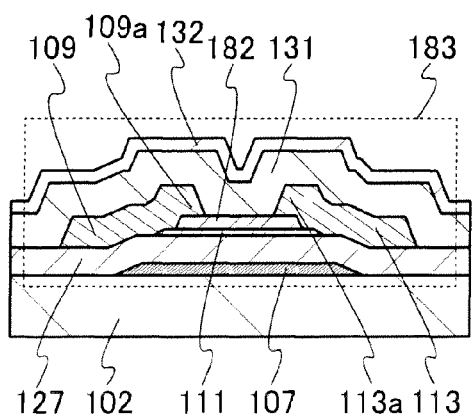
FIG. 23 is a cross-sectional view illustrating a transistor that can be used for a semiconductor device of one embodiment of the present invention.

In the above pixels 101, 141, 161, 171, 172, 196, 401_1, and 401_2, a channel-etched transistor is used as the transistor. Instead of the transistor, a channel protective transistor 183 can be used as illustrated in FIG. 23. The structure in FIG. 23 is the same as that in FIG. 4 except that a channel protective film 182 is provided between the oxide semiconductor film 111, and the signal line 109 including the source electrode 109a and the conductive film 113 serving as the drain electrode 113a.

In the channel protective transistor 183 in FIG. 23, the channel protective film 182 is formed over the oxide semiconductor film 111 and then the signal line 109 and the conductive film 113 are formed. The channel protective film 182 can be formed using the material of the insulating film 129 of the transistor 103, in which case it is not necessary to additionally provide an insulating film corresponding to the insulating film 129 of the transistor 103 in the channel protective transistor 183. Therefore, a surface of the oxide semiconductor film 111 is not exposed to an etchant or an etching gas used in a formation process of the signal line 191 and the conductive film 193, so that impurities between the oxide semiconductor film 111 and the channel protective film 182 can be reduced. Accordingly, a leakage current flowing between the source electrode 109a and the drain electrode 113a of the channel protective transistor 183 can be reduced. Further, it is possible to suppress, with the channel protective film 182, damage to the oxide semiconductor film 111 (in particular, the channel formation region), which is caused by processing performed at the formation of the signal line 109 and the conductive film 113.

Modification Example 10

Figure 24:
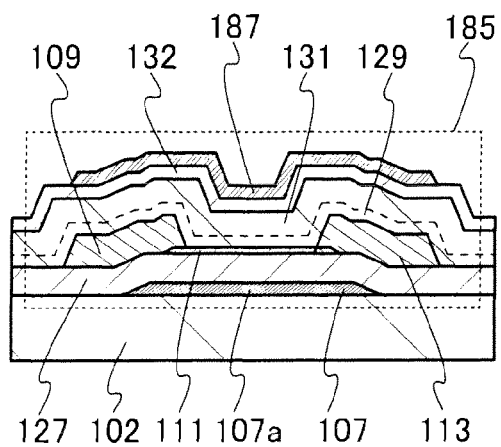
FIG. 24 is a cross-sectional view illustrating a transistor that can be used for a semiconductor device of one embodiment of the present invention.

As the transistor in each of the above pixels 101, 141, 161, 171, 172, 196, 401_1, and 401_2, a transistor including one gate electrode is shown. Alternatively, instead of such a transistor, a transistor 185 including a conductive film 187 which faces the gate electrode included in the scan line 107 with the oxide semiconductor film 111 provided therebetween can be used as illustrated in FIG. 24.

The transistor 185 is a dual gate transistor which is a transistor in which the conductive film 187 is formed over the insulating film 132 included in any of the transistors 103, 169, and 190 described in this embodiment. The conductive film 187 can be called a back-gate electrode. The conductive film 187 overlaps with at least a channel formation region of the oxide semiconductor film 111. By providing the conductive film 187 so as to overlap with the channel formation region of the oxide semiconductor film 111, the amount of change of the threshold voltage of the transistor 185 between before and after a reliability test (e.g., Bias Temperature (BT) stress test) can be further reduced. Further, the potential of the conductive film 187 is favorably a common potential, a GND potential, or an arbitrary potential. Alternatively, the conductive film 187 may be in a floating state. By controlling the potential of the conductive film 187, the threshold voltage of the transistor 185 can be controlled. Alternatively, the gate electrode 107a and the conductive film 187 may be electrically connected to each other so as to have the same potential. Further, when the conductive film 187 is provided, an influence of a change in ambient electric field on the oxide semiconductor film 111 can be reduced, leading to an improvement in reliability of the transistor.

The conductive film 187 can be formed using a material and a method similar to those of the scan line 107, the signal line 109, the pixel electrode 121, or the like.

As described above, in a semiconductor device including a driver circuit, the operation speed of the driver circuit can be increased while power consumption can be reduced in such a manner that a dual-gate transistor is used as a transistor included in the driver circuit and a back-gate electrode of the dual-gate transistor is electrically connected to a capacitor line electrically connected to a capacitor; accordingly, a semiconductor device having excellent display quality can be obtained.

In addition, the use of the semiconductor film formed in the same formation process as the semiconductor film (specifically, the oxide semiconductor film) of the transistor, for one electrode of the capacitor, allows fabrication of a semiconductor device including the capacitor whose charge capacity is increased while the aperture ratio is improved. As a result, the semiconductor device can have an excellent display quality.

Further, oxygen vacancies and impurities such as hydrogen and nitrogen in the semiconductor film (specifically, the oxide semiconductor film) of the transistor are reduced, so that the semiconductor device of one embodiment of the present invention has favorable electrical characteristics.

Note that the structure and the like described in this embodiment can be used as appropriate in combination with any of the structures and the like in the other embodiments.

Embodiment 2

In this embodiment, a semiconductor device of one embodiment of the present invention, which has a structure different from those described in the above embodiment, will be described with reference to drawings. Note that in this embodiment, a liquid crystal display device is described as an example of the semiconductor device of one embodiment of the present invention. In the semiconductor device described in this embodiment, the structure of a capacitor is different from that of the capacitor in the above embodiment. The above embodiment can be referred to for components in the semiconductor device in this embodiment, which are similar to those of the semiconductor device in the above embodiment.

<Structure of Semiconductor Device>

Figure 25:
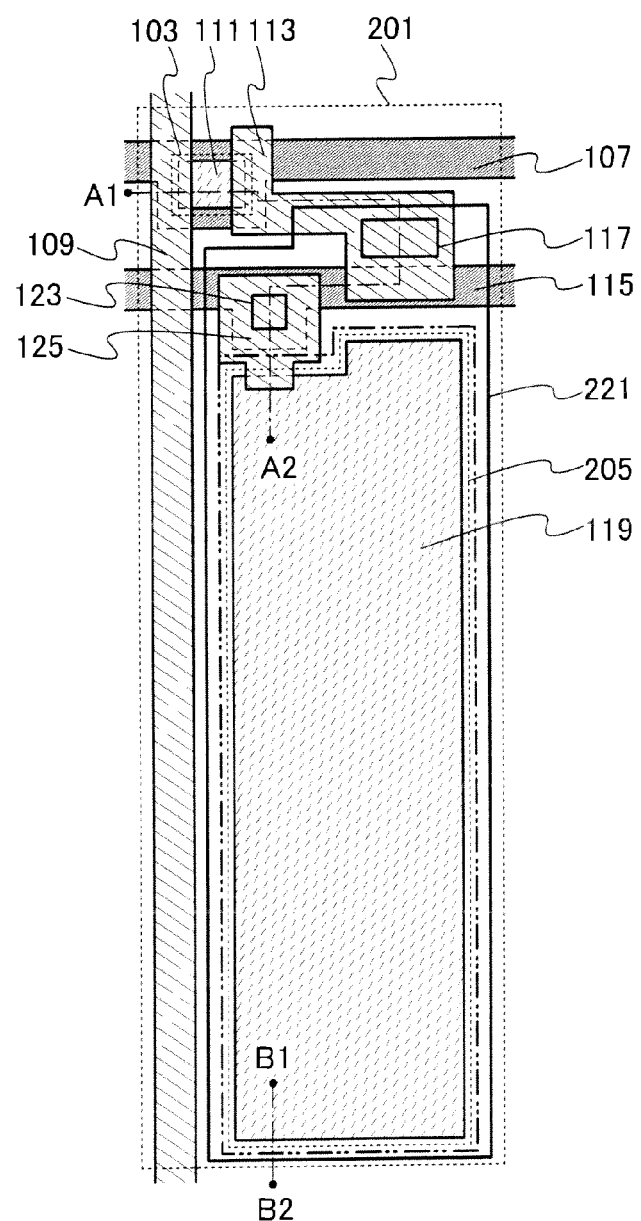
FIG. 25 is a top view illustrating a semiconductor device of one embodiment of the present invention.

FIG. 25 is a top view of a pixel 201 in this embodiment. The pixel 201 illustrated in FIG. 25 is different from the pixel 101 illustrated in FIG. 3 in that an insulating film 229 and an insulating film 231 which are not illustrated are not provided in a region indicated by an alternate long and tow short dashed line. Thus, a capacitor 205 in the pixel 201 in FIG. 25 includes the oxide semiconductor film 119 serving as one electrode, a pixel electrode 221 serving as the other electrode, and an insulating film 232 (not illustrated) serving as a dielectric film.

Figure 26:
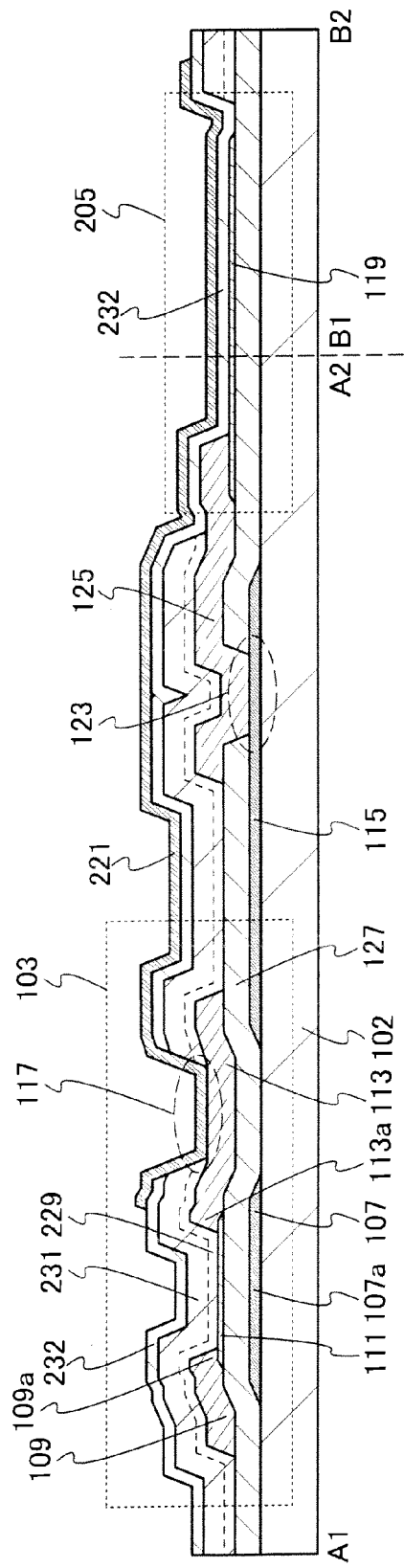
FIG. 26 is a cross-sectional view illustrating a semiconductor device of one embodiment of the present invention.

Next, FIG. 26 is a cross-sectional view taken along dashed-dotted line A1-A2 and dashed-dotted line B1-B2 in FIG. 25.

The cross-sectional structure of the pixel 201 of this embodiment is as follows. Over the substrate 102, the scan line 107 including the gate electrode 107a and the capacitor line 115 which is on the same surface as the scan line 107 are provided. The gate insulating film 127 is provided over the scan line 107 and the capacitor line 115. The oxide semiconductor film 111 is provided over a region of the gate insulating film 127, which overlaps with the scan line 107, and the oxide semiconductor film 119 is provided over the gate insulating film 127. The signal line 109 including the source electrode 109a and the conductive film 113 serving as the drain electrode 113a are provided over the oxide semiconductor film 111 and the gate insulating film 127. The opening 123 reaching the capacitor line 115 is provided in the gate insulating film 127, and the conductive film 125 is provided in and over the opening 123 and over the gate insulating film 127 and the oxide semiconductor film 119. The insulating films 229, 231, and 232 which each serve as a protective insulating film of the transistor 103 is provided over the gate insulating film 127, the signal line 109, the oxide semiconductor film 111, the conductive film 113, the conductive film 125, and the oxide semiconductor film 119. The opening 117 reaching the conductive film 113 is provided in the insulating films 229, 231, and 232, and the pixel electrode 221 is provided in and over the opening 117 and over the insulating film 232. Note that a base insulating film may be provided between the substrate 102, and the scan line 107, the capacitor line 115, and the gate insulating film 127.

The insulating film 229 is similar to the insulating film 129 described in Embodiment 1. The insulating film 231 is similar to the insulating film 131 described in Embodiment 1. The insulating film 232 is similar to the insulating film 132 described in Embodiment 1. The pixel electrode 221 is similar to the pixel electrode 121 described in Embodiment 1.

When the insulating film 232 serves as a dielectric film between the oxide semiconductor film 119 serving as one electrode and the pixel electrode 221 serving as the other electrode as in the capacitor 205 in this embodiment, the thickness of the dielectric film can be thinner than that of the dielectric film of the capacitor 105 in Embodiment 1. Thus, the capacitor 205 in this embodiment can have larger charge capacity than the capacitor 105 in Embodiment 1.

The insulating film 232 is preferably a nitride insulating film which is similar to the insulating film 132 in Embodiment 1. The insulating film 232 is in contact with the oxide semiconductor film 119, so that nitrogen and/or hydrogen contained in the nitride insulating film can be transferred to the oxide semiconductor film 119 and thus the oxide semiconductor film 119 can have a higher conductivity. Further, when the insulating film 232 is formed using a nitride insulating film and is subjected to heat treatment while it is in contact with the oxide semiconductor film 119, nitrogen and/or hydrogen contained in the nitride insulating film can be transferred to the oxide semiconductor film 119. Accordingly, the oxide semiconductor film 119 becomes an n-type oxide semiconductor film with increased conductivity. The conductivity of the oxide semiconductor film 119 is higher than that of the oxide semiconductor film 111; thus, it can be said that the oxide semiconductor film 119 is a film having conductivity.

As described above, in the semiconductor device of this embodiment, the oxide semiconductor film 119 includes a region having a higher conductivity than the oxide semiconductor film 111. At least a region of the oxide semiconductor film 119, which is in contact with the insulating film 232, has a higher conductivity than a region of the oxide semiconductor film 111, which is in contact with the insulating film 229.

Note that it is preferable that the oxide semiconductor film 119 have a higher hydrogen concentration than the oxide semiconductor film 111. In the oxide semiconductor film 119, the hydrogen concentration measured by secondary ion mass spectrometry (SIMS) is greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$. In the oxide semiconductor film 111, the hydrogen concentration measured by SIMS is less than $5\times10^{19}$ atoms/cm$^3$, preferably less than $5\times10^{18}$ atoms/cm$^3$, more preferably less than or equal to $1\times10^{18}$ atoms/cm$^3$, still more preferably less than or equal to $5\times10^{17}$ atoms/cm$^3$, further preferably less than or equal to $1\times10^{16}$ atoms/cm$^3$.

The resistivity of the oxide semiconductor film 119 is lower than that of the oxide semiconductor film 111. The resistivity of the oxide semiconductor film 119 is preferably greater than or equal to $1\times10^{-8}$ times and less than or equal to $1\times10^{-1}$ times the resistivity of the oxide semiconductor film 111. The resistivity of the oxide semiconductor film 119 is typically greater than or equal to $1\times10^{-3}$ Ωcm and less than $1\times10^{4}$ Ωcm, preferably greater than or equal to $1\times10^{-3}$ Ωcm and less than $1\times10^{-1}$ Ωcm.

<Fabrication Method of Semiconductor Device>

Next, a fabrication method of a semiconductor device of this embodiment is described with reference to FIGS. 27A and 27B and FIGS. 28A and 28B.

First, the scan line 107 including the gate electrode 107a and the capacitor line 115 are formed over the substrate 102. An insulating film which will be processed into the gate insulating film 127 is formed over the substrate 102, the scan line 107, and the capacitor line 115. The oxide semiconductor film 111 and the oxide semiconductor film 119 are formed over the insulating film. The opening 123 reaching the capacitor line 115 is formed in the insulating film to form the gate insulating film 127 and then the signal line 109 including the source electrode 109a, the conductive film 113, and the conductive film 125 are formed. The insulating film 128 is formed over the gate insulating film 127, the signal line 109, the conductive film 113, the conductive film 125, and the oxide semiconductor film 119. The insulating film 130 is formed over the insulating film 128 (see FIG. 27A). Note that the above steps can be performed with reference to Embodiment 1.

Next, a mask is formed over a region of the insulating film 130, which overlaps with at least the oxide semiconductor film 119. Processing is performed to form an insulating film 228 and an insulating film 230 with the use of the mask and expose the oxide semiconductor film 119. An insulating film 233 is formed over the exposed region and the insulating film 130 (see FIG. 27B). As the mask, a resist mask formed through a photolithography process can be used, and the processing can be performed by one or both of dry etching and wet etching. The insulating film 233 is similar to the insulating film 133 described in Embodiment 1. Note that heat treatment may be performed while the insulating film 233 is in contact with the oxide semiconductor film 119, for example, after formation of the insulating film 233. The above steps can be performed with reference to Embodiment 1.

When the insulating film 233 is formed using a nitride insulating film by a plasma CVD method or a sputtering method, the oxide semiconductor film 119 is exposed to plasma and oxygen vacancies are generated in the oxide semiconductor film 119. Moreover, when the oxide semiconductor film 119 is in contact with the insulating film 233 formed using a nitride insulating film, nitrogen and/or hydrogen are/is transferred from the insulating film 233 to the oxide semiconductor film 119. Due to entry of hydrogen contained in the insulating film 233 into an oxygen vacancy, an electron serving as a carrier is generated. Alternatively, when the insulating film 232 is formed using a nitride insulating film and is subjected to heat treatment while it is in contact with the oxide semiconductor film 119, nitrogen and/or hydrogen contained in the nitride insulating film can be transferred to the oxide semiconductor film 119. Accordingly, the oxide semiconductor film 119 has increased conductivity to be n-type. Further, the oxide semiconductor film 119 becomes a light-transmitting conductive film which includes a metal oxide film having conductor characteristics. Note that the conductivity of the oxide semiconductor film 119 is higher than that of the oxide semiconductor film 111.

Next, the opening 117 reaching the conductive film 113 is formed in the insulating films 228, 230, and 233 to form the insulating films 229, 231, and 232 (see FIG. 28A). Then, the pixel electrode 221 in contact with the conductive film 113 through the opening 117 is formed (see FIG. 28B). The above steps can be performed with reference to Embodiment 1.

Through the above process, the semiconductor device in this embodiment can be fabricated.

Modification Example

In the semiconductor device of one embodiment of the present invention, the structure of the capacitor can be changed as appropriate. A specific example of the structure is described with reference to FIG. 29. Here, only a capacitor 245 which is different from the capacitor 205 described with reference to FIG. 3 and FIG. 4 is described.

Figure 29:
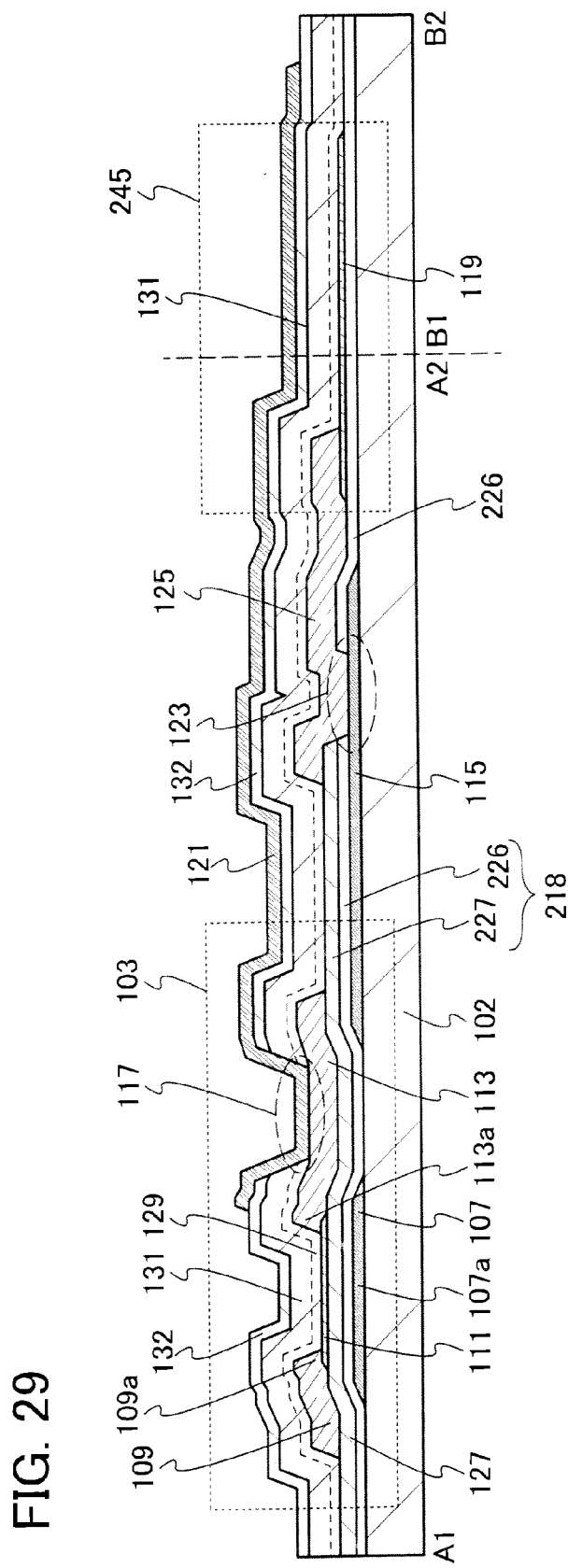
FIG. 29 is a cross-sectional view illustrating a semiconductor device of one embodiment of the present invention.

A gate insulating film 218 has a stacked-layer structure of an insulating film 226 formed using a nitride insulating film and an insulating film 227 formed using an oxide insulating film and only the insulating film 226 is provided in a region where at least the oxide semiconductor film 119 is provided. With such a structure, the nitride insulating film for forming the insulating film 226 is in contact with the bottom surface of the oxide semiconductor film 119, so that the oxide semiconductor film 119 can have a higher conductivity (see FIG. 29). FIG. 29 is a cross-sectional view, and FIG. 3 can be referred to for the top view corresponding to FIG. 29. In this case, a dielectric film of the capacitor 105 is the insulating films 129, 131, and 132. As the insulating films 226 and 227, the insulating films which can be used as the gate insulating film 127 can be used as appropriate, and the insulating film 227 may be formed using an insulating film similar to the insulating film 132. Further, to obtain this structure, the insulating film 227 is processed as appropriate with reference to Embodiment 1.

In the structure illustrated in FIG. 29, the top surface of the oxide semiconductor film 119 may be in contact with the insulating film 132. That is, regions of the insulating films 129 and 131 in FIG. 29, which are in contact with the oxide semiconductor film 119, may be removed. In that case, a dielectric film of the capacitor 105 is the insulating film 132. When the top and bottom surfaces of the oxide semiconductor film 119 are in contact with the nitride insulating film, the oxide semiconductor film 119 can have a higher conductivity more efficiently and sufficiently than the oxide semiconductor film 119 which is in contact with only one of surfaces of the nitride insulating film.

As described above, according to one embodiment of the present invention, in a semiconductor device including a driver circuit, the operation speed of the driver circuit can be increased while power consumption can be reduced in such a manner that a dual-gate transistor is used as a transistor included in the driver circuit and a back-gate electrode of the dual-gate transistor is electrically connected to a capacitor line electrically connected to a capacitor; accordingly, a semiconductor device having excellent display quality can be obtained.

In addition, the use of the semiconductor film formed in the same formation process as the semiconductor film (specifically, the oxide semiconductor film) of the transistor, for one electrode of the capacitor, allows fabrication of a semiconductor device including the capacitor whose charge capacity is increased while the aperture ratio is improved. Further, the semiconductor device can have an excellent display quality by improving the aperture ratio.

Further, oxygen vacancies and impurities such as hydrogen and nitrogen in the semiconductor film (specifically, the oxide semiconductor film) of the transistor are reduced, so that the semiconductor device of one embodiment of the present invention has favorable electrical characteristics.

Note that the structure and the like described in this embodiment can be used as appropriate in combination with any of the structures and the modification examples in the other embodiments.

Embodiment 3

In this embodiment, a semiconductor device of one embodiment of the present invention, which has a structure different from those described in the above embodiment, will be described with reference to drawings. Note that in this embodiment, a liquid crystal display device is described as an example of the semiconductor device of one embodiment of the present invention. In the semiconductor device described in this embodiment, the structure of a capacitor is different from that of the capacitor in the above embodiment. The above embodiment can be referred to for components in the semiconductor device in this embodiment, which are similar to those of the semiconductor device in the above embodiment.

<Structure of Semiconductor Device>

Figure 30:
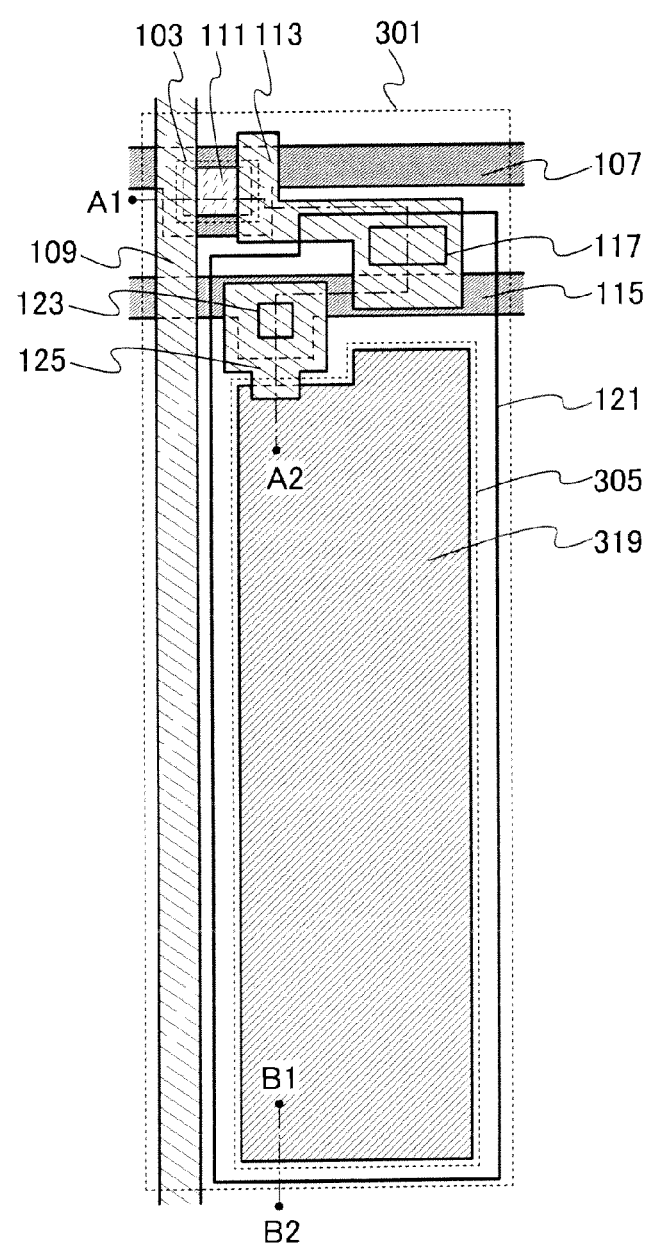
FIG. 30 is a top view illustrating a semiconductor device of one embodiment of the present invention.

Next, a specific example of the structure of a pixel 301 provided in a pixel portion of the liquid crystal display device described in this embodiment is described. FIG. 30 is a top view of the pixel 301. The pixel 301 illustrated in FIG. 30 includes the capacitor 305, and the capacitor 305 is provided in a region of the pixel 301, which is surrounded by the capacitor line 115 and the signal line 109. The capacitor 305 is electrically connected to the capacitor line 115 through the conductive film 125 provided in and over the opening 123. The capacitor 305 includes an oxide semiconductor film 319 which has a higher conductivity than the oxide semiconductor film 111 and has a light-transmitting property, the light-transmitting pixel electrode 121, and, as a dielectric film, the light-transmitting insulating films (not illustrated in FIG. 30) which are included in the transistor 103. That is, the capacitor 305 transmits light.

The conductivity of the oxide semiconductor film 319 is higher than or equal to 10 S/cm and lower than or equal to 1000 S/cm, preferably higher than or equal to 100 S/cm and lower than or equal to 1000 S/cm.

The oxide semiconductor film 319 has such a high conductivity and thus can sufficiently serve as the electrode of the capacitor. That is, the capacitor 305 can be formed large (in a large area) in the pixel 301. For this reason, the semiconductor device can have charge capacity increased while the aperture ratio is improved. As a result, the semiconductor device can have an excellent display quality.

Figure 31:
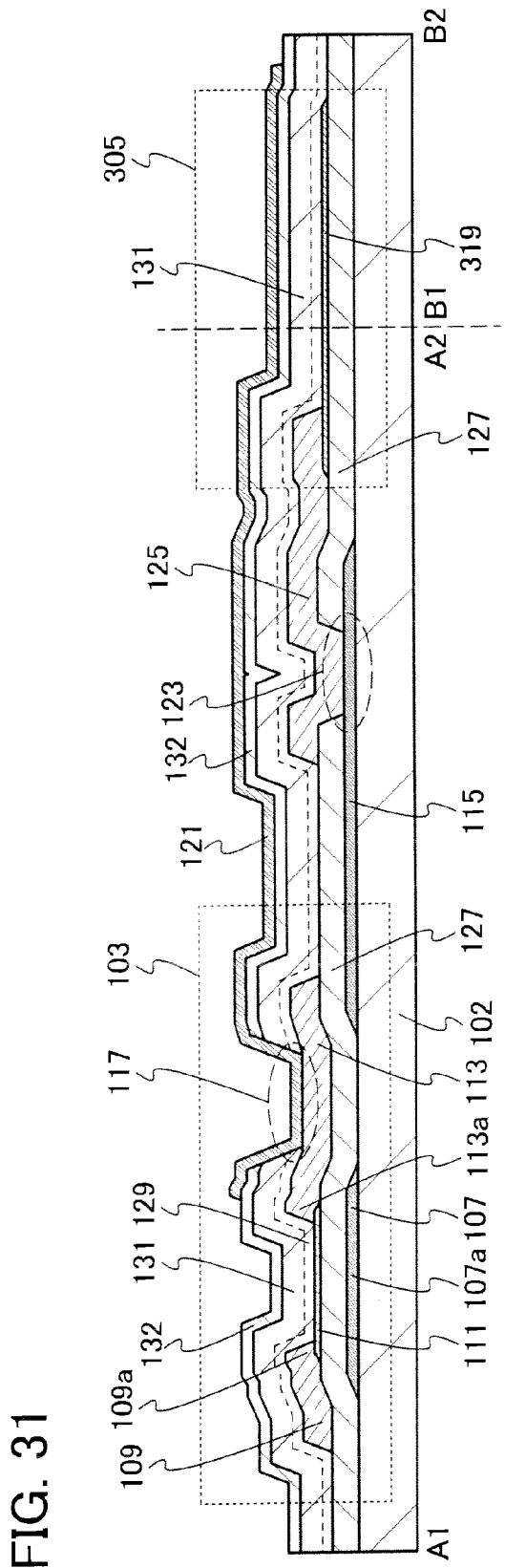
FIG. 31 is a cross-sectional view illustrating a semiconductor device of one embodiment of the present invention.

Next, FIG. 31 is a cross-sectional view taken along dashed-dotted line A1-A2 and dashed-dotted line B1-B2 in FIG. 30.

The cross-sectional structure of the pixel 301 is as follows. Over the substrate 102, the scan line 107 including the gate electrode 107a is provided. The gate insulating film 127 is provided over the scan line 107. The oxide semiconductor film 111 is provided over a region of the gate insulating film 127, which overlaps with the scan line 107, and the oxide semiconductor film 319 is provided over another region of the gate insulating film 127. The signal line 109 including the source electrode 109a and the conductive film 113 serving as the drain electrode 113a are provided over the oxide semiconductor film 111 and the gate insulating film 127. In addition, the capacitor line 115 is provided over the gate insulating film 127 and the oxide semiconductor film 319. The insulating films 129, 131, and 132 which each serve as a protective insulating film of the transistor 103 is provided over the gate insulating film 127, the signal line 109, the oxide semiconductor film 111, the conductive film 113, the oxide semiconductor film 319, and the capacitor line 115. The opening 117 reaching the conductive film 113 is provided in the insulating films 129, 131, and 132, and the pixel electrode 121 is provided in and over the opening 117 and over the insulating film 132. Note that a base insulating film may be provided between the substrate 102, and the scan line 107 and the gate insulating film 127.

In the capacitor 305 in this example, the oxide semiconductor film 319 which has a higher conductivity than the oxide semiconductor film 111 serves as one of a pair of electrodes, the pixel electrode 121 serves as the other of the pair of electrodes, and the insulating films 129, 131, and 132 serve as a dielectric film provided between the pair of electrodes.

For the oxide semiconductor film 319, an oxide semiconductor that can be used for the oxide semiconductor film 111 can be used. The oxide semiconductor film 319 can be formed concurrently with the oxide semiconductor film 111 and thus contains a metal element of an oxide semiconductor included in the oxide semiconductor film 111. Further, the oxide semiconductor film 319 preferably has a higher conductivity than the oxide semiconductor film 111 and thus preferably contains an element (dopant) which increases the conductivity. Specifically, the oxide semiconductor film 319 contains one or more selected from boron, nitrogen, fluorine, aluminum, phosphorus, arsenic, indium, tin, antimony, and a rare gas element as the dopant. The concentration of a dopant contained in the oxide semiconductor film 319 is preferably greater than or equal to $1 \times 10^{19}$ atoms/cm$^3$ and less than or equal to $1 \times 10^{22}$ atoms/cm$^3$, in which case the conductivity of the oxide semiconductor film 319 can be greater than or equal to 10 S/cm and less than or equal to 1000 S/cm, preferably greater than or equal to 100 S/cm and less than or equal to 1000 S/cm, so that the oxide semiconductor film 319 can sufficiently serve as one electrode of the capacitor 305. The oxide semiconductor film 319 has a region with a higher conductivity than that of the oxide semiconductor film 111. In this embodiment, at least a region of the oxide semiconductor film 319, which is in contact with the insulating film 132, has a higher conductivity than a region of the oxide semiconductor film 111, which is in contact with the insulating film 129. Further, the oxide semiconductor film 319 is n-type and has a high conductivity because of including the above element (dopant); therefore, the oxide semiconductor film 319 can be called a conductive film.

<Fabrication Method of Semiconductor Device>

Next, a fabrication method of a semiconductor device of this embodiment is described with reference to FIGS. 32A and 32B and FIGS. 33A and 33B.

First, the scan line 107 including the gate electrode 107a and the capacitor line 115 are formed over the substrate 102. An insulating film which will be processed into the gate insulating film 127 is formed over the substrate 102, the scan line 107, and the capacitor line. The oxide semiconductor film 111 and the oxide semiconductor film 119 are formed over the insulating film (see FIG. 32A). Note that the above steps can be performed with reference to Embodiment 1.

Next, a dopant is added to the oxide semiconductor film 119 to form the oxide semiconductor film 319, the opening 123 reaching the capacitor line 115 is formed in the insulating film 126 to form the gate insulating film 127, and then the signal line 109 including the source electrode 109a, the conductive film 113 serving as the drain electrode 113a, and the conductive film 125 which electrically connects the oxide semiconductor film 319 and the capacitor line 115 are formed (see FIG. 32B).

A method of adding a dopant to the oxide semiconductor film 119 is as follows: a mask is provided in a region except the oxide semiconductor film 119 and one or more dopants selected from boron, nitrogen, fluorine, aluminum, phosphorus, arsenic, indium, tin, antimony, and a rare gas element is added to the oxide semiconductor film 119 by an ion implantation method, an ion doping method, or the like. Alternatively, the oxide semiconductor film 119 may be exposed to plasma containing the dopant to add the dopant to the oxide semiconductor film 119, instead of employing an ion implantation method or an ion doping method. Note that heat treatment may be performed after the dopant is added to the oxide semiconductor film 119. The heat treatment can be performed as appropriate with reference to the details of the heat treatment for dehydration or dehydrogenation of the oxide semiconductor film 111 and the oxide semiconductor film 119 in Embodiment 1.

The step of adding the dopant may be performed after formation of the signal line 109, the conductive film 113, and the conductive film 125, in which case the dopant is not added to regions of the oxide semiconductor film 319, which are in contact with the signal line 109, the conductive film 113, and the conductive film 125.

Next, the insulating film 128 is formed over the gate insulating film 127, the signal line 109, the oxide semiconductor film 111, the conductive film 113, the conductive film 125, and the oxide semiconductor film 319. The insulating film 130 is formed over the insulating film 128, and the insulating film 133 is formed over the insulating film 130 (see FIG. 33A). The above steps can be performed with reference to Embodiment 1.

Next, the opening 117 reaching the conductive film 113 is formed in the insulating films 128, 130, and 133 to form the insulating films 129, 131, and 132 (see FIG. 33B). The pixel electrode 121 in contact with the conductive film 113 through the opening 117 is formed (see FIG. 31). The above steps can be performed with reference to Embodiment 1.

Through the above process, the semiconductor device in this embodiment can be fabricated.

As described above, according to one embodiment of the present invention, in a semiconductor device including a driver circuit, the operation speed of the driver circuit can be increased while power consumption can be reduced in such a manner that a dual-gate transistor is used as a transistor included in the driver circuit and a back-gate electrode of the dual-gate transistor is electrically connected to a capacitor line electrically connected to a capacitor; accordingly, a semiconductor device having excellent display quality can be obtained.

In addition, the use of the semiconductor film formed in the same formation process as the semiconductor film (specifically, the oxide semiconductor film) of the transistor, for one electrode of the capacitor, allows fabrication of a semiconductor device including the capacitor whose charge capacity is increased while the aperture ratio is improved. Further, the semiconductor device can have an excellent display quality by improving the aperture ratio.

Further, oxygen vacancies and impurities such as hydrogen and nitrogen in the semiconductor film (specifically, the oxide semiconductor film) of the transistor are reduced, so that the semiconductor device of one embodiment of the present invention has favorable electrical characteristics.

Note that the structure and the like described in this embodiment can be used as appropriate in combination with any of the structures and the like in the other embodiments.

Embodiment 4

In this embodiment, one embodiment which can be applied to an oxide semiconductor film, which is a semiconductor film, in the transistor and the capacitor included in the semiconductor device described in the above embodiment will be described.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around $56°$. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around $56°$.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the x-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around $36°$, in addition to the peak of $2\theta$ at around $31°$. The peak of $2\theta$ at around $36°$ indicates that a crystal having no c-axis alignment is included in part of the CAAC-OS film. It is preferable that in the CAAC-OS film, a peak of $2\theta$ appears at around $31°$ and a peak of $2\theta$ do not appear at around $36°$.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, the oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small change in electrical characteristics and high reliability. Electric charge trapped by the carrier traps in the oxide semiconductor film takes a long time to be released, and might behave like fixed electric charge. Thus, the transistor including the oxide semiconductor film having high impurity concentration and a high density of defect states has unstable electrical characteristics in some cases.

In a transistor using the CAAC-OS film, change in the electrical characteristics of the transistor due to irradiation with visible light or ultraviolet light is small.

Next, a microcrystalline oxide semiconductor film is described.

In a TEM image of the microcrystalline oxide semiconductor film, crystal parts sometimes cannot be found clearly. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a TEM image, a crystal grain cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter (e.g., larger than or equal to 50 nm) larger than that of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

For example, there are three methods for forming a CAAC-OS film.

The first method is to form an oxide semiconductor film at a temperature higher than or equal to 100° C. and lower than or equal to 450° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The second method is to form an oxide semiconductor film with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the oxide semiconductor film.

In a transistor using the CAAC-OS film for an oxide semiconductor film, change in the electrical characteristics of the transistor due to irradiation with visible light or ultraviolet light is small. Thus, the transistor using the CAAC-OS film as the oxide semiconductor film has high reliability.

For example, it is preferable that the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a surface on which the CAAC-OS film is formed while maintaining its crystal state, whereby the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C. is used.

By increasing the heating temperature of the surface on which the CAAC-OS film is formed (e.g., the substrate heating temperature) during the deposition, migration of a sputtered particle is likely to occur after the sputtered particle reaches the surface on which the CAAC-OS film is formed.

Specifically, the temperature of the surface on which the CAAC-OS film is formed during the deposition is higher than or equal to 100° C. and lower than or equal to 740° C., preferably higher than or equal to 150° C. and lower than or equal to 500° C. By increasing the temperature of the surface on which the CAAC-OS film is formed during the deposition, when the flat-plate-like or pellet-like sputtered particle reaches the surface on which the CAAC-OS film is formed, migration occurs on the surface on which the CAAC-OS film is formed, so that a flat plane of the sputtered particle is attached to the surface on which the CAAC-OS film is formed.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The polycrystalline In—Ga—Zn-based metal oxide target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Further, the oxide semiconductor film may have a structure in which a plurality of oxide semiconductor films are stacked. For example, the oxide semiconductor film may have a stacked-layer structure of a first oxide semiconductor film and a second oxide semiconductor film which are formed using metal oxides with different atomic ratios. For example, the first oxide semiconductor film may be formed using one of an oxide containing two kinds of metals, an oxide containing three kinds of metals, and an oxide containing four kinds of metals, and the second oxide semiconductor film may be formed using one of the above which is different from the one used for the first oxide semiconductor film.

Alternatively, the oxide semiconductor film may have a two-layer structure of the first oxide semiconductor film and the second oxide semiconductor film, in which the constituent elements thereof are made the same and the atomic ratios of the constituent elements of the first oxide semiconductor film and the second oxide semiconductor film are made different. For example, the first oxide semiconductor film may contain In, Ga, and Zn at an atomic ratio of 3:1:2, and the second oxide semiconductor film may contain In, Ga, and Zn at an atomic ratio of 1:1:1. Alternatively, the first oxide semiconductor film may contain In, Ga, and Zn at an atomic ratio of 2:1:3, and the second oxide semiconductor film may contain In, Ga, and Zn at an atomic ratio of 1:3:2. Note that a proportion of each atom in the atomic ratio of the oxide semiconductor film varies within a range of ±20% as an error.

At this time, in one of the first oxide semiconductor film and the second oxide semiconductor film, which is closer to the gate electrode (on the channel side), the atomic ratio of In to Ga preferably satisfies the relation In≥Ga. In the other oxide semiconductor film, which is farther from the gate electrode (on the back channel side), the atomic ratio of In to Ga preferably satisfies the relation In≤Ga. With a stacked-layer structure of these oxide semiconductor films, a transistor having high field-effect mobility can be formed. On the other hand, the atomic ratio of In to Ga in the oxide semiconductor film closer to the gate electrode (the oxide semiconductor film on the channel side) satisfies the relation In<Ga and the atomic ratio of In to Ga in the oxide semiconductor film on the back channel side satisfies the relation In Ga, whereby the amount of change of the threshold voltage of a transistor due to change over time or a reliability test can be reduced.

The first oxide semiconductor film containing In, Ga, and Zn at an atomic ratio of 1:3:2 can be formed by a sputtering method using an oxide target with an atomic ratio of 1:3:2 under the conditions where the substrate temperature is room temperature and a sputtering gas is argon or a mixed gas of argon and oxygen. The second oxide semiconductor film containing In, Ga, and Zn at an atomic ratio of 3:1:2 can be formed by a sputtering method using an oxide target with an atomic ratio of 3:1:2 in a manner similar to that of the first oxide semiconductor film.

Further, the oxide semiconductor film may have a three-layer structure of a first oxide semiconductor film, a second oxide semiconductor film, and a third oxide semiconductor film, in which the constituent elements thereof are made the same and the atomic ratios of the constituent elements of the first oxide semiconductor film, the second oxide semiconductor film, and the third oxide semiconductor film are made different. The case where the oxide semiconductor film has a three-layer structure is described with reference to FIG. 34.

Figure 34:
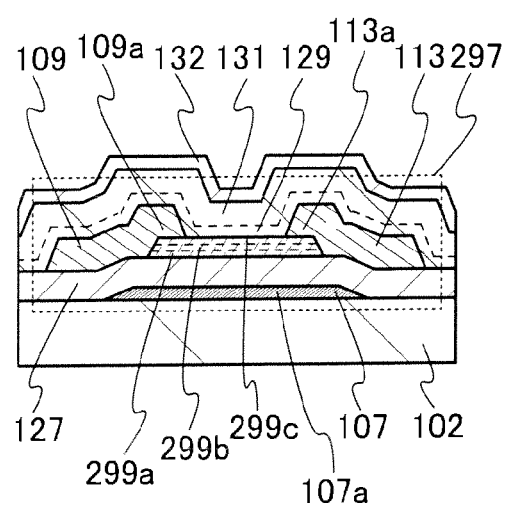
FIG. 34 is a cross-sectional view illustrating a transistor that can be used for a semiconductor device of one embodiment of the present invention.

In a transistor 297 illustrated in FIG. 34, a first oxide semiconductor film 299a, a second oxide semiconductor film 299b, and a third oxide semiconductor film 299c are stacked in this order from the gate insulating film 127 side. As a material of the first oxide semiconductor film 299a and the third oxide semiconductor film 299c, a material represented by $InM1_xZn_yO_z$ (x≥1, y>1, z>0, M1=Ga, Hf, or the like) is used. Note that in the case where a material of each of the first oxide semiconductor film 299a and the third oxide semiconductor film 299c contains Ga, a material containing a high proportion of Ga, specifically, a material which can be represented by $InM1_xZn_yO_z$ where x is larger than 10 is unsuitable because powder might be generated in deposition. Note that the structure of the transistor 297 is the same as those of the transistors described in the above embodiments (e.g., the transistor 103 in Embodiment 1) except that the first oxide semiconductor film 299a, the second oxide semiconductor film 299b, and the third oxide semiconductor film 299c are included.

As a material of the second oxide semiconductor film 299b, a material which can be represented by $InM2_xZn_yO_z$ (x≥1, y≥x, z>0, M2=Ga, Sn, or the like) is used.

Materials of the first oxide semiconductor film 299a, the second oxide semiconductor film 299b, and the third oxide semiconductor film 299c are selected as appropriate so that a well structure is formed in which the conduction band of the second oxide semiconductor film 299b is deeper from the vacuum level than the conduction bands of the first oxide semiconductor film 299a and the third oxide semiconductor film 299c.

As described in Embodiment 1, in the oxide semiconductor film, silicon or carbon, which belongs to Group 14, causes generation of an electron serving as a carrier, leading to an increase in carrier density. Therefore, silicon or carbon contained in an oxide semiconductor film makes it n-type. Thus, the concentration of silicon contained in oxide semiconductor films and the concentration of carbon contained in oxide semiconductor films are each less than or equal to $3 \times 10^{18}/cm^3$, preferably less than or equal to $3 \times 10^{17}/cm^3$. It is particularly preferable to employ a structure where the first oxide semiconductor film 299a and the third oxide semiconductor film 299c sandwich or surround the second oxide semiconductor film 299b serving as a carrier path so that a large number of Group 14 elements do not enter the second oxide semiconductor film 299b. That is, the first oxide semiconductor film 299a and the third oxide semiconductor film 299c can also be called barrier films which prevent Group 14 elements such as silicon and carbon from entering the second oxide semiconductor film 299b.

For example, the first oxide semiconductor film 299a may contain In, Ga, and Zn at an atomic ratio of 1:3:2, the second oxide semiconductor film 299b may contain In, Ga, and Zn at an atomic ratio of 3:1:2, and the third oxide semiconductor film 299c may contain In, Ga, and Zn at an atomic ratio of 1:1:1. Note that the third oxide semiconductor film 299c can be formed by a sputtering method using an oxide target containing In, Ga, and Zn at an atomic ratio of 1:1:1.

Alternatively, a three-later structure may be employed in which the first oxide semiconductor film 299a contains In, Ga, and Zn at an atomic ratio of 1:3:2, the second oxide semiconductor film 299b contains In, Ga, and Zn at an atomic ratio of 1:1:1 or 1:3:2, and the third oxide semiconductor film 299c contains In, Ga, and Zn at an atomic ratio of 1:3:2.

Since the constituent elements of the first oxide semiconductor film 299a, the second oxide semiconductor film 299b, and the third oxide semiconductor film 299c are the same, the second oxide semiconductor film 299b has fewer defect states (trap levels) at the interface with the first oxide semiconductor film 299a. Specifically, the defect states (trap levels) are fewer than those at the interface between the gate insulating film 127 and the first oxide semiconductor film 299a. For this reason, when the oxide semiconductor films are stacked in the above manner, the amount of change of the threshold voltage of a transistor due to change over time or a reliability test can be reduced.

Further, when materials of the first oxide semiconductor film 299a, the second oxide semiconductor film 299b, and the third oxide semiconductor film 299c are selected as appropriate so that a well structure is formed in which the conduction band of the second oxide semiconductor film 299b is deeper from the vacuum level than the conduction bands of the first oxide semiconductor film 299a and the third oxide semiconductor film 299c, the field-effect mobility of the transistor can be increased and the amount of change of the threshold voltage of the transistor due to change over time or a reliability test can be reduced.

Further, the first oxide semiconductor film 299a, the second oxide semiconductor film 299b, and the third oxide semiconductor film 299c may be formed using oxide semiconductors having different crystallinity. That is, the oxide semiconductor film may be formed using a combination of any of a single crystal oxide semiconductor, a polycrystalline oxide semiconductor, an amorphous oxide semiconductor, and a CAAC-OS, as appropriate. When an amorphous oxide semiconductor is applied to any one of the first oxide semiconductor film 299a, the second oxide semiconductor film 299b, and the third oxide semiconductor film 299c, internal stress or external stress of the oxide semiconductor film can be relieved, fluctuation in characteristics of the transistors can be reduced, and the amount of change of the threshold voltage of the transistor due to change over time or a reliability test can be reduced.

At least the second oxide semiconductor film 299b, which can serve as a channel formation region, is preferably a CAAC-OS film. An oxide semiconductor film on the back channel side, in this embodiment, the third oxide semiconductor film 299c is preferably an amorphous oxide semiconductor film or a CAAC-OS film. With such a structure, the amount of change of the threshold voltage of a transistor due to change over time or a reliability test can be reduced.

Note that the structure and the like described in this embodiment can be used as appropriate in combination with any of the structures and the like in the other embodiments.

Embodiment 5

A semiconductor device (also referred to as a display device) having a display function can be fabricated using the transistor and the capacitor examples of which are shown in the above embodiments. Moreover, some or all of driver circuits which include the transistor can be formed over a substrate where a pixel portion is formed, whereby a system-on-panel can be obtained. In this embodiment, an example of a display device using the transistor examples of which are shown in the above embodiments is described with reference to FIGS. 35A to 35C, FIGS. 36A and 36B, and FIGS. 37A to 37C. FIGS. 36A and 36B are cross-sectional views illustrating cross-sectional structures taken along dashed-dotted line M-N in FIG. 35B. Note that in FIGS. 36A and 36B, only part of the structure of a pixel portion is illustrated.

Figure 35A:
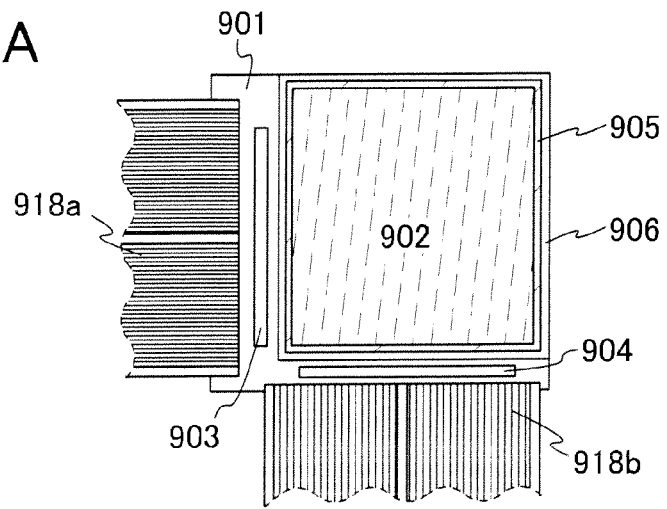
FIGS. 35A to 35C are top views each illustrating a semiconductor device of one embodiment of the present invention.
Figure 36A:
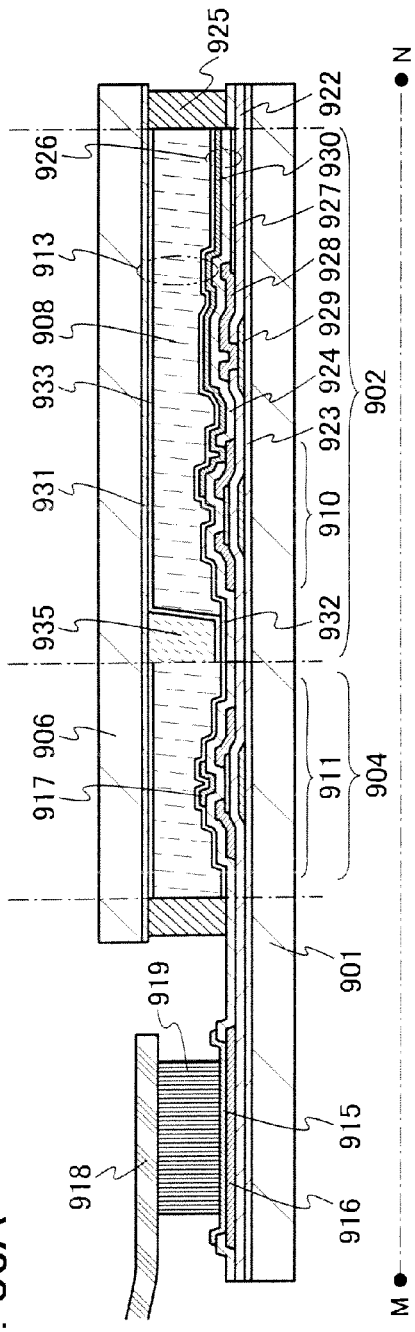
FIGS. 36A and 36B are cross-sectional views each illustrating a semiconductor device of one embodiment of the present invention.
Figure 36B:
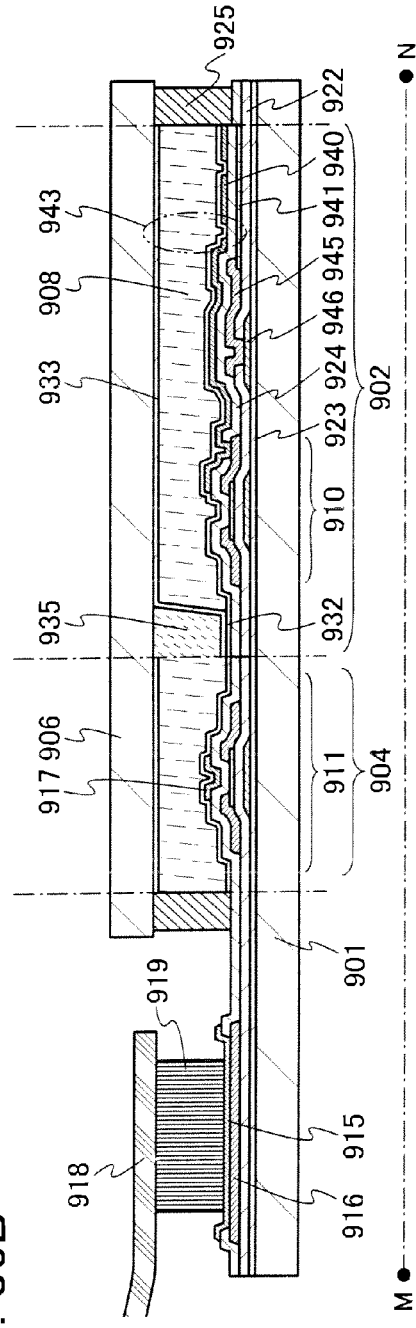

In FIG. 35A, a sealant 905 is provided so as to surround a pixel portion 902 provided over a first substrate 901, and the pixel portion 902 is sealed with a second substrate 906. In FIG. 35A, a signal line driver circuit 903 and a scan line driver circuit 904 are each formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918a and 918b.

Figure 35B:
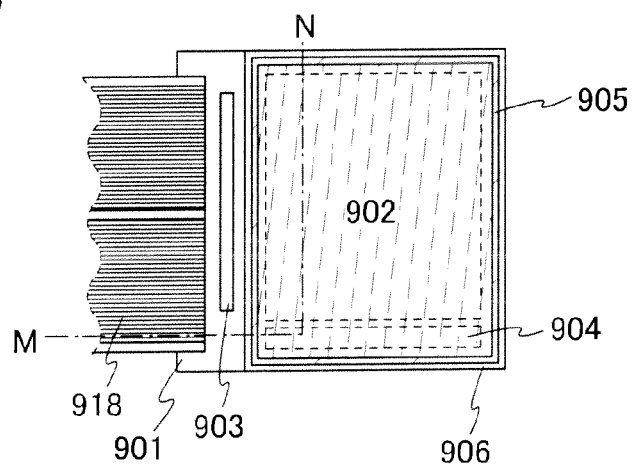
Figure 35C:
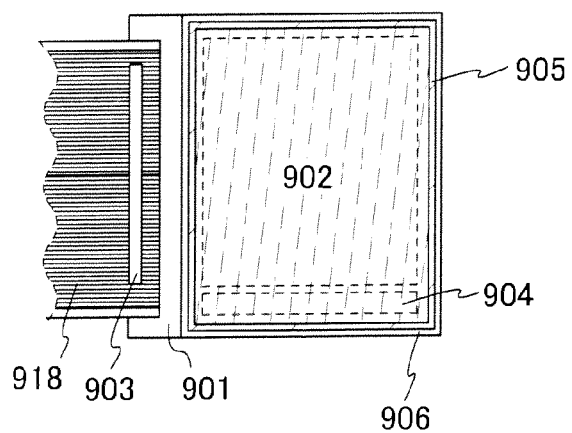

In FIGS. 35B and 35C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 35B and 35C, a signal line driver circuit 903 which is formed using a single crystal semiconductor or a polycrystalline semiconductor over a substrate separately prepared is mounted in a region different from the region surrounded by the sealant 905 over the first substrate 901. In FIGS. 35B and 35C, various signals and potentials are supplied to the signal line driver circuit 903, the scan line driver circuit 904, and the pixel portion 902 from an FPC 918.

Although FIGS. 35B and 35C each illustrate an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be employed. FIG. 35A illustrates an example in which the signal line driver circuit 903 and the scan line driver circuit 904 are mounted by a COG method. FIG. 35B illustrates an example in which the signal line driver circuit 903 is mounted by a COG method. FIG. 35C illustrates an example in which the signal line driver circuit 903 is mounted by a TAB method.

The display device includes in its category a panel in which a display element is sealed and a module in which an IC including a controller or the like is mounted on the panel.

A display device in this specification refers to an image display device, a display device, or a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be applied.

As the display element provided in the display device, a liquid crystal element (also referred to as a liquid crystal display element) or a light-emitting element (also referred to as a light-emitting display element) can be used. A light-emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used. An example of a liquid crystal display device using a liquid crystal element as the display element is illustrated in FIGS. 36A and 36B.

The liquid crystal display device illustrated in FIG. 36A is a liquid crystal display device of a vertical electric field mode. A liquid crystal display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a source electrode and a drain electrode of each of a transistor 910 and a transistor 911.

Each of the pixel portion 902 and the scan line driver circuit 904 which are provided over the first substrate 901 includes a plurality of transistors. FIGS. 36A and 36B illustrate the transistor 910 included in the pixel portion 902 and the transistor 911 included in the scan line driver circuit 904. An insulating film 924 corresponding to the insulating films 129, 131, and 132 described in Embodiment 1 is provided over the transistors 910 and 911. Note that an insulating film 923 is an insulating film serving as a base film.

In this embodiment, any of the transistors described in the above embodiments can be applied to the transistors 910 and 911. A capacitor 926 is formed using an oxide semiconductor film 927, the insulating film 924, and the first electrode 930. The oxide semiconductor film 927 is connected to a capacitor line 929 through an electrode film 928. The electrode film 928 is formed using the same conductive film as the source electrode and the drain electrode of each of the transistors 910 and 911. The capacitor line 929 is formed using the same conductive film as a gate electrode of each of the transistors 910 and 911. Although the capacitor described in Embodiment 1 is illustrated as the capacitor 926 here, any of the capacitors in the other embodiments may be used as appropriate.

Moreover, an example in which a conductive film 917 is provided over the insulating film 924 so as to overlap with a channel formation region of the oxide semiconductor film of the transistor 911 included in the scan line driver circuit is illustrated. That is, the transistor 911 is the dual-gate transistor described in Embodiment 1. Although not illustrated, the conductive film 917 is electrically connected to the capacitor line 929. In this embodiment, the conductive film 917 is formed using the same conductive film as the first electrode 930. With such a structure, the structure which is configured to control the potential of the conductive film 917 can be omitted. By providing the conductive film 917 so as to overlap with the channel formation region of the oxide semiconductor film, the amount of change of the threshold voltage of the transistor 911 between before and after a reliability test can be further reduced. Further, the operation speed of the transistor 911 can be increased; thus, the operation speed of the driver circuit can be improved.

The conductive film 917 may have the same potential as or a potential different from that of the gate electrode of the transistor 911, and the conductive film 917 can serve as a second gate electrode (back-gate electrode). The potential difference between the conductive film 917 and the source electrode of the transistor 911 may be 0 V. With the above structure, both an increase of the operation speed and a reduction of power consumption of the display device can be achieved.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can suppress change in the electrical characteristics of the transistor due to the influence of an external electric field such as static electricity. Further, the threshold voltage of the transistor can be controlled. Note that although the transistors included in the scan line driver circuit are illustrated in FIGS. 36A and 36B, in a manner similar to that of the transistor 911, a transistor included in the signal line driver circuit may have a structure in which a conductive film is provided over the insulating film 924 so as to overlap with a channel formation region of the oxide semiconductor film.

In the display panel, the transistor 910 included in the pixel portion 902 is electrically connected to a display element. There is no particular limitation on the kind of the display element as long as display can be performed, and various kinds of display elements can be used.

A liquid crystal element 913 which is a display element includes the first electrode 930, a second electrode 931, and a liquid crystal 908. Note that an insulating film 932 and an insulating film 933 which serve as an alignment film are provided so that the liquid crystal 908 is provided therebetween. The second electrode 931 is provided on the second substrate 906 side. The second electrode 931 overlaps with the first electrode 930 with the liquid crystal 908 provided therebetween. For the liquid crystal element 913, the description of the liquid crystal element 108 in Embodiment 1 can be referred to. The first electrode 930 corresponds to the pixel electrode 121 in Embodiment 1, the second electrode 931 corresponds to the counter electrode 154 in Embodiment 1, the liquid crystal 908 corresponds to the liquid crystal 160 in Embodiment 1, the insulating film 932 corresponds to the alignment film 158 in Embodiment 1, and the insulating film 933 corresponds to the alignment film 156 in Embodiment 1.

The first electrode and the second electrode (each of which are also referred to as a pixel electrode, a common electrode, a counter electrode, or the like) for applying voltage to the display element can have light-transmitting properties or light-reflecting properties, which depends on the direction in which light is extracted, the position where the electrodes are provided, and the pattern structure of the electrodes.

The first electrode 930 and the second electrode 931 can be formed using, as appropriate, a material similar to that of the pixel electrode 121 and the counter electrode 154 of Embodiment 1.

A spacer 935 is a columnar spacer obtained by selective etching of an insulating film and is provided in order to control the distance between the first electrode 930 and the second electrode 931 (a cell gap). Alternatively, a spherical spacer may be used.

The first substrate 901 and the second substrate 906 are fixed in place by a sealant 925. As the sealant 925, an organic resin such as a thermosetting resin or a photocurable resin can be used. In addition, the sealant 925 is in contact with the insulating film 924. Note that the sealant 925 corresponds to the sealant 905 in FIGS. 35A to 35C.

In the liquid crystal display device, a black matrix (a light-blocking film); an optical member (an optical substrate) such as a polarizing member, a retardation member, or an anti-reflection member; and the like are provided as appropriate. For example, circular polarization may be obtained by using a polarizing substrate and a retardation substrate. In addition, a light source device such as a backlight or a side light may be used as a light source.

Since the transistor is easily broken owing to static electricity or the like, a protective circuit for protecting the driver circuit is preferably provided. The protection circuit is preferably formed using a nonlinear element.

Next, a liquid crystal display device of a transverse electric field mode is described with reference to FIG. 36B. FIG. 36B illustrates a liquid crystal display device of a fringe field switching (FFS) mode, which is one of transverse electric field modes. The structure of the liquid crystal display device of a transverse electric field mode, which is different from the structure of the liquid crystal display device of a vertical electric field mode illustrated in FIG. 36A, is described.

In the liquid crystal display device illustrated in FIG. 36B, the connection terminal electrode 915 is formed using the same conductive film as a first electrode 940, and the terminal electrode 916 is formed using the same conductive film as the source electrode and the drain electrode of each of the transistors 910 and 911.

In addition, a liquid crystal element 943 includes the first electrode 940, a second electrode 941, and the liquid crystal 908 which are formed over the insulating film 924. The liquid crystal element 943 can have, as appropriate, the structure of the liquid crystal element 108 of Embodiment 1. The first electrode 940 can be formed using, as appropriate, the material of the first electrode 930 illustrated in FIG. 36A. Further, the planar shape of the first electrode 940 is a comb-like shape, a staircase-like shape, a ladder-like shape, or the like. The second electrode 941 serves as a common electrode and can be formed in a manner similar to that of the oxide semiconductor film 119 of Embodiment 1. The insulating film 924 is provided between the first electrode 940 and the second electrode 941. In the liquid crystal display device illustrated in FIG. 36B, the capacitor includes the first electrode 940 and the second electrode, which are a pair of electrodes, and the insulating film 924 which serves as a dielectric film.

The second electrode 941 is connected to a capacitor line 946 through a conductive film 945. The conductive film 945 is formed using the same conductive film as the source electrode and the drain electrode of each of the transistors 910 and 911. The capacitor line 946 is formed using the same conductive film as the gate electrode of each of the transistors 910 and 911. Although the description is made using the capacitor described in Embodiment 1 as the liquid crystal element 943 here, any of the capacitors described in the other embodiments can be used as appropriate.

Figure 37A:
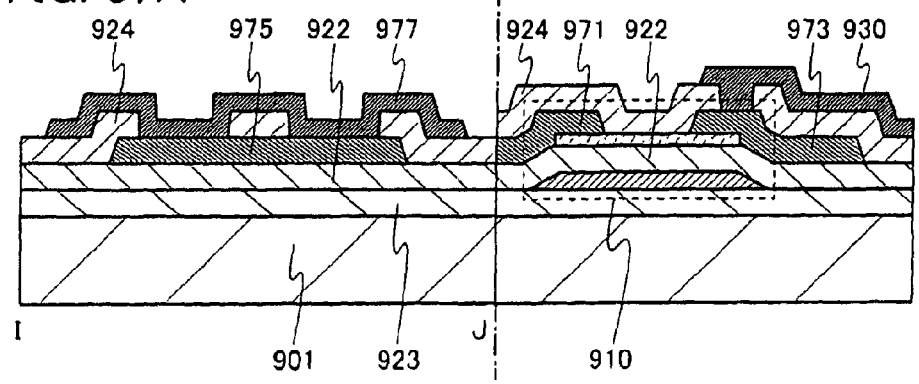
FIGS. 37A to 37C are a top view and cross-sectional views illustrating a semiconductor device of one embodiment of the present invention.
Figure 37B:
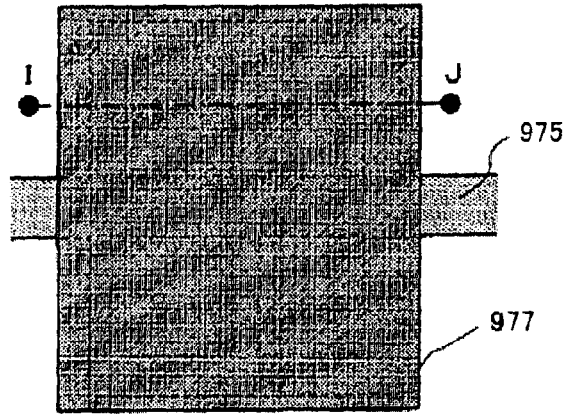
Figure 37C:
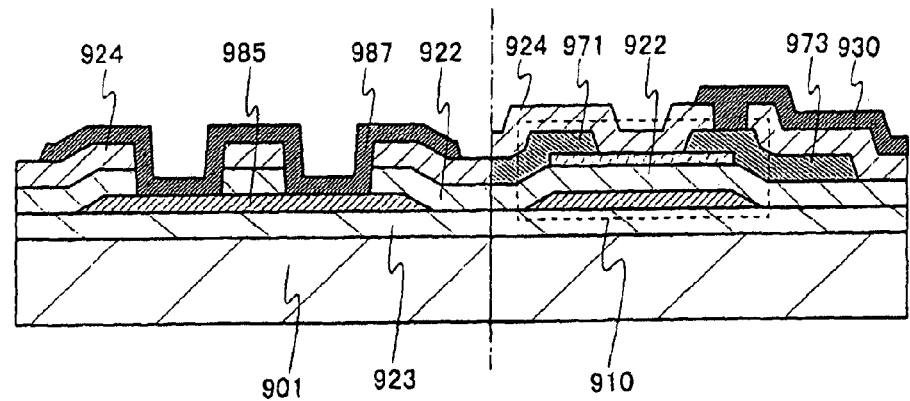

FIGS. 37A to 37C illustrate an example of the liquid crystal display device in FIG. 36A in which a common connection portion (pad portion) for being electrically connected to the second electrode 931 provided on the second substrate 906 is formed over the first substrate 901.

The common connection portion is provided in a position overlapping with the sealant for bonding the first substrate 901 and the second substrate 906, and is electrically connected to the second electrode 931 through conductive particles contained in the sealant. Alternatively, the common connection portion is provided in a position not overlapping with the sealant (except for the pixel portion) and a paste including conductive particles is provided separately from the sealant so as to overlap with the common connection portion, whereby the common connection portion is electrically connected to the second electrode 931.

FIG. 37A is a cross-sectional view of the common connection portion taken along line in the top view in FIG. 37B.

A common potential line 975 is provided over a gate insulating film 922 and is formed using the same material and through the same steps as a source electrode 971 or a drain electrode 973 of the transistor 910 illustrated in FIGS. 36A and 36B.

Further, the common potential line 975 is covered with the insulating film 924, and the insulating film 924 has a plurality of openings at a position overlapping with the common potential line 975. These openings are formed through the same steps as a contact hole which connects the first electrode 930 and one of the source electrode 971 and the drain electrode 973 of the transistor 910.

Further, the common potential line 975 is connected to a common electrode 977 through the openings. The common electrode 977 is provided over the insulating film 924 and is formed using the same material and through the same steps as the connection terminal electrode 915 and the first electrode 930 in the pixel portion.

In this manner, the common connection portion can be formed through the same fabrication process as the switching element in the pixel portion 902.

The common electrode 977 is an electrode in contact with the conductive particles contained in the sealant, and is electrically connected to the second electrode 931 of the second substrate 906.

Alternatively, as illustrated in FIG. 37C, a common potential line 985 may be formed using the same material and through the same steps as the gate electrode of the transistor 910.

In the common connection portion illustrated in FIG. 37C, the common potential line 985 is provided under the gate insulating film 922 and the insulating film 924; and the gate insulating film 922 and the insulating film 924 have a plurality of openings at a position overlapping with the common potential line 985. These openings are formed by etching the insulating film 924 through the same steps as a contact hole which connects the first electrode 930 and one of the source electrode 971 and the drain electrode 973 of the transistor 910, and then by further selectively etching the gate insulating film 922.

Further, the common potential line 985 is connected to a common electrode 987 through the openings. The common electrode 987 is provided over the insulating film 924 and is formed using the same material and through the same steps as the connection terminal electrode 915 and the first electrode 930 in the pixel portion.

As described above, in a semiconductor device including a driver circuit, the operation speed of the driver circuit can be increased while power consumption can be reduced in such a manner that a dual-gate transistor is used as a transistor included in the driver circuit and a back-gate electrode of the dual-gate transistor is electrically connected to a capacitor line electrically connected to a capacitor; accordingly, a semiconductor device having excellent display quality can be obtained.

In addition, the use of the semiconductor film formed in the same formation process as the semiconductor film (specifically, the oxide semiconductor film) of the transistor, for one electrode of the capacitor, allows fabrication of a semiconductor device including the capacitor whose charge capacity is increased while the aperture ratio is improved. Further, the semiconductor device can have an excellent display quality by improving the aperture ratio.

Further, oxygen vacancies and impurities such as hydrogen and nitrogen in the semiconductor film (specifically, the oxide semiconductor film) of the transistor are reduced, so that the semiconductor device of one embodiment of the present invention has favorable electrical characteristics.

Note that the structure and the like described in this embodiment can be used as appropriate in combination with any of the structures and the like in the other embodiments.

Embodiment 6

The semiconductor device of one embodiment of the present invention can be applied to any of a variety of electronic devices (including game machines). Examples of electronic devices include television sets (also referred to as televisions or television receivers), monitors of computers, cameras such as digital cameras or digital video cameras, digital photo frames, mobile phones, portable game consoles, portable information terminals, audio reproducing devices, game machines (e.g., pachinko machines or slot machines), housings of game machines, and the like. Examples of such electronic devices are illustrated in FIGS. 38A to 38C.

Figure 38A:
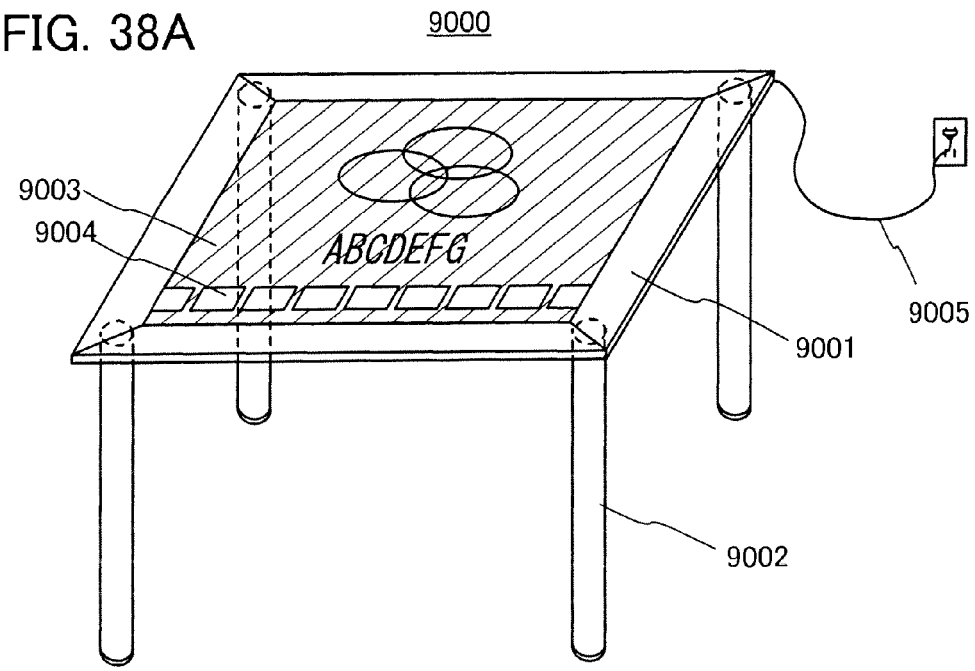
FIGS. 38A to 38C are diagrams each illustrating an electronic device including a semiconductor device of one embodiment of the present invention.
Figure 38B:
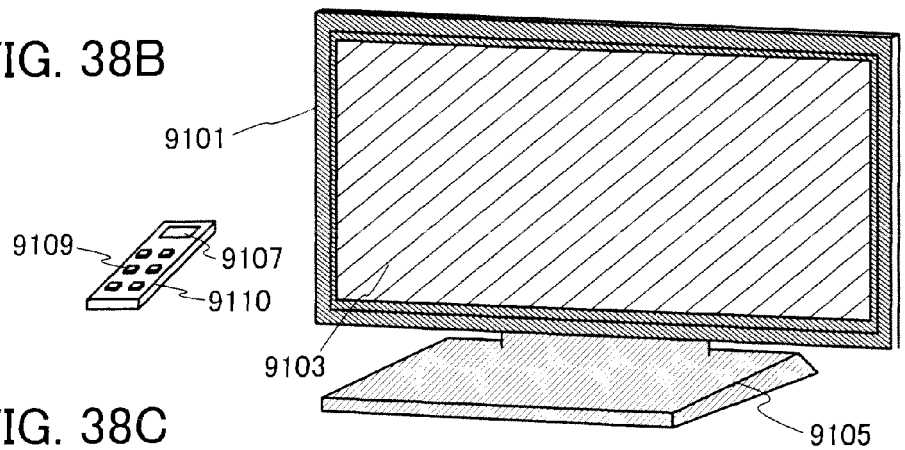
Figure 38C:
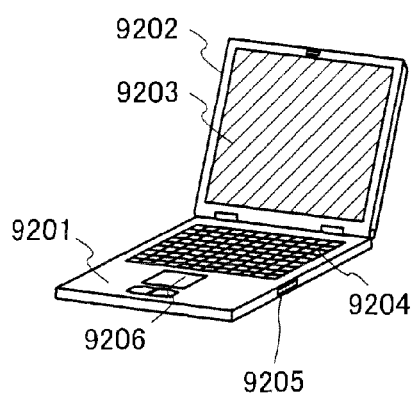

FIG. 38A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used for the display portion 9003. Thus, the display quality of the display portion 9003 can be improved.

The display portion 9003 has a touch-input function. When a user touches displayed buttons 9004 which are displayed on the display portion 9003 of the table 9000 with his/her finger or the like, the user can carry out operation of the screen and input of information. Further, when the table 9000 may be made to communicate with home appliances or control the home appliances, the table 9000 may serve as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 38B illustrates a television set 9100. In the television set 9100, a display portion 9103 is incorporated in a housing 9101 and an image can be displayed on the display portion 9103. Note that here, the housing 9101 is supported by a stand 9105.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Further, the remote controller 9110 may be provided with a display portion 9107 for displaying data output from the remote controller 9110.

The television set 9100 illustrated in FIG. 38B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of the above embodiments can be used for the display portions 9103 and 9107. Thus, the display quality of the television set can be improved.

FIG. 38C illustrates a computer, which includes a main body 9201, a housing 9202, a display portion 9203, a keyboard 9204, an external connection port 9205, a pointing device 9206, and the like.

The semiconductor device described in any of the above embodiments can be used for the display portion 9203. Thus, the display quality of the computer can be improved.

Figure 39A:
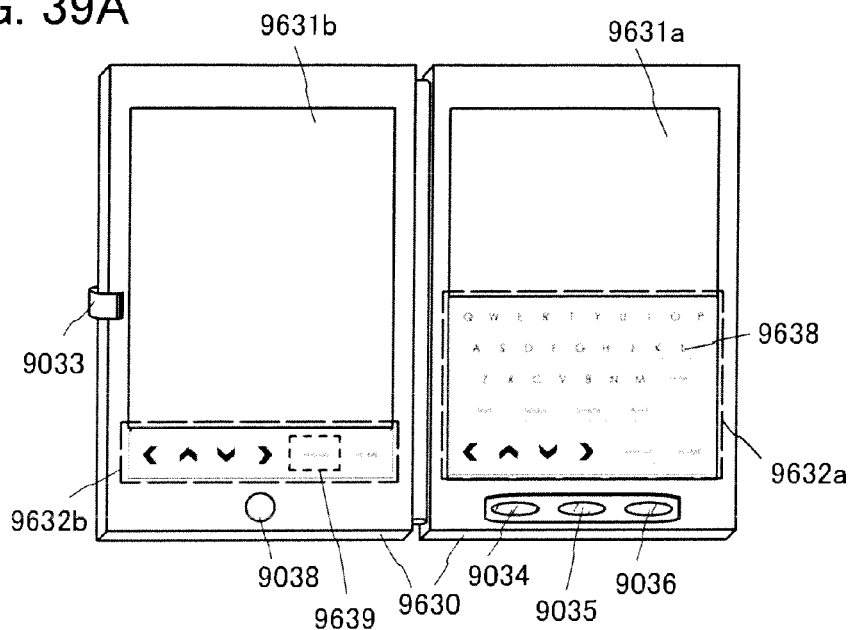
FIGS. 39A to 39C are diagrams illustrating an electronic device including a semiconductor device of one embodiment of the present invention.
Figure 39B:
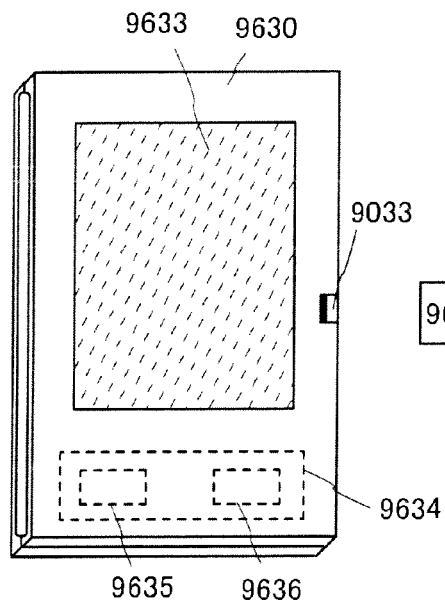

FIGS. 39A and 39B illustrate a foldable tablet terminal. In FIG. 39A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of the above embodiments can be used for the display portion 9631a and the display portion 9631b. Thus, the display quality of the tablet terminal can be improved.

Part of the display portion 9631a can be a touch panel region 9632a, and data can be input by touching operation keys 9638 that are displayed. Note that FIG. 39A shows, as an example, that half of the area of the display portion 9631a has only a display function, and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

In the display portion 9631b, as in the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a portrait mode and a landscape mode, and between monochrome display and color display, for example. With the power-saving-mode switching button 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 39A, one embodiment of the present invention is not limited to this example. The display portion 9631a and the display portion 9631b may have different areas or different display quality. For example, one of them may be a display panel that can display higher-definition images than the other.

FIG. 39B illustrates the tablet terminal folded, which includes the housing 9630, a solar battery 9633, and a charge and discharge control circuit 9634. Note that FIG. 39B illustrates an example in which the charge and discharge control circuit 9634 includes a battery 9635 and a DCDC converter 9636.

Since the tablet terminal can be foldable, the housing 9630 can be closed when the tablet terminal is not in use. Thus, the display portions 9631a and 9631b can be protected, whereby a tablet terminal with high endurance and high reliability for long-term use can be provided.

The tablet terminal illustrated in FIGS. 39A and 39B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached to the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. When a lithium ion battery is used as the battery 9635, there is an advantage of downsizing or the like.

Figure 39C:
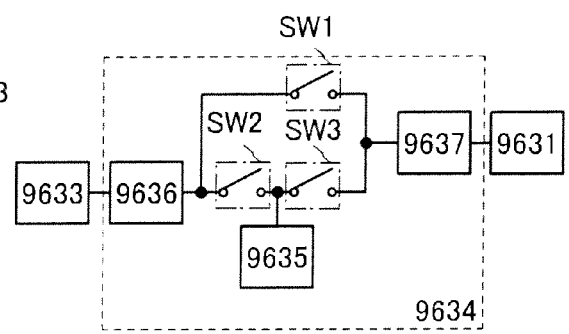

The structure and operation of the charge and discharge control circuit 9634 illustrated in FIG. 39B are described with reference to a block diagram of FIG. 39C. The solar battery 9633, the battery 9635, the DCDC converter 9636, a converter 9637, switches SW1, SW2, and SW3, and the display portion 9631 are illustrated in FIG. 39C, and the battery 9635, the DCDC converter 9636, the converter 9637, and the switches SW1 to SW3 correspond to the charge and discharge control circuit 9634 illustrated in FIG. 39B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and the switch SW2 is turned on so that charge of the battery 9635 may be performed.

Here, the solar battery 9633 is illustrated as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

Note that the structure and the like described in this embodiment can be used as appropriate in combination with any of the structures and the like in the other embodiments.

Example 1

In this example, the resistances of an oxide semiconductor film and a multilayer film will be described with reference to FIGS. 40A to 40D and FIG. 41.

First, the structure of a sample is described with reference to FIGS. 40A to 40D.

Figure 40A:
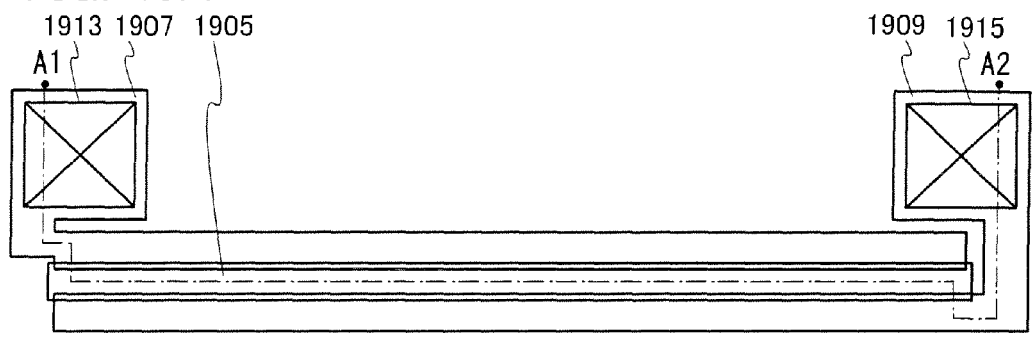
FIGS. 40A to 40D are diagrams illustrating structures of samples.
Figure 40B:
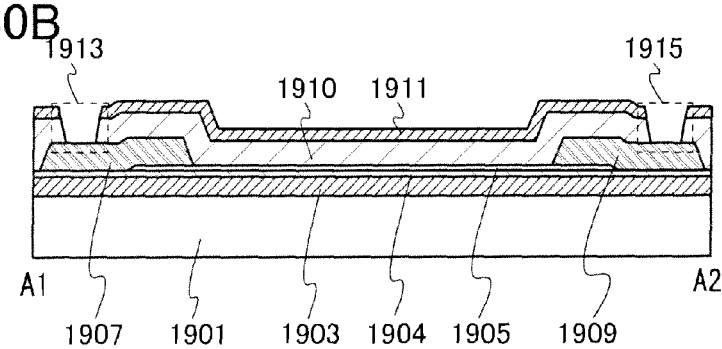
Figure 40C:
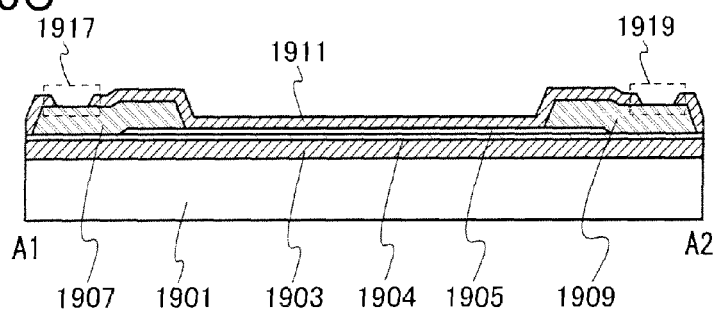
Figure 40D:
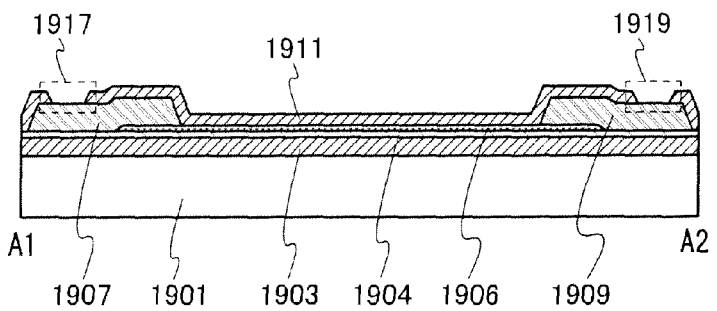

FIG. 40A is a top view of a sample 1, a sample 2, a sample 3, and a sample 4, and FIGS. 40B to 40D are cross-sectional views taken along dashed-and-dotted line A1-A2 in FIG. 40A. Note that the top views of the samples 1 to 4 are the same, and the cross-sectional views thereof are different because the stacked-layer structures of the cross sections are different. The cross-sectional views of the sample 1, the sample 2, and the samples 3 and 4 are illustrated in FIG. 40B, FIG. 40C, and FIG. 40D, respectively.

As for the sample 1, an insulating film 1903 is formed over a glass substrate 1901, an insulating film 1904 is formed over the insulating film 1903, and an oxide semiconductor film 1905 is formed over the insulating film 1904. The both ends of the oxide semiconductor film 1905 are covered with a conductive film 1907 and a conductive film 1909 each serving as an electrode, and the oxide semiconductor film 1905 and the conductive films 1907 and 1909 are covered with an insulating film 1910 and an insulating film 1911. Note that an opening 1913 and an opening 1915 are provided in the insulating films 1910 and 1911, and the conductive film 1907 and the conductive film 1909 are exposed through the opening 1913 and the opening 1915, respectively.

As for the sample 2, the insulating film 1903 is formed over the glass substrate 1901, the insulating film 1904 is formed over the insulating film 1903, and the oxide semiconductor film 1905 is formed over the insulating film 1904. The both ends of the oxide semiconductor film 1905 are covered with the conductive films 1907 and 1909 each serving as an electrode, and the oxide semiconductor film 1905 and the conductive films 1907 and 1909 are covered with the insulating film 1911. Note that an opening 1917 and an opening 1919 are provided in the insulating film 1911, and the conductive film 1907 and the conductive film 1909 are exposed through the opening 1917 and the opening 1919, respectively.

In each of the samples 3 and 4, the insulating film 1903 is formed over the glass substrate 1901, the insulating film 1904 is formed over the insulating film 1903, and a multilayer film 1906 is formed over the insulating film 1904. The both ends of the multilayer film 1906 are covered with the conductive films 1907 and 1909 each serving as an electrode, and the multilayer film 1906 and the conductive films 1907 and 1909 are covered with the insulating film 1911. Note that the openings 1917 and 1919 are provided in the insulating film 1911, and the conductive film 1907 and the conductive film 1909 are exposed through the opening 1917 and the opening 1919, respectively.

As described above, the structures of the insulating films in contact with the top surface of the oxide semiconductor film 1905 or the multilayer film 1906 are different in the samples 1 to 4. In the sample 1, the oxide semiconductor film 1905 and the insulating film 1910 are in contact with each other; in the sample 2, the oxide semiconductor film 1905 and the insulating film 1911 are in contact with each other; and in the samples 3 and 4, the multilayer film 1906 and the insulating film 1911 are in contact with each other.

Next, fabrication methods of the samples are described.

First, a fabrication method of the sample 1 is described.

A 400-nm-thick silicon nitride film was formed as the insulating film 1903 over the glass substrate 1901 by a plasma CVD method.

Next, a 50-nm-thick silicon oxynitride film was formed as the insulating film 1904 over the insulating film 1903 by a plasma CVD method.

Next, a 35-nm-thick IGZO film was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process, so that the oxide semiconductor film 1905 was formed.

Next, the conductive films 1907 and 1909 were formed over the insulating film 1904 and the oxide semiconductor film 1905 in such a manner that a 50-nm-thick tungsten film, a 400-nm-thick aluminum film, and a 100-nm-thick titanium film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1910 by a plasma CVD method.

Next, a mask is formed over the insulating film 1911 through a photolithography process and then etching treatment was performed on the insulating film 1911, so that the openings 1913 and 1915 were formed in the insulating films 1910 and 1911.

Through the above process, the sample 1 was fabricated.

Next, a fabrication method of the sample 2 is described.

Next, a 450-nm-thick silicon oxynitride film was formed as the insulating film 1910 over the insulating film 1904, the oxide semiconductor film 1905, the conductive film 1907, and the conductive film 1909 of the sample 1 by a plasma CVD method, and then heat treatment was performed at 350° C. under a mixed atmosphere of nitrogen and oxygen for one hour. After that, the insulating film 1910 was removed.

Next, a 50-nm-thick silicon nitride film was formed as the insulating film 1911 over the insulating film 1904, the oxide semiconductor film 1905, the conductive film 1907, and the conductive film 1909 by a plasma CVD method.

Next, a mask is formed over the insulating film 1911 through a photolithography process and then etching treatment was performed on the insulating film 1911, so that the openings 1917 and 1919 were formed in the insulating film 1911.

Through the above process, the sample 2 was fabricated.

Next, a fabrication method of the sample 3 is described.

As for the sample 3, the multilayer film 1906 was used instead of the oxide semiconductor film 1905 of the sample 2. The multilayer film 1906 was formed over the insulating film 1904 in such a manner that a 10-nm-thick IGZO film with a metal oxide target containing In, Ga, and Zn at an atomic ratio of 1:3:2, a 10-nm-thick IGZO film with a metal oxide target containing In, Ga, and Zn at an atomic ratio of 1:1:1, and then a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process, so that the multilayer film 1906 was formed.

Through the above process, the sample 3 was fabricated.

Next, a fabrication method of the sample 4 is described.

As for the sample 4, the multilayer film 1906 was used instead of the oxide semiconductor film 1905 of the sample 2. The multilayer film 1906 was formed over the insulating film 1904 in such a manner that a 20-nm-thick IGZO film with a metal oxide target containing In, Ga, and Zn at an atomic ratio of 1:3:2, a 15-nm-thick IGZO film with a metal oxide target containing In, Ga, and Zn at an atomic ratio of 1:1:1, and then a 10-nm-thick IGZO film using a metal oxide target containing In, Ga, and Zn at an atomic ratio of 1:3:2 were successively formed by a sputtering method. Then, etching treatment was performed on the stacked IGZO films with a mask formed through a photolithography process, so that the multilayer film 1906 was formed.

Through the above process, the sample 4 was fabricated.

Next, the sheet resistance of the oxide semiconductor film 1905 provided in each of the samples 1 and 2 and the sheet resistance of the multilayer film 1906 provided in each of the samples 3 and 4 were measured. In the sample 1, a probe is made contact with the openings 1913 and 1915 to measure the sheet resistance of the oxide semiconductor film 1905. In each of the samples 2 to 4, a probe is made contact with the openings 1917 and 1919 to measure the sheet resistance of the oxide semiconductor film 1905 or the multilayer film 1906. Note that in the oxide semiconductor film 1905 in each of the samples 1 and 2 and the multilayer film 1906 in each of the samples 3 and 4, the widths of the conductive films 1907 and 1909 facing each other were each 1 mm and the distance between the conductive films 1907 and 1909 was 10 μm. Further, in each of the samples 1 to 4, the potential of the conductive film 1907 was a ground potential, and 1 V was applied to the conductive film 1909.

Figure 41:
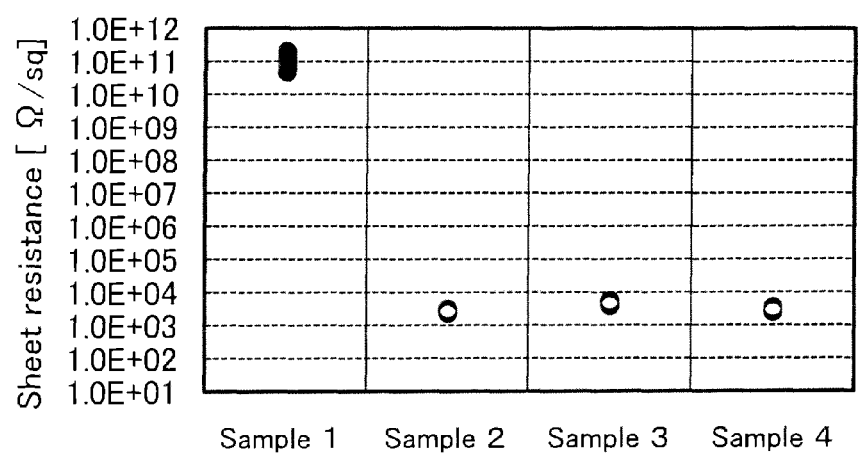
FIG. 41 is a graph showing sheet resistance.

FIG. 41 shows the sheet resistance of the samples 1 to 4.

The sheet resistance of the sample 1 was about $1 \times 10^{11}$ Ω/sq. The sheet resistance of the sample 2 was about 2620 Ω/sq. The sheet resistance of the sample 3 was about 4410 Ω/sq. The sheet resistance of the sample 4 was about 2930 Ω/sq.

In the above manner, the oxide semiconductor films 1905 and the multilayer films 1906 have different values of sheet resistance because the insulating films in contact with the oxide semiconductor film 1905 and the insulating films in contact with the multilayer film 1906 were different.

Note that when the above sheet resistances of the samples 1 to 4 were converted into resistivity, the resistivities of the sample 1, the sample 2, the sample 3, and the sample 4 were $3.9 \times 10^5$ Ωcm, $9.3 \times 10^{-3}$ Ωcm, $1.3 \times 10^{-2}$ Ωcm, and $1.3 \times 10^{-2}$ Ωcm, respectively.

In the sample 1, the silicon oxynitride film used as the insulating film 1910 was formed in contact with the top surface of the oxide semiconductor film 1905 and apart from the silicon nitride film used as the insulating film 1911. On the other hand, the silicon nitride film used as the insulating film 1911 was formed in contact with the top surface of the oxide semiconductor film 1905 in the sample 2 and was formed in contact with the top surface of the multilayer film 1906 in each of the samples 3 and 4. When the oxide semiconductor film 1905 or the multilayer film 1906 is thus provided in contact with the silicon nitride film used as the insulating film 1911, defects, typically oxygen vacancies are generated in the oxide semiconductor film 1905 or the multilayer film 1906, and hydrogen contained in the silicon nitride film is transferred to or diffused into the oxide semiconductor film 1905 or the multilayer film 1906. Accordingly, the conductivity of the oxide semiconductor film 1905 or the multilayer film 1906 is improved.

For example, in the case where an oxide semiconductor film is used for a channel formation region of a transistor, it is preferable to employ a structure in which a silicon oxynitride film is provided in contact with the oxide semiconductor film as shown in the sample 1. Further, as a light-transmitting conductive film used for an electrode of a capacitor, it is preferable to employ a structure in which a silicon nitride film is provided in contact with an oxide semiconductor film or a multilayer film as shown in the samples 2 to 4. With such a structure, even when an oxide semiconductor film or a multilayer film which is used for a channel formation region of a transistor and an oxide semiconductor film or a multilayer film which is used for an electrode of a capacitor are formed through the same process, the resistivity of the oxide semiconductor film and the resistivity of the multilayer film can be made different from each other.

Next, the sheet resistance values of the samples 2 and 3 which were preserved under a high-temperature high-humidity environment were measured. The conditions of the samples used here are described below. Note that here, the conditions are partly different from those of the samples 2 and 3. Therefore, samples which have the same structure as the samples 2 and 3 and which were formed under the different formation conditions are referred to as a sample 2a and a sample 3a.

First, a fabrication method of the sample 2a is described.

The insulating film 1903 and the insulating film 1904 were formed over the glass substrate 1901.

Next, a 35-nm-thick IGZO film was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process and then heat treatment was performed at 350° C. or 450° C., so that the oxide semiconductor film 1905 was formed.

Next, the conductive film 1907 and the conductive film 1909 were formed over the insulating film 1904 and the oxide semiconductor film 1905 in such a manner that a 50-nm-thick titanium film and a 400-nm-thick copper film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1904, the oxide semiconductor film 1905, the conductive film 1907, and the conductive film 1909 by a plasma CVD method. Note that the film formation temperature of the silicon nitride film was 220° C. or 350° C.

Next, a mask is formed over the insulating film 1911 through a photolithography process and then etching treatment was performed on the insulating film 1911, so that the opening 1917 and 1919 were formed in the insulating films 1910 and 1911.

Through the above process, the sample 2a was fabricated.

Next, a fabrication method of the sample 3a is described.

As for the sample 3a, the multilayer film 1906 was used instead of the oxide semiconductor film 1905 of the sample 2a. The multilayer film 1906 was formed over the insulating film 1904 in such a manner that a 10-nm-thick IGZO film with a metal oxide target containing In, Ga, and Zn at an atomic ratio of 1:1:1, and a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process and then heat treatment was performed at 350° C. or 450° C., so that the multilayer film 1906 was formed.

Through the above process, the sample 3a was fabricated.

Next, the sheet resistance of the oxide semiconductor film 1905 provided in the sample 2a and the sheet resistance of the multilayer film 1906 provided in the sample 3a were measured. In each of the samples 2a and 3a, a probe is made contact with the openings 1917 and 1919 to measure the sheet resistance of the oxide semiconductor film 1905 or the multilayer film 1906. Note that in the oxide semiconductor film 1905 in the sample 2a and the multilayer film 1906 in the sample 3a, the widths of the conductive films 1907 and 1909 facing each other were each 1.5 mm and the distance between the conductive films 1907 and 1909 was 10 μm. Further, in each of the samples 2a and 3a, the potential of the conductive film 1907 was a ground potential, and 1 V was applied to the conductive film 1909. The sheet resistance values of the samples 2a and 3a were measured after the samples 2a and 3a were preserved at 60° C. under an atmosphere with a humidity of 95% for 60 hours and 130 hours.

Figure 45:
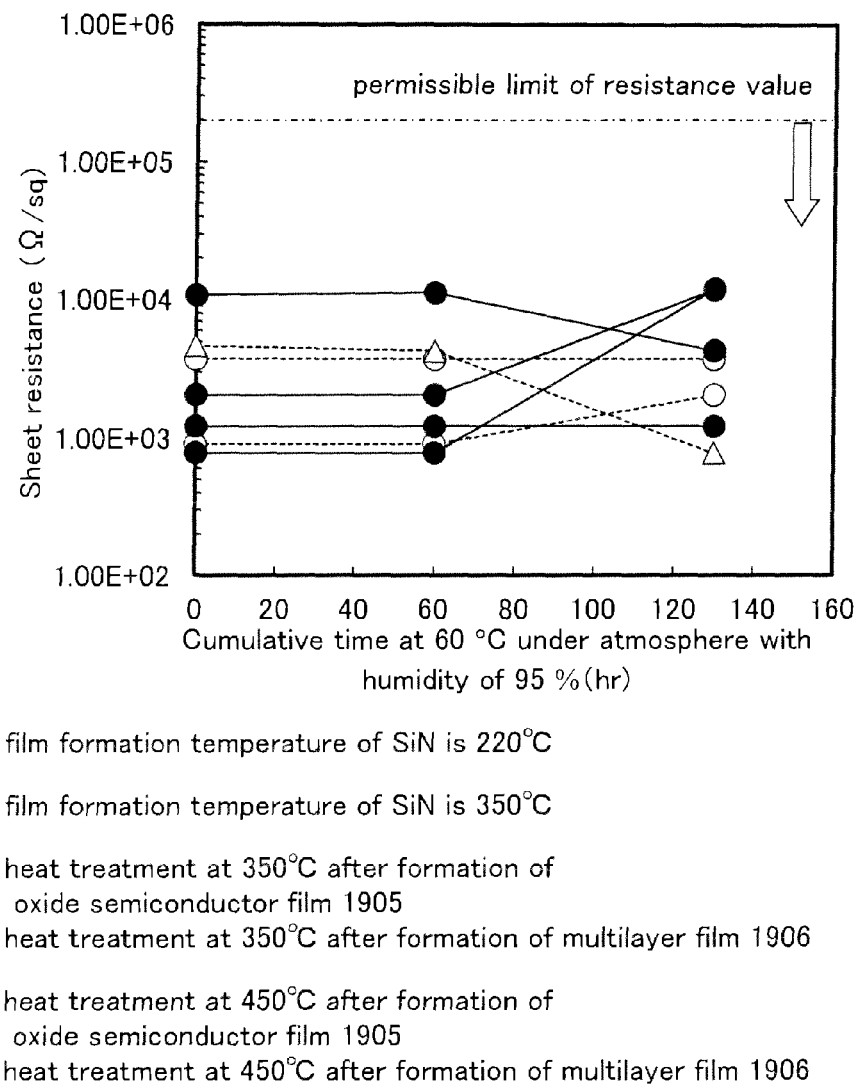
FIG. 45 is a graph showing sheet resistance.

FIG. 45 shows the sheet resistance values of the samples 2a and 3a. Note that in FIG. 45, the film formation temperature of the silicon nitride film formed as the insulating film 1911 in each sample is 220° C. (a solid line) or 350° C. (a dashed line). In addition, black circle and triangle indicate the samples each subjected to heat treatment at 350° C. after the formation of the oxide semiconductor film 1905 or the multilayer film 1906, and white circle and triangle indicate the samples each subjected to heat treatment at 450° C. after the formation of the oxide semiconductor film 1905 or the multilayer film 1906. The black and white triangles indicate the samples each including the oxide semiconductor film 1905, i.e. the sample 2a, and the black and white circles indicate the samples each including the multilayer film 1906, i.e. the sample 3a.

FIG. 45 shows that the samples 2a and 3a had low sheet resistance values and satisfied a preferable sheet resistance value for an electrode of a capacitor, which is 0.2 M/sq., and that the amount of change over time in the sheet resistance values of the samples 2a and 3a was small. As described above, the amount of change in the sheet resistance value of the oxide semiconductor film or the multilayer film in contact with the silicon nitride film is small under a high-temperature high-humidity environment; therefore, the oxide semiconductor film or the multilayer film can be used as a light-transmitting conductive film which is used for an electrode of a capacitor.

Figure 46:
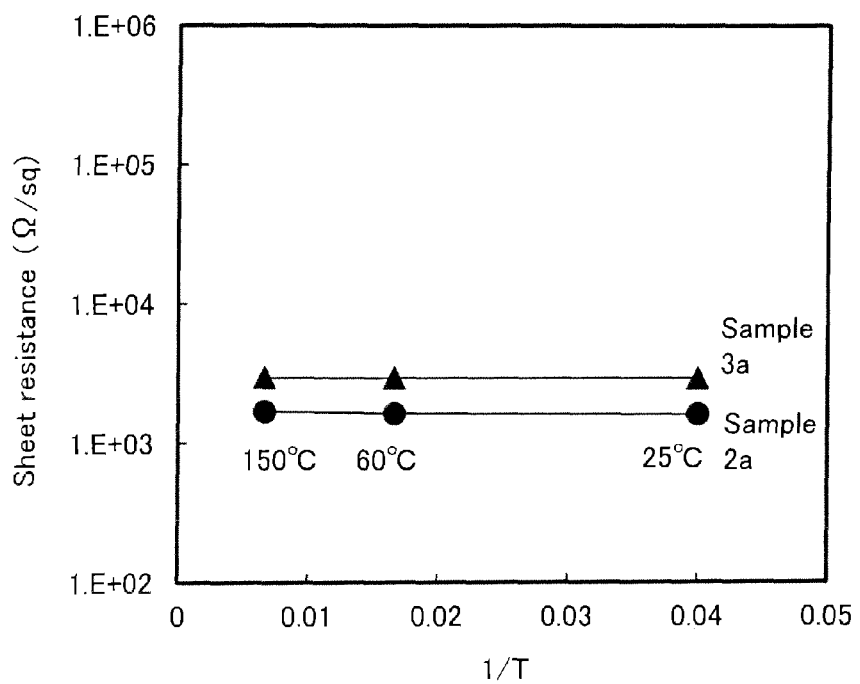
FIG. 46 is a graph showing sheet resistance.

Next, the sheet resistance values of the samples 2a and 3a when the substrate temperature was 25° C., 60° C., or 150° C. were measured, and the measurement results are shown in FIG. 46. Note that here, as each of the samples 2a and 3a, a sample which includes the silicon nitride film formed as the insulating film 1911 at 220° C. and which was subjected to heat treatment at 350° C. after the formation of the multilayer film 1906 was used.

FIG. 46 shows that the sheet resistance value of the multilayer film 1906 was not changed even when the substrate temperature was raised. In other words, the oxide semiconductor film or the multilayer film in contact with the silicon nitride film is a degenerated semiconductor. The amount of change in the sheet resistance value of the oxide semiconductor film or the multilayer film in contact with the silicon nitride film was small even when the substrate temperature was changed; therefore, the oxide semiconductor film or the multilayer film can be used as a light-transmitting conductive film which is used for an electrode of a capacitor.

Note that the structure described in this example can be used as appropriate in combination with any of the structures in the other embodiments and examples.

Example 2

In this example, analysis of impurities in an oxide semiconductor film and an insulating film formed over the oxide semiconductor film will be described with reference to FIGS. 42A and 42B.

In this example, two kinds of samples (hereinafter a sample 5 and a sample 6) were formed as samples for impurity analysis.

First, a fabrication method of the sample 5 is described below.

As for the sample 5, an IGZO film was formed over a glass substrate and a silicon nitride film was formed thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that as for the IGZO film, a 100-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

In addition, as for the silicon nitride film, a 100-nm-thick silicon nitride film was formed by a PE-CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 220° C.

Next, a fabrication method of the sample 6 is described below.

An IGZO film was formed over a glass substrate and a silicon oxynitride film and a silicon nitride film were stacked thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that the film formation conditions of the IGZO film and the silicon nitride film were similar to those of the sample 5. In addition, as for the silicon oxynitride film, a 50-nm-thick silicon oxynitride film was formed by a PE-CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, a 400-nm-thick silicon oxynitride film was formed by a PE-CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C.

Figure 42A:
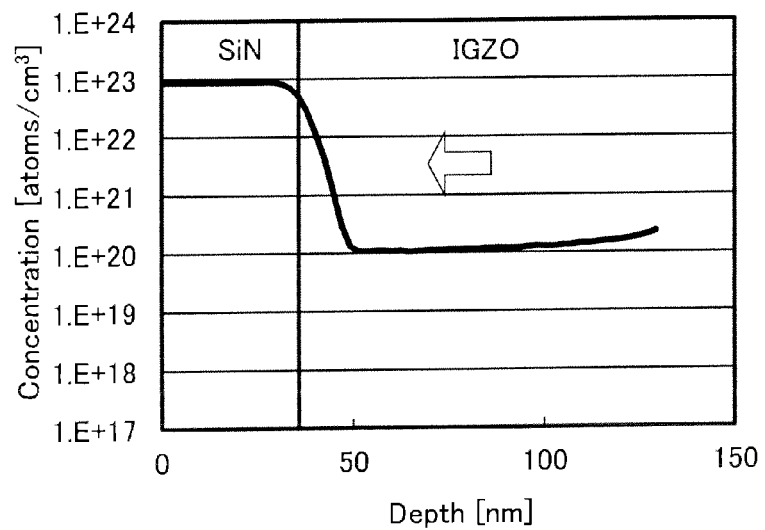
FIGS. 42A and 42B show results of SIMS measurement.
Figure 42B:
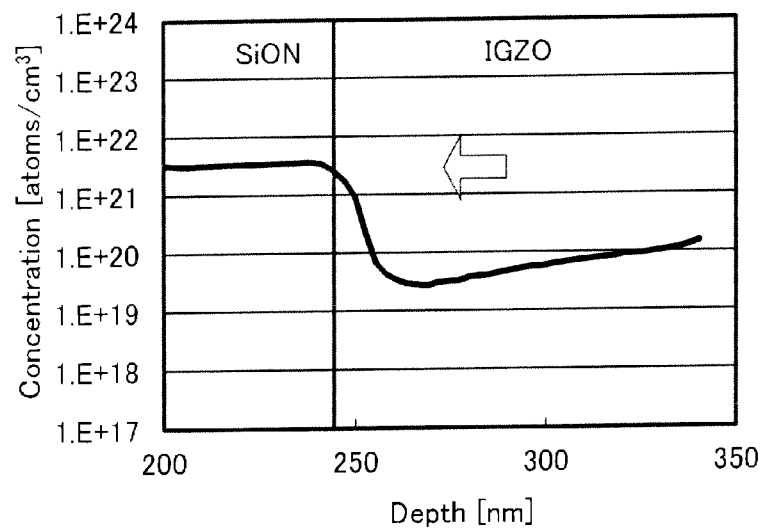

FIGS. 42A and 42B show the results of the impurity analysis of the samples 5 and 6.

Note that the impurity analysis was performed in the direction shown by the arrow in each of FIGS. 42A and 42B by secondary ion mass spectrometry (SIMS). That is, the measurement was performed from the glass substrate side.

FIG. 42A shows the concentration profile of hydrogen (H) which was obtained by measurement of the sample 5. FIG. 42B shows the concentration profile of hydrogen (H) which was obtained by measurement of the sample 6.

FIG. 42A shows that the concentration of hydrogen (H) in the IGZO film was $1.0 \times 10^{20}$ atoms/cm$^3$ and that the concentration of hydrogen (H) in the silicon nitride film was $1.0 \times 10^{23}$ atoms/cm$^3$. In addition, FIG. 42B shows that the concentration of hydrogen (H) in the IGZO film was $5.0 \times 10^{19}$ atoms/cm$^3$ and that the concentration of hydrogen (H) in the silicon oxynitride film was $3.0 \times 10^{21}$ atoms/cm$^3$.

It is known that it is difficult to obtain accurate data in the proximity of a surface of a sample or in the proximity of an interface between stacked films formed using different materials by the SIMS analysis in measurement principle. Thus, in the case where distributions of the concentrations of hydrogen (H) in the film in the thickness direction are analyzed by SIMS, an average value in a region where the film is provided, the value is not greatly changed, and an almost constant level of strength can be obtained is employed as the concentrations of hydrogen (H).

A difference between the IGZO films in the concentration of hydrogen (H) was found in this manner by changing the structure of the insulating film in contact with the IGZO film.

For example, in the case where any of the above IGZO films is formed in a channel formation region of a transistor, it is preferable to employ a structure in which a silicon oxynitride film is provided in contact with the IGZO film as shown in the sample 6. As a light-transmitting conductive film used for an electrode of a capacitor, it is preferable to employ a structure in which a silicon nitride film is provided in contact with the IGZO film as shown in the sample 5. With such a structure, even when an IGZO film which is used for a channel formation region of a transistor and an IGZO film which is used for an electrode of a capacitor are formed through the same process, the hydrogen concentrations of the IGZO films can be made different from each other.

Example 3

In this example, the amounts of defects in an oxide semiconductor film and a multilayer film will be described with reference to FIGS. 43A to 43C and FIG. 44.

First, the structure of a sample is described.

A sample 7 includes a 35-nm-thick oxide semiconductor film formed over a quartz substrate and a 100-nm-thick nitride insulating film formed over the oxide semiconductor film.

A sample 8 and a sample 9 each include a 30-nm-thick multilayer film formed over a quartz substrate and a 100-nm-thick nitride insulating film formed over the multilayer film. Note that in the multilayer film of the sample 8, a 10-nm-thick first oxide film, a 10-nm-thick oxide semiconductor film, and a 10-nm-thick second oxide film are stacked in this order. In the multilayer film of the sample 9, a 20-nm-thick first oxide film, a 15-nm-thick oxide semiconductor film, and a 10-nm-thick second oxide film are stacked in this order. The samples 8 and 9 are different from the sample 7 in that the multilayer film is included instead of the oxide semiconductor film.

A sample 10 includes a 100-nm-thick oxide semiconductor film formed over a quartz substrate, a 250-nm-thick oxide insulating film formed over the oxide semiconductor film, and a 100-nm-thick nitride insulating film formed over the oxide insulating film. The sample 10 is different from the samples 7 to 9 in that the oxide semiconductor film is not in contact with the nitride insulating film but in contact with the oxide insulating film.

Next, fabrication methods of the samples are described.

First, a fabrication method of the sample 7 is described.

A 35-nm-thick IGZO film was formed as the oxide semiconductor film over the quartz substrate. As for the IGZO film, the 35-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

Next, as first heat treatment, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Next, a 100-nm-thick silicon nitride film was formed as the nitride insulating film over the oxide semiconductor film. As for the silicon nitride film, the 100-nm-thick silicon nitride film was formed by a PE-CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 350° C.

Next, as second heat treatment, heat treatment was performed at 250° C. under a nitrogen atmosphere for one hour.

Through the above process, the sample 7 was fabricated.

Next, a fabrication method of the sample 8 is described.

As for the sample 8, the multilayer film was formed instead of the oxide semiconductor film of the sample 7. As for the multilayer film, the 10-nm-thick first oxide film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C. Then, the 10-nm-thick oxide semiconductor film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C. Then, the 10-nm-thick second oxide film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C.

Other steps are similar to those of the sample 7. Through the above process, the sample 8 was fabricated.

Next, a fabrication method of the sample 9 is described.

As for the sample 9, the multilayer film was formed instead of the oxide semiconductor film of the sample 7. As for the multilayer film, the 20-nm-thick first oxide film was formed over the quartz substrate under the same conditions as the first oxide film of the sample 8. Then, the 15-nm-thick oxide semiconductor film was formed by a sputtering method under the same conditions as the oxide semiconductor film of the sample 8. Then, the 10-nm-thick second oxide film was formed under the same conditions as the second oxide film of the sample 8.

Other steps are similar to those of the sample 7. Through the above process, the sample 9 was fabricated.

Next, a fabrication method of the sample 10 is described.

As for the sample 10, the 100-nm-thick oxide semiconductor film was formed over the quartz substrate under the same conditions as the sample 7.

Next, first heat treatment was performed under conditions similar to those of the sample 7.

Next, a 50-nm-thick first silicon oxynitride film and a 200-nm-thick second silicon oxynitride film were stacked over the oxide semiconductor film as the oxide insulating film. Here, the 50-nm-thick first silicon oxynitride film was formed by a PE-CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, the 200-nm-thick second silicon oxynitride film was formed by a PE-CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C. Note that the second silicon oxynitride film is a film containing oxygen at a higher proportion than oxygen in the stoichiometric composition.

Next, a 100-nm-thick silicon nitride film was formed over the oxide insulating film under the same conditions as the sample 7.

Next, second heat treatment was performed under conditions similar to those of the sample 7.

Through the above process, the sample 10 was fabricated.

Next, the samples 7 to 10 were measured by ESR. In the ESR measurement performed at a predetermined temperature, a value of a magnetic field ($H_0$) where a microwave is absorbed is used for an equation $g=hn/bH_0$, so that a parameter of a g-factor can be obtained. Note that the frequency of the microwave is denoted by ν, and the Planck constant and the Bohr magneton are denoted by, respectively, h and β which are both constants.

Here, the ESR measurement was performed under the conditions as follows. The measurement temperature was room temperature (25° C.), the high-frequency power (power of microwaves) of 8.92 GHz was 20 mW, and the direction of a magnetic field was parallel to a surface of each sample.

FIG. 43A shows a first derivative curve obtained by ESR measurement of the oxide semiconductor film in the sample 7; and FIGS. 43B and 43C show first derivative curves obtained by ESR measurement of the multilayer films in the samples 8 and 9. FIG. 43A shows the measurement result of the sample 7, FIG. 43B shows the measurement result of the sample 8, and FIG. 43C shows the measurement result of the sample 9.

Figure 44:
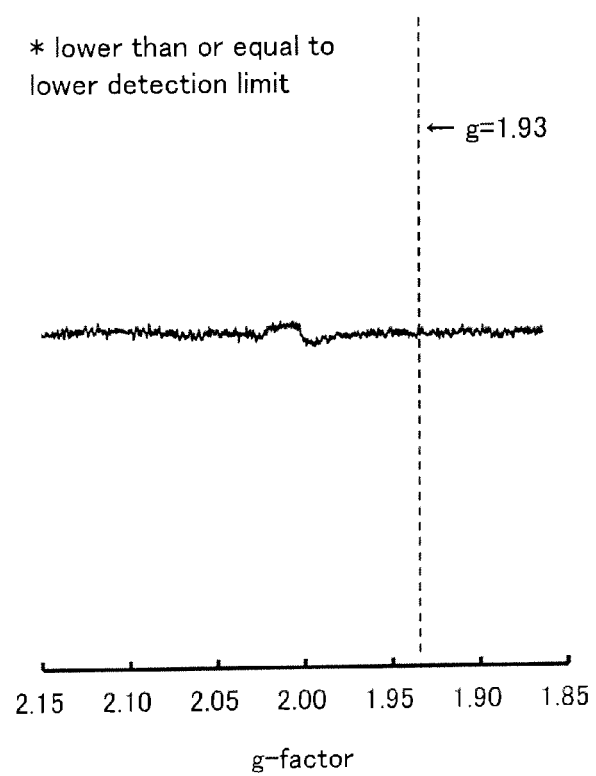
FIG. 44 is a graph showing results of ESR measurement.

FIG. 44 shows a first derivative curve obtained by ESR measurement of the oxide semiconductor film in the sample 10.

In FIGS. 43A to 43C, the sample 7 has signal symmetry due to a defect in the oxide semiconductor film when a g-factor is 1.93. The samples 8 and 9 each have signal symmetry due to a defect in the multilayer film when a g-factor is 1.95. As for the sample 7, the spin density when a g-factor was 1.93 was $2.5 \times 10^{19}$ spins/cm$^3$, in the sample 8, the total spin densities when g-factors were 1.93 and 1.95 were $1.6 \times 10^{19}$ spins/cm$^3$, and in the sample 9, the total spin densities when g-factors were 1.93 and 1.95 were $2.3 \times 10^{19}$ spins/cm$^3$. That is, it is found that the oxide semiconductor film and the multilayer film include defects. Note that an oxygen vacancy is an example of the defect in the oxide semiconductor film and the multilayer film.

Although, in FIG. 44, the thickness of the oxide semiconductor film of the sample 10 is thicker than that of the sample 7 and those of the multilayer films of the samples 8 and 9, signal symmetry due to a defect was not detected, i.e. the number of defects was less than or equal to the lower limit of detection (here, the lower limit of detection was $3.7 \times 10^{16}$ spins/cm$^3$). Accordingly, it is found that the number of defects in the oxide semiconductor film cannot be detected.

It is found that when a nitride insulating film, here the silicon nitride film formed by a PE-CVD method is in contact with an oxide semiconductor film or a multilayer film, defects, typically oxygen vacancies are generated in the oxide semiconductor film or the multilayer film. On the other hand, when an oxide insulating film, here the silicon oxynitride film is provided over an oxide semiconductor film, excess oxygen contained in the silicon oxynitride film, i.e. oxygen contained at a higher proportion than oxygen in the stoichiometric composition is diffused into the oxide semiconductor film and thus the number of defects in the oxide semiconductor film is not increased.

As described above, as shown in the samples 7 to 9, the oxide semiconductor film or the multilayer film which is in contact with the nitride insulating film has a number of defects, typically oxygen vacancies, and has a high conductivity and therefore can be used as an electrode of a capacitor. On the other hand, as shown in the sample 10, an oxide semiconductor film which is in contact with the oxide insulating film has a small number of oxygen vacancies and low conductivity and therefore can be used as a channel formation region of a transistor.

Here, the cause of a reduction in resistivity of the oxide semiconductor film or the multilayer film which is in contact with the nitride insulating film is described below.

<Energy and Stability Between Existing Modes of Hydrogen (H)>

First, the energy difference and stability in a mode of H which exists in an oxide semiconductor film is described with calculated results. Here, InGaZnO$_4$ was used as the oxide semiconductor film.

The structure used for the calculation is based on a 84-atom bulk model in which twice the number of a hexagonal unit cell of the InGaZnO$_4$ is arranged along the a-axis and b-axis.

Figure 47A:
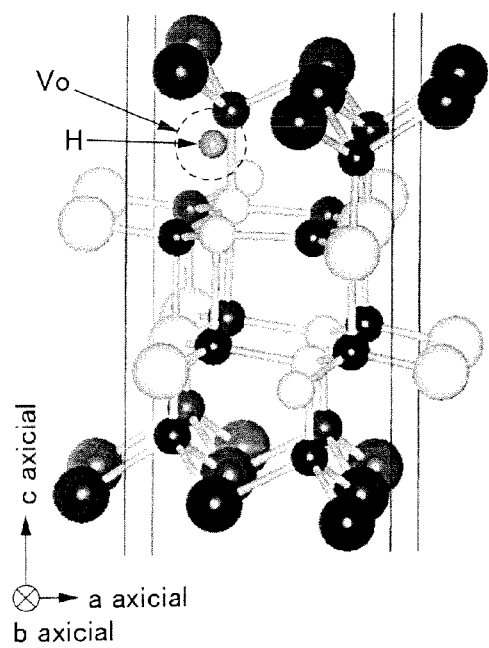
FIGS. 47A to 47D are diagrams describing bulk models of $InGaZnO_4$.
Figure 47B:
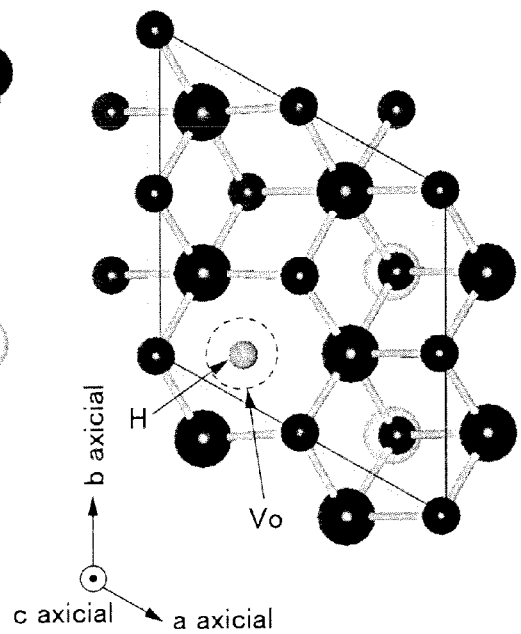

As the bulk model, a model in which one O atom bonded to three In atoms and one Zn atom is substituted with a H atom was prepared (see FIG. 47A). FIG. 47B shows a diagram in which the a-b plane of the InO layer in FIG. 47A is viewed from the c-axis direction. A region from which one O atom bonded to three In atoms and one Zn atom is removed is shown as an oxygen vacancy Vo, which is shown in a dashed line in FIGS. 47A and 47B. In addition, a H atom in the oxygen vacancy Vo is expressed as VoH.

Figure 47C:
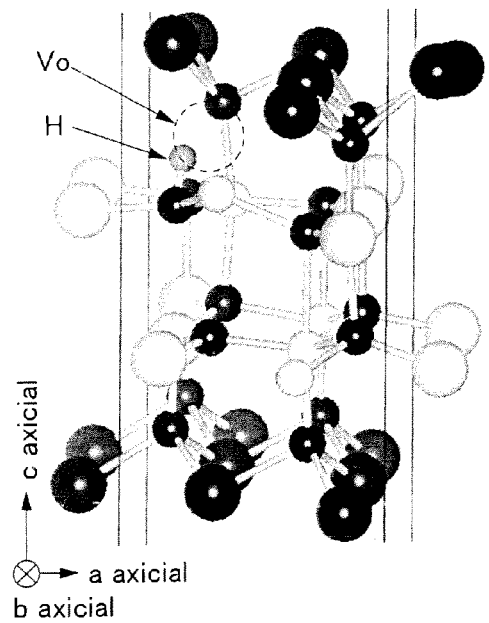
Figure 47D:
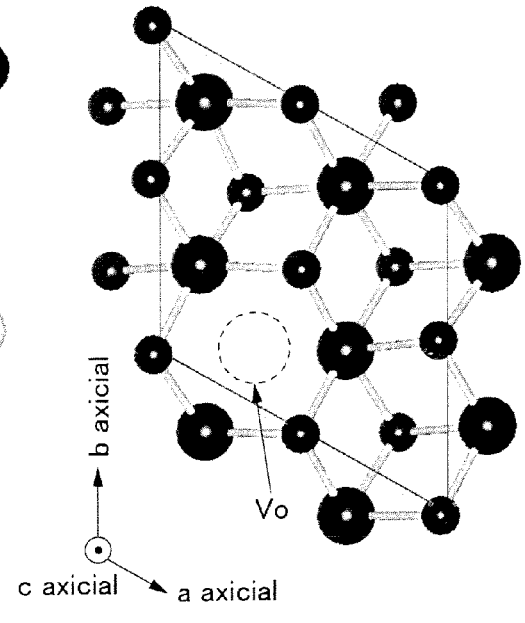

In the bulk model, one O atom bonded to three In atoms and one Zn atom is removed, whereby an oxygen vacancy Vo is formed. A model in which, in the vicinity of the oxygen vacancy Vo, a H atom is bonded to one O atom to which one Ga atom and two Zn atoms are bonded on the a-b plane was prepared (see FIG. 47C). FIG. 47D shows a diagram in which the a-b plane of the InO layer in FIG. 47C is viewed from the c-axis direction. In FIGS. 47C and 47D, an oxygen vacancy Vo is shown in a dashed line. A model in which an oxygen vacancy Vo is formed and, in the vicinity of the oxygen vacancy Vo, a H atom is bonded to one O atom to which one Ga atom and two Zn atoms are bonded on the a-b plane is expressed as Vo+H.

Optimization calculation was performed on the above two models with a fixed lattice constant to calculate the total energy. Note that as the value of the total energy is smaller, the structure becomes more stable.

In the calculation, first principles calculation software VASP (The Vienna Ab initio Simulation Package) was used. The calculation conditions are shown in Table 1.

TABLE 1

| Software | VASP |
|---|---|
| Pseudopotential | PAW |
| Functional | CGA/PBE |
| Cut-off energy | 500 eV |
| K-point | 4 × 4 × 1 |

As pseudopotential calculation of electronic states, a potential generated by a projector augmented wave (PAW) method was used, and as a functional, generalized-gradient-approximation/Perdew-Burke-Ernzerhof (GGA/PBE) was used.

In addition, the total energy of the two models which were obtained by the calculations is shown in Table 2.

TABLE 2

| Model | Total Energy |
|---|---|
| VoH | −456.084 eV |
| Vo + H | −455.304 eV |

According to Table 2, the total energy of VoH is lower than that of Vo+H by 0.78 eV. Thus, VoH is more stable than Vo+H. Accordingly, when a H atom comes close to an oxygen vacancy (Vo), the H atom might be easily trapped in the oxygen vacancy (Vo) than bonding with an O atom.

<Thermodynamic State of VoH>

Next, the formation energy and the charge state of VoH which is generated by a H atom trapped in an oxygen vacancy (Vo) is described with calculated results. The formation energy of VoH is different depending on the charge state and also depends on the Fermi energy. Thus, the stable charge state of VoH is different depending on the Fermi energy. Here, (VoH)$^+$ denotes a state in which one electron is discharged by VoH, (VoH)$^-$ denotes a state in which one electron is trapped by VoH, and (VoH)$^0$ denotes a state in which an electron is not transferred. The formation energies of (VoH)$^+$, (VoH)$^-$, and (VoH)$^0$ were calculated.

In the calculation, the first principles calculation software VASP was used. The calculation conditions are shown in Table 3.

TABLE 3

| Software | VASP |
|---|---|
| Pseudopotential | PAW |
| Functional | HSE06 |
| Cut-off energy | 800 eV |
| Number of k-point sampling | 2 × 2 × 1 (opt.) |
| | 4 × 4 × 1 (single) |
| Spin polarization | setup |
| Shielding parameter | 0.2 |
| Fraction of the nonolcal Fock-exchange | 0.25 |
| Number of atoms | 84 |

As pseudopotential calculation of electronic states, a potential generated by a projector augmented wave (PAW) method was used, and as a functional, Heyd-Scuseria-Ernzerhof (HSE) DFT hybrid factor (HSE06) was used.

Note that the formation energy of an oxygen vacancy was calculated as follows: a dilute limit of the concentration of oxygen vacancies was assumed, and excessive expansion of electrons and holes to the conduction band and the valence band was corrected. In addition, shift of the valence band due to the defect structure was corrected using the average electrostatic potential with the top of the valence band of a complete crystal serving as the origin of energy.

Figure 48A:
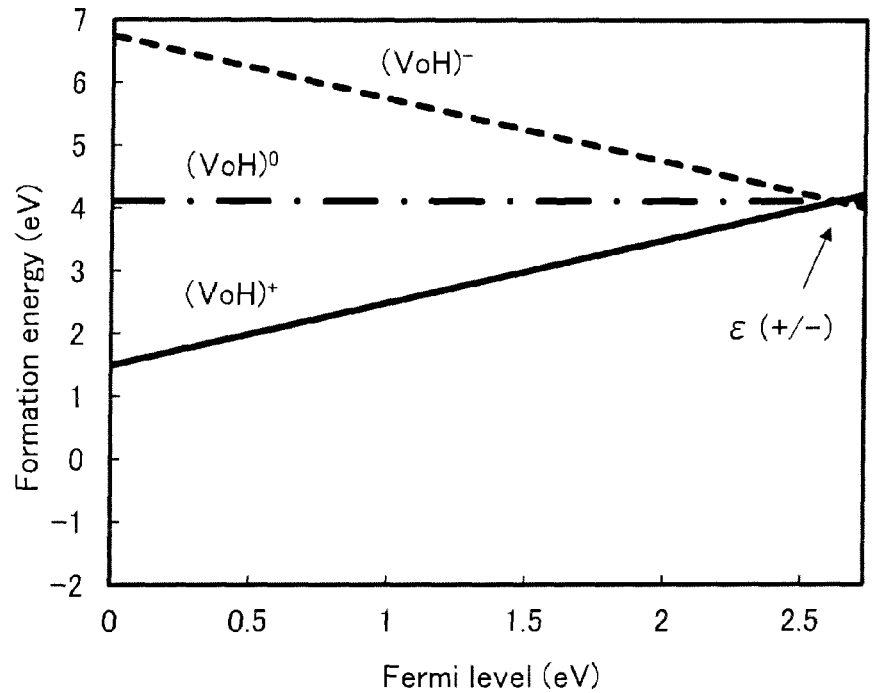
FIGS. 48A and 48B are a graph and a diagram describing formation energy and a thermodynamic transition level of VoH.

FIG. 48A shows the formation energies of $(VoH)^+$, $(VoH)^-$, and $(VoH)^0$. The horizontal axis represents the Fermi level, and the vertical axis represents the formation energy. The solid line represents the formation energy of $(VoH)^+$, the dashed-dotted line represents the formation energy of $(VoH)^0$, and the dashed line represents the formation energy of $(VoH)^-$. In addition, the transition level of the VoH charge from $(VoH)^+$ to $(VoH)^-$ through $(VoH)^0$ is represented by E (+/−).

Figure 48B:
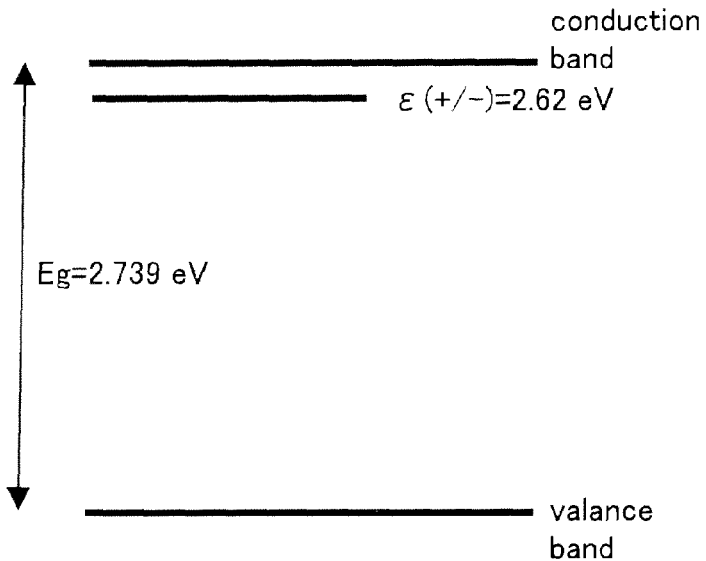

FIG. 48B shows a thermodynamic transition level of VoH. From the calculation result, the energy gap of $InGaZnO_4$ was 2.739 eV. In addition, when the energy of the valence band is 0 eV, the transfer level (c (+/−)) is 2.62 eV, which exists just under the conduction band. This shows that $InGaZnO_4$ is n-type by trapping a H atom in an oxygen vacancy Vo.

When an oxide semiconductor film is exposed to plasma, the oxide semiconductor film is damaged and defects, typically oxygen vacancies are generated in the oxide semiconductor film. In addition, when a nitride insulating film is in contact with an oxide semiconductor film, hydrogen contained in the nitride insulating film is transferred to the oxide semiconductor film. As a result, VoH is formed in an oxide semiconductor film by entry of hydrogen into an oxygen vacancy in the oxide semiconductor film, so that the oxide semiconductor film becomes n-type film and the resistivity thereof is reduced. As described above, the oxide semiconductor film in contact with the nitride insulating film can be used as an electrode of a capacitor.

This application is based on Japanese Patent Application serial No. 2012-178907 filed with the Japan Patent Office on Aug. 10, 2012 and Japanese Patent Application serial No. 2013-053942 filed with the Japan Patent Office on Mar. 15, 2013, the entire contents of which are hereby incorporated by reference.

What is claimed is:

1. A semiconductor device comprising:
a capacitor including a dielectric film between a pair of electrodes;
wherein one of the pair of electrodes comprises the first oxide semiconductor film including hydrogen and oxygen vacancy, and
wherein the oxygen vacancy is filled with the hydrogen.

2. The semiconductor device according to claim 1, further comprising:
a gate electrode;
a second oxide semiconductor film;
a gate insulating film between the gate electrode and the second oxide semiconductor film;
a pair of electrodes over and in contact with the second oxide semiconductor film;
a first insulating film over the pair of electrodes;
a second insulating film over the first insulating film; and
a second gate electrode over the second insulating film.

3. The semiconductor device according to claim 1, further comprising:
a gate electrode;
a second oxide semiconductor film;
a gate insulating film between the gate electrode and the second oxide semiconductor film;
a pair of electrodes over and in contact with the second oxide semiconductor film;
an insulating film over the pair of electrodes;
a second gate electrode over the insulating film; and
a capacitor line,
wherein the second gate electrode is electrically connected to the capacitor line.

4. A semiconductor device comprising:
a driver circuit which includes a first transistor including a first oxide semiconductor film and a gate electrode;
a pixel which includes a capacitor including a dielectric film between a pair of electrodes; and
a capacitor line electrically connected to the gate electrode and one of the pair of electrodes,
wherein the one of the pair of electrodes comprises a second oxide semiconductor layer,
wherein the second oxide semiconductor film includes hydrogen and oxygen vacancy, and
wherein the oxygen vacancy is filled with the hydrogen.

5. The semiconductor device according to claim 4,
wherein the gate electrode is over the first oxide semiconductor film, and
wherein the first transistor includes a second gate electrode below the first oxide semiconductor film.

6. The semiconductor device according to claim 4,
wherein the pixel includes a second transistor including a third oxide semiconductor film,
wherein the second oxide semiconductor film is on the same surface as the third oxide semiconductor film, and
wherein the second oxide semiconductor film is in contact with the capacitor line.

7. The semiconductor device according to claim 4,
wherein the pixel includes a second transistor including a third oxide semiconductor film, and
wherein the capacitor line extends in a direction parallel to a signal line which is electrically connected to a source electrode and a drain electrode of the second transistor and is provided on the same surface as the source electrode or the drain electrode of the second transistor.

8. A semiconductor device comprising:
a driver circuit which includes a first transistor including a first semiconductor film;
a pixel which includes a second transistor including a second semiconductor film;
a capacitor which includes a dielectric film between a pair of electrodes and a pixel electrode electrically connected to the second transistor, which are in the pixel; and
a capacitor line electrically connected to one of the pair of electrodes,
wherein the first transistor includes a first gate electrode below the first semiconductor film and a second gate electrode above the first semiconductor film,
wherein the second gate electrode is electrically connected to the capacitor line,
wherein an insulating film which has a stacked-layer structure of an oxide insulating film and a nitride insulating film is at least over the second semiconductor film,
wherein the capacitor comprises a third semiconductor film on the same surface as the second semiconductor film, and the third semiconductor film serves as the one of the pair of electrodes,
wherein the pixel electrode serves as the other of the pair of electrodes, wherein the dielectric film is the nitride insulating film,
wherein each of the second semiconductor film and the third semiconductor film has a light-transmitting property and includes an oxide semiconductor,
wherein the third semiconductor film includes hydrogen and oxygen vacancy, and
wherein the oxygen vacancy is filled with the hydrogen.

9. The semiconductor device according to claim 8, wherein the capacitor line and the third semiconductor film are in contact with each other.

10. The semiconductor device according to claim 8, wherein the capacitor line extends in a direction parallel to a signal line which is electrically connected to a source electrode and a drain electrode of the second transistor and is provided on the same surface as the source electrode and the drain electrode of the second transistor.

11. The semiconductor device according to claim 8, wherein the second gate electrode is a conductive film formed using the same material as the pixel electrode.

12. The semiconductor device according to claim 8, wherein an organic insulating film is over a region of the insulating film other than regions overlapping with the first transistor, the second transistor, and the capacitor.

13. The semiconductor device according to claim 8, wherein a conductive film formed using the same material as a source electrode or a drain electrode of the second transistor is over an end portion of the third semiconductor film.

14. The semiconductor device according to claim 8, wherein the third semiconductor film includes a region having a higher conductivity than the second semiconductor film.

15. The semiconductor device according to claim 14, wherein the third semiconductor film includes one or more selected from boron, nitrogen, fluorine, aluminum, phosphorus, arsenic, indium, tin, antimony, and a rare gas element.

* * * * *